US009593812B2

(12) United States Patent
van de Ven et al.

(10) Patent No.: US 9,593,812 B2
(45) Date of Patent: Mar. 14, 2017

(54) HIGH CRI SOLID STATE LIGHTING DEVICES WITH ENHANCED VIVIDNESS

(71) Applicant: Cree, Inc., Durham, NC (US)

(72) Inventors: Antony Paul van de Ven, Hong Kong (CN); Benjamin A. Jacobson, Chicago, IL (US)

(73) Assignee: Cree, Inc., Durham, NC (US)

( * ) Notice: Subject to any disclaimer, the term of this patent is extended or adjusted under 35 U.S.C. 154(b) by 224 days.

(21) Appl. No.: 14/259,993

(22) Filed: Apr. 23, 2014

(65) Prior Publication Data

US 2015/0308633 A1    Oct. 29, 2015

(51) Int. Cl.
*F21K 99/00* (2016.01)
*H05B 33/08* (2006.01)
*F21Y 101/00* (2016.01)

(52) U.S. Cl.
CPC .............. *F21K 9/54* (2013.01); *F21K 9/64* (2016.08); *H05B 33/0803* (2013.01); *F21K 9/232* (2016.08); *F21K 9/233* (2016.08); *F21Y 2101/00* (2013.01); *F21Y 2113/17* (2016.08); *F21Y 2115/10* (2016.08); *H01L 2224/32225* (2013.01); *H01L 2224/48091* (2013.01); *H01L 2224/48227* (2013.01); *H01L 2924/181* (2013.01)

(58) Field of Classification Search
CPC .......... F21K 9/54; F21K 9/56; H05B 33/0803
See application file for complete search history.

(56) References Cited

U.S. PATENT DOCUMENTS

| 5,350,977 | A | 9/1994 | Hamamoto et al. |
| 6,234,648 | B1 | 5/2001 | Borner et al. |

(Continued)

FOREIGN PATENT DOCUMENTS

| DE | 10233050 A1 | 2/2004 |
| JP | 2003316714 A | 11/2003 |

(Continued)

OTHER PUBLICATIONS

International Search Report and Written Opinion for International Patent Application No. PCT/US2015/026770, mailed Sep. 2, 2015, 9 pages.

(Continued)

*Primary Examiner* — Mary Ellen Bowman
(74) *Attorney, Agent, or Firm* — Withrow & Terranova, P.L.L.C.; Vincent K. Gustafson

(57) ABSTRACT

Solid state lighting devices including multiple solid state light emitters are arranged to produce a mixture of light having a color rendering index (CRI Ra) value of at least 80, having a gamut area index (GAI) value in a range of from 80 to 100, and x, y coordinates within a predefined region of a 1931 CIE Chromaticity diagram, e.g. including x, y coordinates defining point on or within a first polygon bounded by the following x, y coordinates: (0.38, 0.34), (0.38, 0.36), (0.40, 0.38), (0.42, 0.38), (0.44, 0.36), (0.46, 0.36), and (0.46, 0.34). In certain embodiments, a lighting device includes a primary emitter having a dominant wavelength in a range of from 430 to 480 nm, a lumiphor having a dominant wavelength in a range of from 535 to 585 nm, and a supplemental emitter having a dominant wavelength in a range of from 590 to 650 nm.

33 Claims, 25 Drawing Sheets

(56) References Cited

U.S. PATENT DOCUMENTS

| | | | |
|---|---|---|---|
| 6,357,889 B1 | 3/2002 | Duggal et al. | |
| 6,441,558 B1 | 8/2002 | Muthu et al. | |
| 6,498,440 B2 | 12/2002 | Stam et al. | |
| 6,577,073 B2 | 6/2003 | Shimizu et al. | |
| 6,600,175 B1 | 7/2003 | Baretz et al. | |
| 7,005,679 B2 | 2/2006 | Tarsa et al. | |
| 7,026,756 B2 | 4/2006 | Shimizu et al. | |
| 7,095,056 B2 | 8/2006 | Vitta et al. | |
| 7,213,940 B1 | 5/2007 | Van De Ven et al. | |
| 7,233,831 B2 | 6/2007 | Blackwell | |
| 7,255,457 B2 | 8/2007 | Ducharme et al. | |
| 7,352,138 B2 | 4/2008 | Lys et al. | |
| 7,354,172 B2 | 4/2008 | Chemel et al. | |
| 7,358,679 B2 | 4/2008 | Lys et al. | |
| 7,520,634 B2 | 4/2009 | Ducharme et al. | |
| 7,564,180 B2 | 7/2009 | Brandes | |
| 7,665,865 B1 | 2/2010 | Hulse et al. | |
| 7,687,753 B2 | 3/2010 | Ashdown | |
| 7,744,242 B2 | 6/2010 | Kramer | |
| 7,768,192 B2 | 8/2010 | Van De Ven et al. | |
| 7,781,953 B2 | 8/2010 | Su | |
| 7,791,061 B2 | 9/2010 | Edmond et al. | |
| 7,828,460 B2 | 11/2010 | Van De Ven et al. | |
| 7,845,823 B2 | 12/2010 | Mueller et al. | |
| 7,918,581 B2 | 4/2011 | Van De Ven et al. | |
| 8,038,317 B2 | 10/2011 | Van De Ven et al. | |
| 8,201,966 B2 | 6/2012 | Hall et al. | |
| 8,258,722 B2 | 9/2012 | Swoboda et al. | |
| 8,436,556 B2 | 5/2013 | Eisele et al. | |
| 8,508,127 B2 | 8/2013 | Negley et al. | |
| 8,593,074 B2 | 11/2013 | Hatley et al. | |
| 8,698,388 B2 | 4/2014 | Cash | |
| 2002/0070681 A1 | 6/2002 | Shimizu et al. | |
| 2004/0218387 A1 | 11/2004 | Gerlach | |
| 2005/0275937 A1 | 12/2005 | Wu et al. | |
| 2006/0237636 A1 | 10/2006 | Lyons et al. | |
| 2007/0223219 A1 | 9/2007 | Medendorp, Jr. et al. | |
| 2007/0241657 A1 | 10/2007 | Radkov et al. | |
| 2008/0130285 A1 | 6/2008 | Negley et al. | |
| 2008/0173884 A1 | 7/2008 | Chitnis et al. | |
| 2008/0179611 A1 | 7/2008 | Chitnis et al. | |
| 2008/0258130 A1 | 10/2008 | Bergmann et al. | |
| 2009/0080185 A1 | 3/2009 | McMillan | |
| 2009/0184616 A1 | 7/2009 | Van De Ven et al. | |
| 2009/0207583 A1 | 8/2009 | Takano | |
| 2009/0227847 A1 | 9/2009 | Tepper et al. | |
| 2009/0296384 A1 | 12/2009 | Van De Ven et al. | |
| 2010/0110659 A1 | 5/2010 | Nakajima | |
| 2010/0127283 A1 | 5/2010 | van de Ven et al. | |
| 2010/0254129 A1 | 10/2010 | Le Toquin et al. | |
| 2010/0277907 A1 | 11/2010 | Phipps et al. | |
| 2011/0037388 A1 | 2/2011 | Lou et al. | |
| 2011/0299284 A1 | 12/2011 | Van De Ven et al. | |
| 2012/0112614 A1 | 5/2012 | Pickard et al. | |
| 2012/0242247 A1 | 9/2012 | Hartmann et al. | |
| 2012/0306355 A1 | 12/2012 | Seibel, II | |
| 2012/0306375 A1 | 12/2012 | van de Ven | |
| 2013/0002157 A1* | 1/2013 | van de Ven | H05B 33/0824 315/192 |
| 2013/0069561 A1 | 3/2013 | Melanson et al. | |
| 2013/0114241 A1 | 5/2013 | van de Ven et al. | |
| 2013/0170199 A1 | 7/2013 | Athalye et al. | |
| 2013/0271991 A1 | 10/2013 | Hussell et al. | |
| 2014/0146545 A1 | 5/2014 | Shum et al. | |
| 2014/0228914 A1 | 8/2014 | van de Ven et al. | |

FOREIGN PATENT DOCUMENTS

| | | |
|---|---|---|
| JP | 2009152213 A | 7/2009 |
| WO | 0034709 A1 | 6/2000 |
| WO | 2009041171 A1 | 4/2009 |
| WO | 2013070860 A1 | 5/2013 |

OTHER PUBLICATIONS

U.S. Appl. No. 14/259,943, filed Apr. 23, 2014.
U.S. Appl. No. 14/260,048, filed Apr. 23, 2014.
U.S. Appl. No. 14/298,229, filed Jun. 6, 2014.
U.S. Appl. No. 14/045,474, filed Oct. 3, 2013.
U.S. Appl. No. 14/606,509, filed Jan. 27, 2015.
Author Unknown, "69204—LED11DA19RVL/TP: GE LED A19 Features & Photos," GE Lighting Product Catalog for consumers, retrieved Jan. 20, 2015 from http://genet.gelighting.com/LightProducts/Dispatcher?REQUEST=CONSUMERSPECPAGE&PRODUCTCODE=69204, 1 page.
Author Unknown, "69204—LED11DA19RVL/TP: GE LED A19 Technical Specifications," GE Lighting Product Catalog for consumers, retrieved Jan. 20, 2015 from http://genet.gelighting.com/LightProducts/Dispatcher?REQUEST=CONSUMERSPECPAGE&PRODUCTCODE=69204&TABID=2&BreadCrumbValues=&ModelSelectionFilter=, 1 page.
Author Unknown, "Caliper Retail Lamps Study 3," Solid-State Lighting Program, Feb. 2014, Pacific Northwest National Laboratory, U.S. Department of Energy, 48 pages.
Author Unknown, "Class A Color for White Lighting," Rensselaer Polytechnic Institute, 2013, 1 page.
Author Unknown, "LEDnovation EnhanceLite A19 LED Light Bulb Review," LED Light Review, retrieved Jan. 22, 2015 from http://led-light-review.com/reviews/lednovation-enhancelite-a19/, 5 pages.
Author Unknown, "Technical Note: Chromaticity Difference Specification for Light Sources," CIE TN 001:2014, 2014, International Commission on Illumination, 9 pages.
Dilouie, C., "After CRI: New metrics challenge CRI as the industry's primary tool for evaluating color rendering," Architectural Lighting, Jan.-Feb. 2012, 3 pages.
Freyssinier, J.P. et al., "The Class a Color Designation for Light Sources," 2013 DOE Solid-State Lighting R&D Workshop, Jan. 29-31, 2013, Long Beach, CA, Rensselaer Polytechnic Institute, 26 pages.
Freyssinier, J.P. et al., "Class A Color Designation for Light Sources Used in General Illumination," Journal of Light & Visual Environment, vol. 37, Nos. 2 & 3, Nov. 2013, The Illuminating Engineering Institute of Japan, 5 pages.
Freyssinier, J.P. et al., "Class A Lighting," Strategies in Light, 2012, 14 pages.
Narendran, N. et al., "Color Rendering Properties of LED Light Sources," Solid State Lighting II: Proceedings of SPIE, vol. 4776, Nov. 26, 2002, SPIE, 8 pages.
Negley, G. et al., "Essentials of designing efficient luminaires with LEDs," LEDs Magazine, Issue 18, Jan./Feb. 2008, Pennwell Corporation, pp. 17-22.
Ohno, Y., "Latest Research and Standardization on Chromaticity & Color Quality of LED lighting," 11th China International Forum on Solid State Lighting, Nov. 2014, Guangzhou, National Institute of Standards and Technology, 32 pages.
Rea, Mark S., "Value Metrics for Better Lighting," vol. PM228, 2013, SPIE Press, pp. 36-43, 52-63.
Van De Ven, A. et al., "Warm White illumination with high CRI and high efficacy by combining 455nm excited yellowish phosphor LEDs and red AlInGaP LEDs," First International Conference on White LEDs and Solid State Lighting, Nov. 28, 2007, LED Lighting Fixtures, Inc., 8 pages.
Wood, M., "MacAdam ellipses: Due to the increasing use of solid state lighting devices, utilizing MacAdam ellipses to define the color point specification of lamps is becoming more prevalent," Protocol, Fall 2010, pp. 15-18.
Non-Final Office Action for U.S. Appl. No. 14/606,509, mailed Aug. 29, 2016, 15 pages.
International Preliminary Report on Patentability for International Patent Application No. PCT/US2015/026770, mailed Nov. 3, 2016, 7 pages.

* cited by examiner

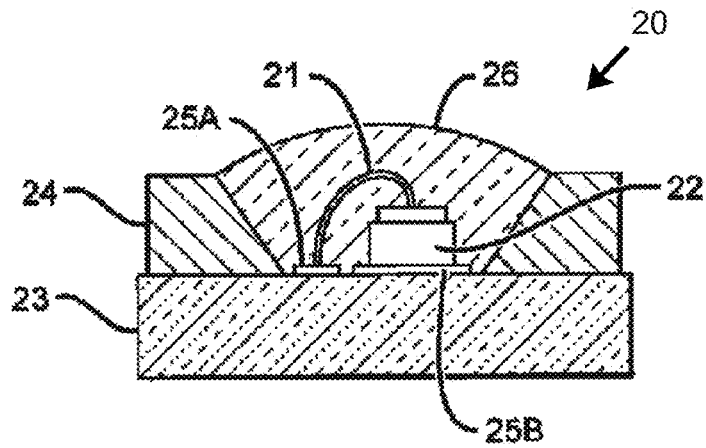
FIG._1 (RELATED ART)
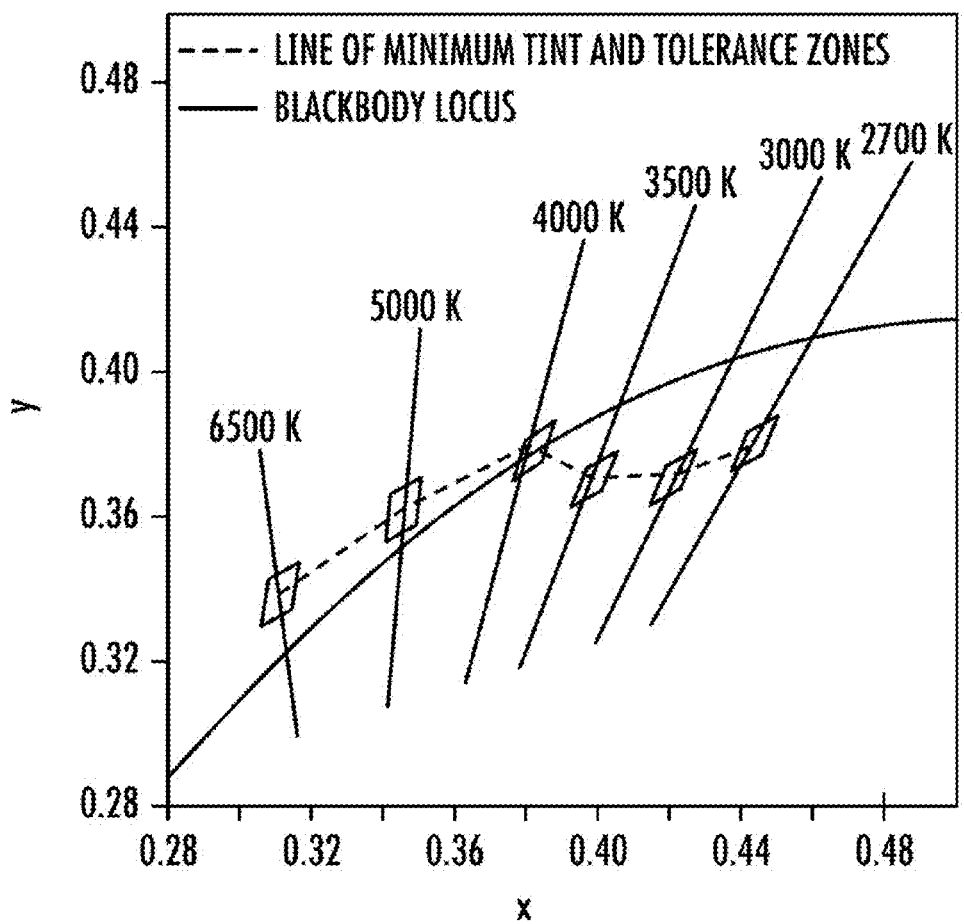
FIG._2 (RELATED ART)

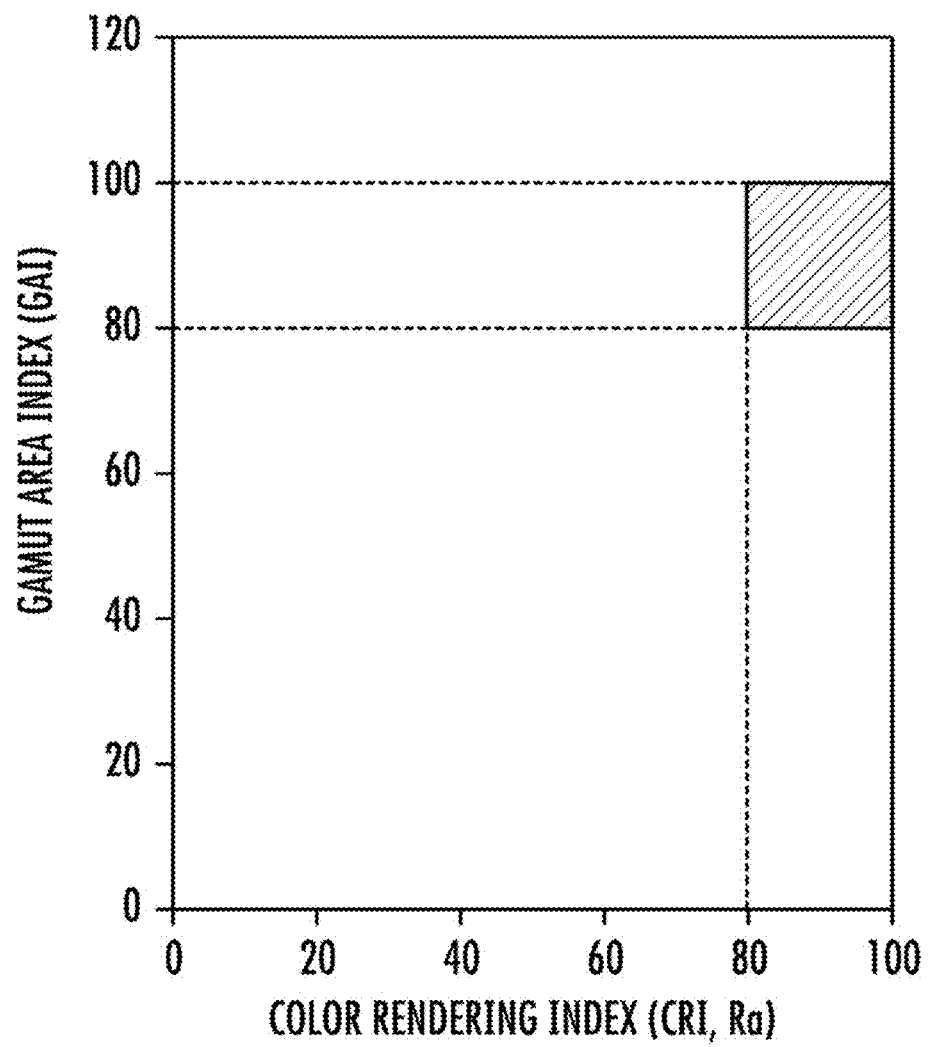
FIG._3
(RELATED ART)

| # | Light source | CCT | CRI | GAI | x | y | System lm/W | S/P |
|---|---|---|---|---|---|---|---|---|
| 1.1 | HPS, 400 W | 2050 | 15 | 14 | 0.5208 | 0.4134 | 96 | 0.66 |
| 1.2 | Pulse-start MH, 320 W | 4159 | 58 | 51 | 0.3799 | 0.3984 | 72 | 1.61 |
| 1.3 | Mercury vapor, 400 W clear | 5891 | 15 | 25 | 0.3191 | 0.4317 | 42 | 1.33 |
| 1.4 | LPS, 180 W | 1785 | −42 | 0 | 0.5681 | 0.4285 | 144 | 0.25 |
| 1.5 | Xenon, 1000 W | 5853 | 97 | 91 | 0.3245 | 0.3439 | 26 | 2.37 |
| 1.6 | White LED, 6500 K | 6528 | 72 | 84 | 0.3116 | 0.3340 | 80 | 2.06 |
| 2.1 | A lamp, 60 W (frosted) | 2764 | 100 | 49 | 0.4555 | 0.4109 | 14 | 1.36 |
| 2.2 | A lamp, 60 W (neodymium doped) | 2789 | 78 | 65 | 0.4460 | 0.3962 | 11 | 1.52 |
| 2.3 | Halogen, 3277 K | 3279 | 100 | 65 | 0.4184 | 0.3969 | 20 | 1.60 |
| 2.4 | CFL, 15 W | 2653 | 83 | 48 | 0.4652 | 0.4141 | 61 | 1.11 |
| 2.5 | Fluorescent, F34T12 cool white | 4022 | 62 | 58 | 0.3833 | 0.3905 | 63 | 1.48 |
| 2.6 | Fluorescent, FO32T8RE835 | 3308 | 86 | 69 | 0.4157 | 0.3939 | 86 | 1.44 |
| 2.7 | Fluorescent, F40T12 daylight | 4861 | 90 | 84 | 0.3502 | 0.3645 | 50 | 1.97 |
| 2.8 | Ceramic MH, 100 W | 4075 | 93 | 80 | 0.3773 | 0.3749 | 66 | 1.79 |
| 2.9 | White LED, 2700 K | 2706 | 84 | 49 | 0.4575 | 0.4072 | 65 | 1.21 |
| 2.10 | White LED, 6500 K | 6528 | 72 | 84 | 0.3116 | 0.3340 | 80 | 2.06 |
| 3.1 | Blue LED, 470-nm peak | N/A | N/A | 4 | 0.1247 | 0.0929 | 10 | 12.79 |
| 3.2 | Fluorescent, F20T12 aquarium lamp | 13408 | 83 | 103 | 0.2676 | 0.2719 | 51 | 2.76 |
| 3.3 | Fluorescent food-display lamp | 3195 | 61 | 128 | 0.3869 | 0.3153 | 36 | 1.97 |

FIG._4A (RELATED ART)

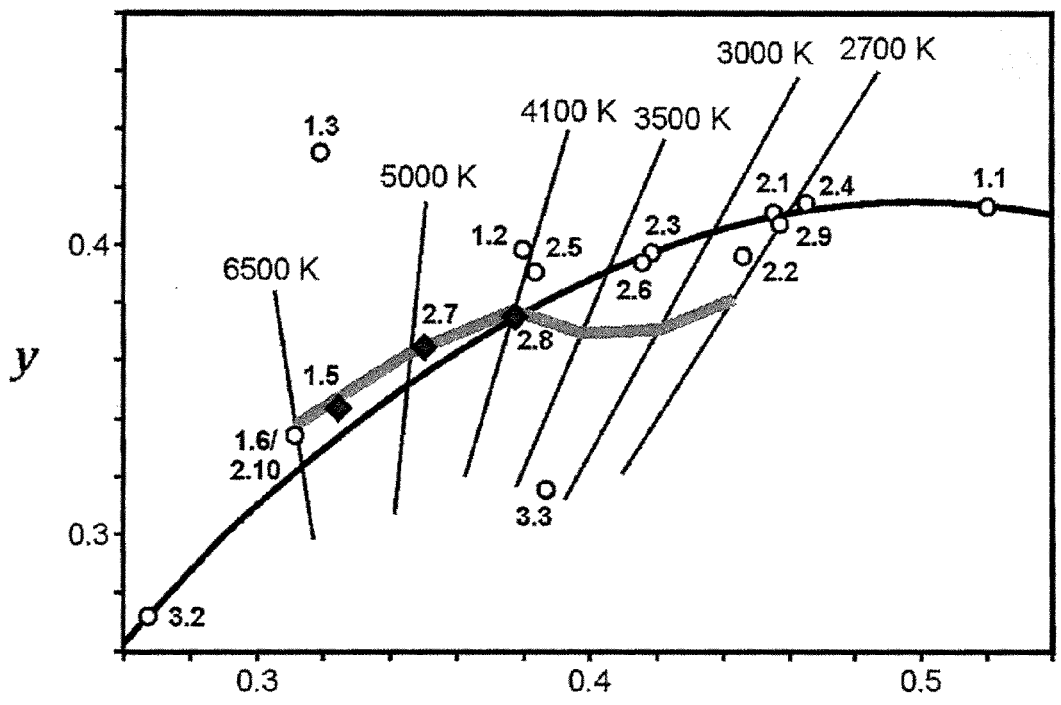

FIG._4B (RELATED ART)

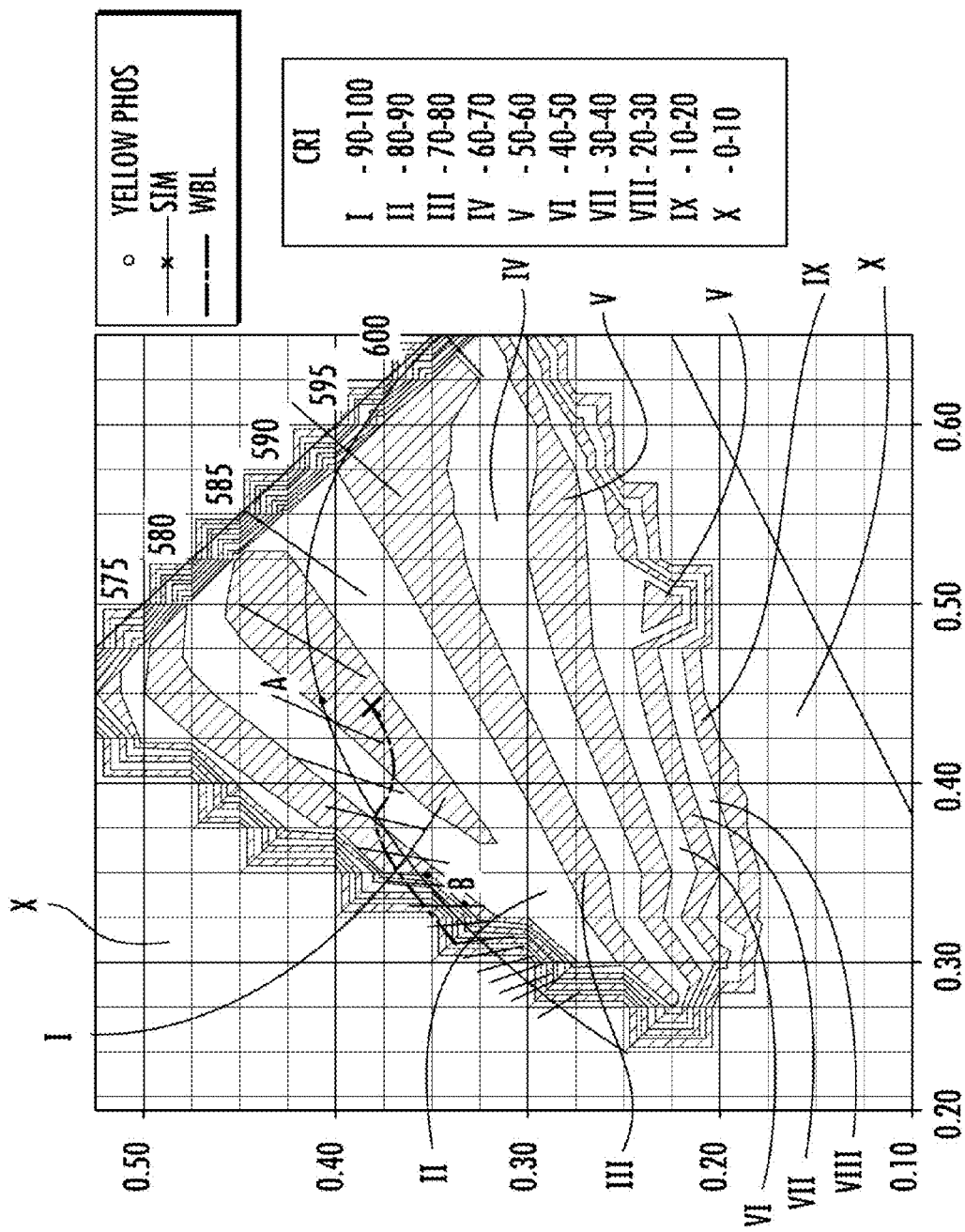
FIG._5B

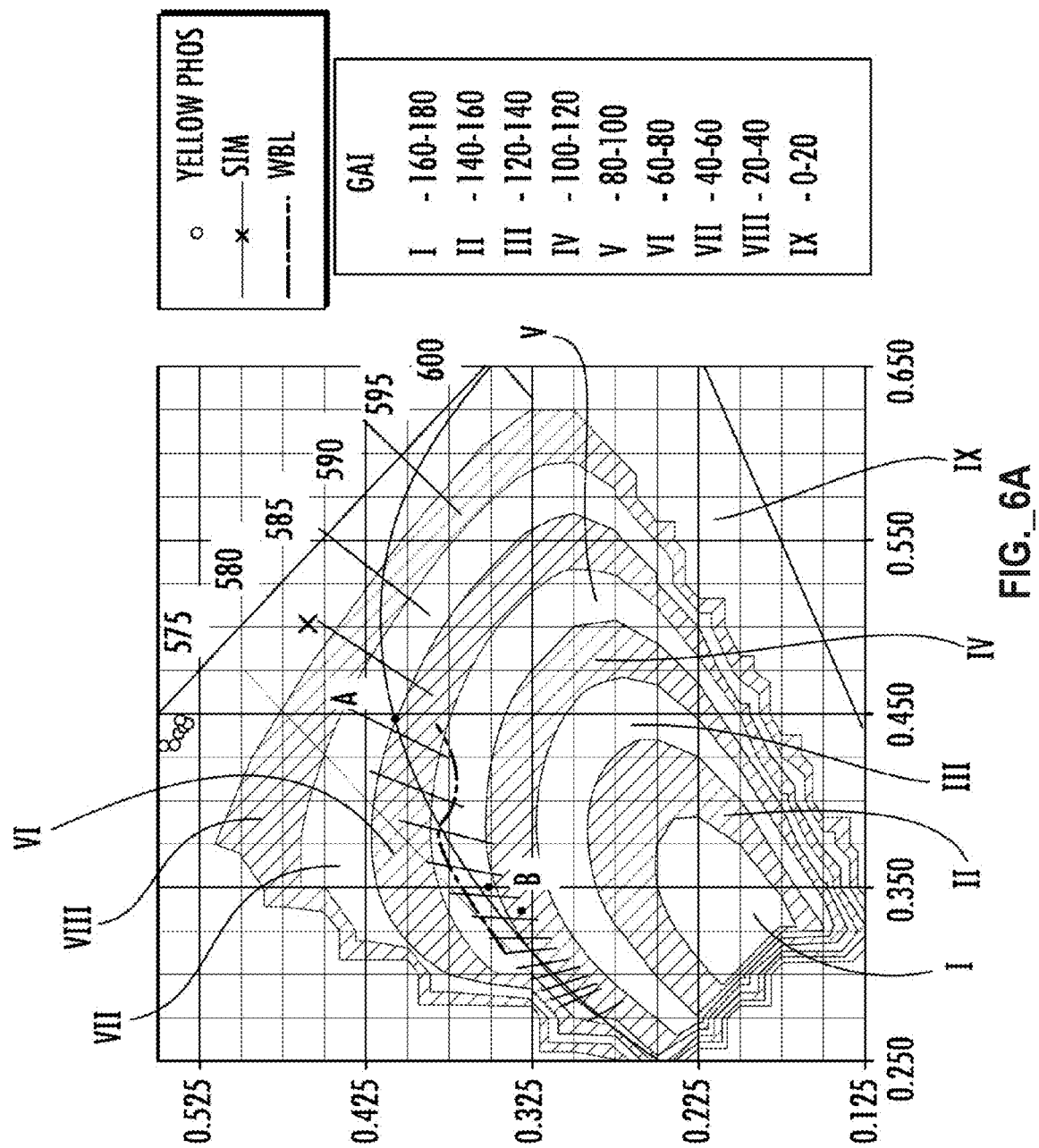
FIG._6A

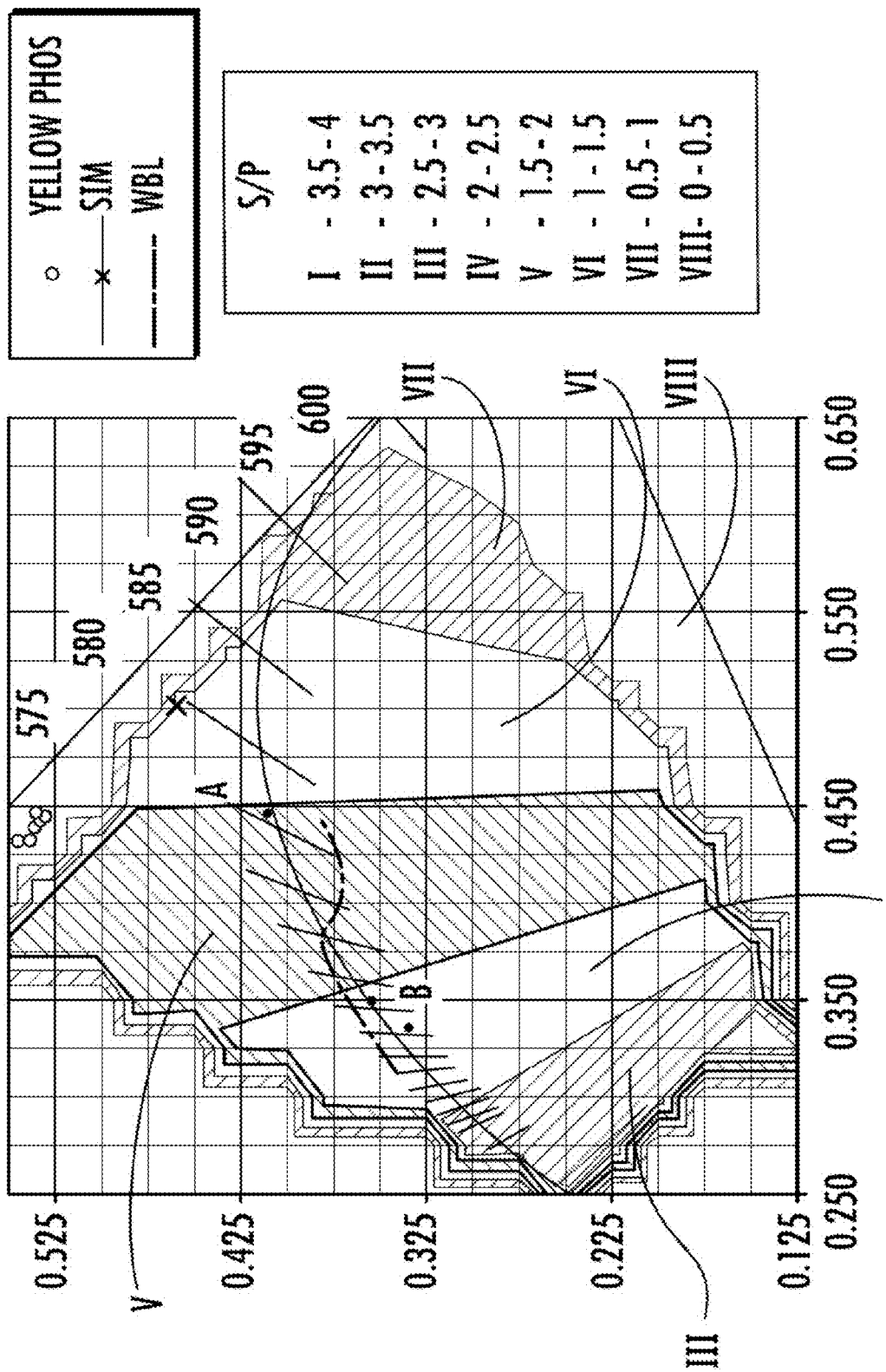
FIG._6C

FIG. 7A

| # | x | y | dm | cct | S/P | CRI | R9 | CQS | GAI | Source 1a | Source 2a | Source 3a | 1a L% | 2a L% | 3a L% | 1a x | 1a y | 2a x | 2a y | 3a x | 3a y | 1a dm | 2a dm | 3a dm | 1a pk | 2a pk | 3a pk |
|---|---|---|---|---|---|---|---|---|---|---|---|---|---|---|---|---|---|---|---|---|---|---|---|---|---|---|---|
| 1 | 0.38 | 0.36 | 585 | 3879 | 1.88 | 90.5 | 82 | 89.2 | 85.5 | ORed 619 | P1 NYAG7 | XTE 470 | 0.14 | 0.80 | 0.06 | 0.69 | 0.31 | 0.43 | 0.55 | 0.13 | 0.07 | 619 | 569 | 470 | 627 | 541 | 465 |
| 2 | 0.40 | 0.36 | 589 | 3347 | 1.55 | 92.5 | 94 | 86.2 | 90.6 | ORed 619 | P1 NYAG7 | XTE 459 | 0.16 | 0.81 | 0.03 | 0.69 | 0.31 | 0.43 | 0.55 | 0.15 | 0.03 | 619 | 569 | 459 | 627 | 541 | 454 |
| 3 | 0.40 | 0.36 | 589 | 3347 | 1.64 | 92.0 | 83 | 90.2 | 88.9 | ORed 619 | P1 NYAG7 | XTE 465 | 0.17 | 0.79 | 0.04 | 0.69 | 0.31 | 0.43 | 0.55 | 0.14 | 0.04 | 619 | 569 | 465 | 627 | 541 | 459 |
| 4 | 0.40 | 0.36 | 589 | 3347 | 1.52 | 91.5 | 95 | 84.6 | 91.2 | ORed 619 | P1 NYAG7 | XP 457 | 0.16 | 0.82 | 0.02 | 0.69 | 0.31 | 0.43 | 0.55 | 0.15 | 0.02 | 619 | 569 | 457 | 627 | 541 | 452 |
| 5 | 0.39 | 0.34 | 599 | 3691 | 1.80 | 89.3 | 71 | 89.0 | 99.8 | ORed 619 | P1 NYAG7 | XTE 465 | 0.16 | 0.79 | 0.05 | 0.69 | 0.31 | 0.43 | 0.55 | 0.14 | 0.05 | 619 | 569 | 465 | 627 | 541 | 459 |
| 6 | 0.38 | 0.34 | 589 | 3347 | 1.62 | 91.3 | 54 | 87.9 | 84.6 | Strd SPD1 | P1 NYAG7 | XTE 465 | 0.19 | 0.77 | 0.04 | 0.67 | 0.33 | 0.43 | 0.55 | 0.14 | 0.04 | 613 | 569 | 465 | 620 | 541 | 454 |
| 7 | 0.40 | 0.34 | 599 | 3691 | 1.67 | 91.1 | 56 | 82.6 | 97.2 | Strd SPD1 | P1 NYAG7 | XTE 459 | 0.17 | 0.80 | 0.03 | 0.67 | 0.33 | 0.43 | 0.55 | 0.15 | 0.03 | 613 | 569 | 459 | 620 | 541 | 454 |
| 8 | 0.40 | 0.34 | 599 | 3691 | 1.53 | 90.9 | 45 | 84.0 | 86.5 | Strd SPD1 | P1 NYAG7 | XTE 459 | 0.16 | 0.79 | 0.04 | 0.67 | 0.33 | 0.43 | 0.55 | 0.14 | 0.04 | 613 | 569 | 459 | 620 | 541 | 449 |
| 9 | 0.40 | 0.34 | 599 | 3691 | 1.48 | 90.1 | 94 | 82.9 | 91.9 | Strd SPD1 | P1 NYAG7 | XPH 455 | 0.16 | 0.82 | 0.03 | 0.67 | 0.33 | 0.43 | 0.55 | 0.15 | 0.03 | 613 | 569 | 454 | 627 | 541 | 452 |
| 10 | 0.38 | 0.36 | 589 | 3347 | 1.63 | 90.7 | 52 | 80.8 | 97.8 | Strd SPD1 | P1 NYAG7 | XP 457 | 0.17 | 0.81 | 0.03 | 0.67 | 0.33 | 0.43 | 0.55 | 0.15 | 0.03 | 613 | 569 | 457 | 620 | 541 | 459 |
| 11 | 0.40 | 0.34 | 599 | 3691 | 1.78 | 90.0 | 67 | 87.0 | 95.2 | Strd SPD1 | P1 NYAG7 | XTE 465 | 0.18 | 0.77 | 0.05 | 0.67 | 0.33 | 0.43 | 0.55 | 0.14 | 0.05 | 613 | 569 | 465 | 620 | 541 | 452 |
| 12 | 0.40 | 0.34 | 589 | 3347 | 1.50 | 90.0 | 42 | 82.4 | 87.1 | Strd SPD1 | P1 NYAG7 | XP 457 | 0.18 | 0.80 | 0.02 | 0.57 | 0.33 | 0.43 | 0.55 | 0.15 | 0.02 | 613 | 569 | 457 | 620 | 541 | 452 |
| 13 | 0.42 | 0.36 | 592 | 2912 | 1.40 | 89.9 | 43 | 83.3 | 85.8 | ORed 619 | P1 NYAG7 | XTE 459 | 0.23 | 0.75 | 0.02 | 0.67 | 0.31 | 0.43 | 0.55 | 0.15 | 0.03 | 619 | 569 | 459 | 627 | 541 | 454 |
| 14 | 0.42 | 0.36 | 592 | 2912 | 1.43 | 89.6 | 45 | 84.9 | 85.1 | Strd SPD1 | P1 NYAG7 | XP 457 | 0.23 | 0.74 | 0.02 | 0.67 | 0.33 | 0.43 | 0.55 | 0.15 | 0.03 | 613 | 569 | 457 | 620 | 541 | 452 |
| 15 | 0.42 | 0.36 | 592 | 2912 | 1.43 | 89.6 | 86 | 85.6 | 90.7 | Strd SPD1 | P1 NYAG7 | XP 457 | 0.21 | 0.76 | 0.02 | 0.67 | 0.33 | 0.43 | 0.55 | 0.15 | 0.03 | 613 | 569 | 457 | 620 | 541 | 449 |
| 16 | 0.42 | 0.36 | 592 | 2912 | 1.37 | 89.6 | 41 | 81.6 | 86.6 | Strd SPD1 | P1 NYAG7 | XPH 455 | 0.23 | 0.76 | 0.02 | 0.69 | 0.31 | 0.43 | 0.55 | 0.15 | 0.02 | 619 | 569 | 454 | 620 | 541 | 449 |
| 17 | 0.42 | 0.36 | 592 | 2912 | 1.40 | 89.4 | 91 | 83.8 | 91.4 | Strd SPD1 | P1 NYAG7 | XTE 465 | 0.20 | 0.78 | 0.02 | 0.67 | 0.33 | 0.43 | 0.55 | 0.14 | 0.02 | 613 | 569 | 465 | 620 | 541 | 454 |
| 18 | 0.42 | 0.36 | 589 | 3347 | 1.56 | 89.3 | 64 | 86.8 | 92.8 | Red 623 | P1 NYAG7 | XP 457 | 0.21 | 0.77 | 0.03 | 0.69 | 0.30 | 0.43 | 0.55 | 0.15 | 0.03 | 623 | 569 | 457 | 632 | 541 | 454 |
| 19 | 0.40 | 0.36 | 589 | 3347 | 1.49 | 89.3 | 51 | 80.4 | 99.2 | Strd SPD1 | P1 NYAG7 | XP 457 | 0.16 | 0.82 | 0.02 | 0.67 | 0.33 | 0.43 | 0.55 | 0.15 | 0.03 | 613 | 569 | 457 | 620 | 541 | 459 |
| 20 | 0.40 | 0.36 | 602 | 3138 | 1.45 | 89.1 | 85 | 87.2 | 90.0 | ORed 619 | P1 NYAG7 | XP 457 | 0.21 | 0.76 | 0.03 | 0.69 | 0.30 | 0.43 | 0.55 | 0.15 | 0.02 | 619 | 569 | 459 | 632 | 541 | 454 |
| 21 | 0.42 | 0.34 | 602 | 3138 | 1.53 | 89.0 | 54 | 82.2 | 98.3 | Strd SPD1 | P1 NYAG7 | XTE 459 | 0.22 | 0.77 | 0.03 | 0.67 | 0.33 | 0.43 | 0.55 | 0.15 | 0.03 | 613 | 569 | 459 | 620 | 541 | 452 |
| 22 | 0.42 | 0.36 | 592 | 3347 | 1.53 | 88.6 | 68 | 85.1 | 93.3 | Strd SPD1 | P1 NYAG7 | XP 457 | 0.22 | 0.76 | 0.02 | 0.67 | 0.33 | 0.43 | 0.55 | 0.15 | 0.03 | 613 | 569 | 457 | 620 | 541 | 454 |
| 23 | 0.42 | 0.34 | 602 | 3138 | 1.56 | 88.5 | 57 | 84.0 | 97.6 | Strd SPD1 | P1 NYAG7 | XTE 459 | 0.15 | 0.83 | 0.03 | 0.70 | 0.30 | 0.43 | 0.55 | 0.15 | 0.03 | 613 | 569 | 459 | 620 | 541 | 452 |
| 24 | 0.40 | 0.36 | 589 | 3347 | 1.65 | 88.6 | 50 | 90.7 | 91.1 | Strd SPD1 | P1 NYAG7 | XTE 465 | 0.22 | 0.75 | 0.04 | 0.70 | 0.30 | 0.43 | 0.55 | 0.14 | 0.05 | 613 | 569 | 465 | 620 | 541 | 459 |
| 25 | 0.42 | 0.34 | 599 | 3691 | 1.59 | 88.5 | 48 | 79.1 | 98.5 | Strd SPD1 | P1 NYAG7 | XPH 455 | 0.16 | 0.80 | 0.04 | 0.70 | 0.30 | 0.43 | 0.55 | 0.15 | 0.04 | 613 | 569 | 454 | 632 | 541 | 459 |
| 26 | 0.42 | 0.36 | 592 | 2912 | 1.32 | 88.4 | 37 | 78.8 | 87.7 | ORed 619 | P1 NYAG7 | XP 457 | 0.16 | 0.81 | 0.02 | 0.67 | 0.33 | 0.43 | 0.55 | 0.15 | 0.02 | 619 | 569 | 457 | 627 | 541 | 449 |
| 27 | 0.40 | 0.36 | 589 | 3347 | 1.47 | 88.3 | 39 | 80.4 | 97.8 | ORed 619 | P1 NYAG7 | XPH 455 | 0.22 | 0.77 | 0.01 | 0.69 | 0.31 | 0.43 | 0.55 | 0.15 | 0.01 | 619 | 569 | 454 | 620 | 541 | 444 |
| 28 | 0.40 | 0.36 | 592 | 3138 | 1.35 | 88.1 | 34 | 80.8 | 92.4 | ORed 619 | P1 NYAG7 | XPH 450 | 0.18 | 0.80 | 0.02 | 0.70 | 0.30 | 0.43 | 0.55 | 0.16 | 0.02 | 619 | 569 | 450 | 627 | 541 | 444 |
| 29 | 0.44 | 0.36 | 594 | 2565 | 1.23 | 88.1 | 53 | 84.6 | 83.1 | Strd SPD1 | P1 NYAG7 | XPH 450 | 0.20 | 0.79 | 0.01 | 0.67 | 0.33 | 0.43 | 0.55 | 0.16 | 0.01 | 613 | 569 | 450 | 620 | 541 | 444 |
| 30 | 0.42 | 0.36 | 592 | 2912 | 1.52 | 87.9 | 32 | 88.7 | 78.2 | ORed 619 | P1 NYAG7 | XTE 465 | 0.27 | 0.72 | 0.01 | 0.67 | 0.33 | 0.43 | 0.55 | 0.14 | 0.05 | 619 | 569 | 465 | 627 | 541 | 459 |
| 31 | 0.44 | 0.36 | 594 | 2565 | 1.22 | 87.8 | 32 | 77.1 | 84.9 | Strd SPD1 | P1 NYAG7 | XR 447 | 0.27 | 0.73 | 0.01 | 0.67 | 0.33 | 0.43 | 0.55 | 0.16 | 0.02 | 613 | 569 | 447 | 620 | 541 | 440 |

| # | x | y | dm | cct | S/P | CRI | R9 | CQS | GAI | Source 1a | Source 2a | Source 3a | 1a L% | 2a L% | 3a L% | 1a x | 1a y | 2a x | 2a y | 3a x | 3a y | 1a dm | 2a dm | 3a dm | 1a pk | 2a pk | 3a pk |
|---|---|---|---|---|---|---|---|---|---|---|---|---|---|---|---|---|---|---|---|---|---|---|---|---|---|---|---|
| 32 | 0.44 | 0.36 | 594 | 2565 | 1.28 | 87.8 | 37 | 81.0 | 83.5 | Strd SPD1 | P1 NYAG7 | XPH 455 | 0.28 | 0.71 | 0.02 | 0.67 | 0.33 | 0.43 | 0.55 | 0.15 | 0.02 | 613 | 569 | 454 | 620 | 541 | 449 |
| 33 | 0.42 | 0.36 | 592 | 2912 | 1.33 | 87.6 | 44 | 79.8 | 92.7 | ORed 619 | P1 NYAG7 | XR 447 | 0.20 | 0.79 | 0.01 | 0.69 | 0.31 | 0.43 | 0.55 | 0.16 | 0.02 | 619 | 569 | 447 | 627 | 541 | 440 |
| 34 | 0.40 | 0.36 | 589 | 3347 | 1.49 | 87.5 | 72 | 83.3 | 94.0 | Red 623 | P1 NYAG7 | XPH 455 | 0.15 | 0.83 | 0.02 | 0.70 | 0.30 | 0.43 | 0.55 | 0.15 | 0.02 | 623 | 569 | 454 | 632 | 541 | 449 |
| 35 | 0.40 | 0.36 | 589 | 3347 | 1.43 | 87.3 | 88 | 80.0 | 92.8 | ORed 619 | P1 NYAG7 | XPH 450 | 0.15 | 0.83 | 0.02 | 0.69 | 0.31 | 0.43 | 0.55 | 0.16 | 0.02 | 619 | 569 | 450 | 627 | 541 | 444 |
| 36 | 0.42 | 0.36 | 604 | 2710 | 1.33 | 87.3 | 42 | 77.1 | 99.1 | Strd SPD1 | P1 NYAG7 | XR 447 | 0.26 | 0.72 | 0.01 | 0.67 | 0.33 | 0.43 | 0.55 | 0.16 | 0.02 | 613 | 569 | 447 | 620 | 541 | 440 |
| 37 | 0.42 | 0.34 | 604 | 2710 | 1.31 | 87.3 | 41 | 76.1 | 93.4 | Strd SPD1 | P1 NYAG7 | XR 447 | 0.26 | 0.73 | 0.01 | 0.67 | 0.33 | 0.43 | 0.55 | 0.16 | 0.02 | 613 | 569 | 447 | 620 | 541 | 440 |
| 38 | 0.36 | 0.36 | 592 | 2912 | 1.31 | 87.3 | 35 | 77.8 | 88.0 | Strd SPD1 | P1 NYAG7 | XR 447 | 0.22 | 0.77 | 0.01 | 0.67 | 0.33 | 0.43 | 0.55 | 0.16 | 0.02 | 613 | 569 | 447 | 620 | 541 | 440 |
| 39 | 0.42 | 0.36 | 592 | 2912 | 1.54 | 87.1 | 76 | 91.3 | 88.0 | Strd SPD1 | P1 NYAG7 | XTE 465 | 0.22 | 0.75 | 0.03 | 0.69 | 0.31 | 0.43 | 0.55 | 0.14 | 0.05 | 619 | 569 | 465 | 620 | 541 | 452 |
| 40 | 0.44 | 0.36 | 594 | 2565 | 1.31 | 87.1 | 39 | 82.7 | 82.7 | Strd SPD1 | P1 NYAG7 | XP 457 | 0.28 | 0.70 | 0.02 | 0.67 | 0.33 | 0.43 | 0.55 | 0.15 | 0.03 | 613 | 569 | 457 | 620 | 541 | 444 |
| 41 | 0.44 | 0.36 | 594 | 2565 | 1.26 | 86.8 | 90 | 80.2 | 90.0 | ORed 619 | P1 NYAG7 | XPH 450 | 0.24 | 0.74 | 0.01 | 0.69 | 0.31 | 0.43 | 0.55 | 0.16 | 0.02 | 619 | 569 | 450 | 627 | 541 | 444 |
| 42 | 0.42 | 0.36 | 599 | 3347 | 1.77 | 86.8 | 68 | 91.4 | 86.2 | Strd SPD1 | P1 NYAG7 | XTE 470 | 0.19 | 0.76 | 0.05 | 0.69 | 0.31 | 0.43 | 0.55 | 0.13 | 0.07 | 619 | 569 | 470 | 627 | 541 | 465 |
| 43 | 0.44 | 0.36 | 594 | 2565 | 1.24 | 86.6 | 91 | 79.1 | 90.3 | ORed 619 | P1 NYAG7 | XR 447 | 0.24 | 0.75 | 0.01 | 0.69 | 0.31 | 0.43 | 0.55 | 0.16 | 0.02 | 619 | 569 | 447 | 627 | 541 | 440 |
| 44 | 0.44 | 0.36 | 594 | 2565 | 1.31 | 86.6 | 26 | 83.2 | 88.9 | Strd SPD1 | P1 NYAG7 | XPH 455 | 0.25 | 0.74 | 0.02 | 0.67 | 0.33 | 0.43 | 0.55 | 0.15 | 0.02 | 613 | 569 | 454 | 620 | 541 | 449 |
| 45 | 0.44 | 0.34 | 594 | 2565 | 1.39 | 86.5 | 46 | 80.2 | 97.7 | Strd SPD1 | P1 NYAG7 | XPH 455 | 0.27 | 0.71 | 0.02 | 0.67 | 0.33 | 0.43 | 0.55 | 0.15 | 0.03 | 613 | 569 | 454 | 620 | 541 | 449 |
| 46 | 0.44 | 0.36 | 594 | 2565 | 1.33 | 86.3 | 41 | 84.2 | 82.0 | Strd SPD1 | P1 NYAG7 | XTE 459 | 0.28 | 0.70 | 0.02 | 0.67 | 0.33 | 0.43 | 0.55 | 0.15 | 0.03 | 613 | 569 | 459 | 620 | 541 | 454 |
| 47 | 0.40 | 0.36 | 589 | 3347 | 1.31 | 86.1 | 85 | 85.0 | 88.2 | Strd SPD1 | P1 NYAG7 | XP 457 | 0.25 | 0.73 | 0.02 | 0.69 | 0.31 | 0.43 | 0.55 | 0.15 | 0.03 | 619 | 569 | 457 | 627 | 541 | 452 |
| 48 | 0.40 | 0.36 | 589 | 3347 | 1.75 | 86.1 | 65 | 89.4 | 91.8 | Strd SPD1 | P1 NYAG7 | XTE 470 | 0.21 | 0.74 | 0.05 | 0.69 | 0.31 | 0.43 | 0.55 | 0.13 | 0.07 | 619 | 569 | 470 | 627 | 541 | 465 |
| 49 | 0.46 | 0.36 | 596 | 2289 | 1.13 | 85.9 | 26 | 75.2 | 80.3 | ORed 619 | P1 NYAG7 | XR 447 | 0.32 | 0.67 | 0.01 | 0.69 | 0.31 | 0.43 | 0.55 | 0.16 | 0.02 | 619 | 569 | 447 | 627 | 541 | 440 |
| 50 | 0.42 | 0.34 | 604 | 2710 | 1.42 | 85.9 | 49 | 82.0 | 88.9 | Strd SPD1 | P1 NYAG7 | XP 457 | 0.27 | 0.71 | 0.02 | 0.67 | 0.33 | 0.43 | 0.55 | 0.15 | 0.03 | 613 | 569 | 457 | 620 | 541 | 452 |
| 51 | 0.44 | 0.36 | 594 | 2565 | 1.39 | 85.8 | 82 | 86.5 | 97.5 | ORed 619 | P1 NYAG7 | XTE 459 | 0.25 | 0.73 | 0.02 | 0.69 | 0.31 | 0.43 | 0.55 | 0.15 | 0.03 | 619 | 569 | 459 | 627 | 541 | 454 |
| 52 | 0.40 | 0.36 | 589 | 3347 | 1.36 | 85.8 | 86 | 79.2 | 93.0 | ORed 619 | P1 NYAG7 | XR 447 | 0.21 | 0.78 | 0.01 | 0.69 | 0.31 | 0.43 | 0.55 | 0.16 | 0.02 | 619 | 569 | 447 | 627 | 541 | 440 |
| 53 | 0.40 | 0.38 | 602 | 3138 | 1.41 | 85.6 | 66 | 88.3 | 95.1 | Strd SPD1 | P1 NYAG7 | XR 447 | 0.15 | 0.84 | 0.01 | 0.69 | 0.31 | 0.43 | 0.55 | 0.16 | 0.02 | 619 | 569 | 447 | 627 | 541 | 440 |
| 54 | 0.40 | 0.36 | 589 | 3347 | 1.67 | 85.4 | 34 | 78.0 | 88.8 | Strd SPD1 | P1 NYAG7 | XTE 465 | 0.23 | 0.72 | 0.04 | 0.69 | 0.31 | 0.43 | 0.55 | 0.14 | 0.05 | 619 | 569 | 465 | 627 | 541 | 459 |
| 55 | 0.40 | 0.36 | 589 | 3347 | 1.42 | 85.3 | 52 | 86.0 | 93.1 | Strd SPD1 | P1 NYAG7 | XP 457 | 0.17 | 0.81 | 0.01 | 0.70 | 0.30 | 0.43 | 0.55 | 0.15 | 0.03 | 619 | 569 | 457 | 632 | 541 | 452 |
| 56 | 0.42 | 0.36 | 592 | 2912 | 1.44 | 85.3 | 56 | 84.2 | 93.9 | Red 623 | P1 NYAG7 | XPH 455 | 0.19 | 0.79 | 0.02 | 0.70 | 0.30 | 0.43 | 0.55 | 0.16 | 0.03 | 623 | 569 | 454 | 632 | 541 | 449 |
| 57 | 0.38 | 0.36 | 585 | 3879 | 1.62 | 88.8 | 95 | 82.7 | 91.3 | Red 623 | P1 NYAG7 | XP 457 | 0.19 | 0.79 | 0.02 | 0.70 | 0.30 | 0.43 | 0.55 | 0.15 | 0.03 | 623 | 569 | 457 | 632 | 541 | 452 |
| 58 | 0.38 | 0.36 | 585 | 3879 | 1.61 | 88.8 | 78 | 82.2 | 89.7 | Red 623 | P1 NYAG7 | XPH 450 | 0.11 | 0.87 | 0.02 | 0.70 | 0.30 | 0.43 | 0.55 | 0.15 | 0.03 | 623 | 569 | 450 | 632 | 541 | 444 |
| 59 | 0.40 | 0.38 | 583 | 3530 | 1.73 | 88.6 | 74 | 90.6 | 82.1 | Strd SPD1 | P1 UAG2 | XPH 450 | 0.12 | 0.75 | 0.12 | 0.69 | 0.31 | 0.35 | 0.57 | 0.16 | 0.02 | 613 | 558 | 450 | 620 | 532 | 444 |
| 60 | 0.40 | 0.36 | 586 | 3101 | 1.41 | 88.6 | 73 | 86.6 | 80.5 | Strd SPD1 | P1 NYAG7 | XP 457 | 0.24 | 0.75 | 0.01 | 0.67 | 0.33 | 0.43 | 0.55 | 0.16 | 0.02 | 613 | 569 | 457 | 620 | 541 | 452 |
| 61 | 0.40 | 0.36 | 589 | 3347 | 1.73 | 88.4 | 82 | 89.2 | 93.9 | Strd SPD1 | P1 UAG2 | XP 457 | 0.16 | 0.72 | 0.11 | 0.70 | 0.30 | 0.35 | 0.57 | 0.16 | 0.03 | 619 | 558 | 457 | 632 | 532 | 452 |
| 62 | 0.40 | 0.38 | 583 | 3530 | 1.50 | 88.9 | 96 | 84.8 | 80.7 | Red 623 | P1 NYAG7 | XP 457 | 0.12 | 0.86 | 0.02 | 0.70 | 0.30 | 0.43 | 0.55 | 0.15 | 0.03 | 623 | 569 | 457 | 632 | 541 | 452 |

FIG._7B

| # | x | y | dm | cct | S/P | CRI | R9 | CQS | GAI | Source 1a | Source 2a | Source 3a | 1a L% | 2a L% | 3a L% | 1a x | 1a y | 2a x | 2a y | 3a x | 3a y | 1a dm | 2a dm | 3a dm | 1a pk | 2a pk | 3a pk |
|---|---|---|---|---|---|---|---|---|---|---|---|---|---|---|---|---|---|---|---|---|---|---|---|---|---|---|---|
| 63 | 0.40 | 0.38 | 583 | 3530 | 1.76 | 88.6 | 77 | 92.1 | 80.8 | Strd SPD1 | P1 LUAG2 | XPH 455 | 0.24 | 0.74 | 0.01 | 0.67 | 0.33 | 0.35 | 0.57 | 0.15 | 0.02 | 613 | 558 | 454 | 620 | 533 | 449 |
| 64 | 0.40 | 0.38 | 583 | 3530 | 1.71 | 86.4 | 73 | 89.6 | 82.5 | Strd SPD1 | P1 LUAG2 | XR 447 | 0.24 | 0.75 | 0.01 | 0.67 | 0.33 | 0.35 | 0.57 | 0.16 | 0.02 | 613 | 558 | 447 | 620 | 532 | 440 |
| 65 | 0.42 | 0.38 | 586 | 3101 | 1.39 | 87.8 | 77 | 85.0 | 81.1 | Red 623 | P1 NYAG7 | XPH 455 | 0.16 | 0.82 | 0.02 | 0.70 | 0.30 | 0.43 | 0.55 | 0.15 | 0.02 | 623 | 569 | 454 | 632 | 541 | 449 |
| 66 | 0.42 | 0.38 | 586 | 3101 | 1.34 | 87.8 | 85 | 81.8 | 80.1 | ORed 619 | P1 NYAG7 | XPH 450 | 0.17 | 0.82 | 0.02 | 0.69 | 0.30 | 0.43 | 0.55 | 0.15 | 0.02 | 619 | 569 | 450 | 627 | 541 | 444 |
| 67 | 0.38 | 0.36 | 585 | 3879 | 1.63 | 87.6 | 36 | 81.7 | 85.9 | Strd SPD1 | P1 NYAG7 | XTE 459 | 0.13 | 0.84 | 0.03 | 0.67 | 0.31 | 0.43 | 0.55 | 0.15 | 0.03 | 613 | 569 | 459 | 620 | 541 | 454 |
| 68 | 0.40 | 0.38 | 583 | 3530 | 1.47 | 86.9 | 98 | 83.3 | 81.3 | Strd SPD1 | P1 NYAG7 | XPH 455 | 0.12 | 0.86 | 0.02 | 0.70 | 0.30 | 0.43 | 0.55 | 0.15 | 0.02 | 613 | 569 | 454 | 620 | 541 | 449 |
| 69 | 0.34 | 0.34 | 599 | 3691 | 1.52 | 85.3 | 42 | 76.2 | 99.5 | Strd SPD1 | P1 NYAG7 | XPH 450 | 0.15 | 0.83 | 0.02 | 0.67 | 0.33 | 0.43 | 0.55 | 0.16 | 0.02 | 613 | 569 | 450 | 627 | 541 | 444 |
| 70 | 0.38 | 0.38 | 586 | 3101 | 1.32 | 86.6 | 83 | 80.9 | 80.3 | ORed 619 | P1 NYAG7 | XR 447 | 0.16 | 0.83 | 0.02 | 0.70 | 0.30 | 0.43 | 0.55 | 0.15 | 0.02 | 619 | 569 | 447 | 627 | 541 | 440 |
| 71 | 0.38 | 0.36 | 585 | 3879 | 1.58 | 86.4 | 98 | 81.1 | 91.9 | Red 623 | P1 NYAG7 | XPH 455 | 0.11 | 0.87 | 0.02 | 0.69 | 0.31 | 0.43 | 0.55 | 0.15 | 0.02 | 623 | 569 | 454 | 632 | 541 | 449 |
| 72 | 0.38 | 0.36 | 585 | 3879 | 1.57 | 86.4 | 73 | 80.6 | 90.2 | ORed 619 | P1 NYAG7 | XPH 455 | 0.11 | 0.87 | 0.02 | 0.69 | 0.31 | 0.43 | 0.55 | 0.16 | 0.02 | 619 | 569 | 454 | 627 | 541 | 449 |
| 73 | 0.38 | 0.38 | 585 | 3879 | 1.60 | 85.9 | 32 | 80.1 | 86.4 | ORed 619 | P1 NYAG7 | XP 457 | 0.13 | 0.85 | 0.02 | 0.70 | 0.30 | 0.43 | 0.55 | 0.15 | 0.03 | 619 | 569 | 457 | 627 | 541 | 452 |
| 74 | 0.38 | 0.36 | 586 | 3101 | 1.34 | 85.5 | 82 | 82.2 | 81.9 | Red 623 | P1 NYAG7 | XPH 450 | 0.16 | 0.83 | 0.02 | 0.70 | 0.30 | 0.43 | 0.55 | 0.15 | 0.02 | 623 | 569 | 450 | 632 | 541 | 444 |
| 75 | 0.36 | 0.36 | 592 | 2912 | 1.46 | 85.0 | 49 | 87.7 | 92.5 | Red 623 | P1 NYAG7 | XTE 459 | 0.20 | 0.78 | 0.02 | 0.67 | 0.30 | 0.43 | 0.55 | 0.16 | 0.03 | 623 | 569 | 459 | 632 | 541 | 454 |
| 76 | 0.36 | 0.36 | 589 | 3347 | 1.44 | 85.0 | 79 | 80.5 | 94.9 | Red 623 | P1 NYAG7 | XTE 459 | 0.15 | 0.84 | 0.02 | 0.67 | 0.30 | 0.43 | 0.55 | 0.16 | 0.02 | 623 | 569 | 459 | 632 | 541 | 454 |
| 77 | 0.34 | 0.34 | 604 | 2710 | 1.46 | 85.0 | 51 | 83.7 | 96.0 | Strd SPD1 | P1 NYAG7 | XTE 459 | 0.27 | 0.70 | 0.03 | 0.67 | 0.30 | 0.43 | 0.55 | 0.16 | 0.03 | 613 | 569 | 459 | 620 | 541 | 454 |
| 78 | 0.42 | 0.42 | 605 | 2381 | 1.22 | 84.9 | 33 | 74.4 | 96.0 | Strd SPD1 | P1 NYAG7 | XR 447 | 0.31 | 0.67 | 0.02 | 0.67 | 0.30 | 0.35 | 0.57 | 0.16 | 0.03 | 613 | 558 | 447 | 620 | 532 | 440 |
| 79 | 0.36 | 0.36 | 592 | 2912 | 1.36 | 84.8 | 61 | 81.2 | 94.9 | ORed 619 | P1 NYAG7 | XPH 450 | 0.19 | 0.80 | 0.02 | 0.69 | 0.30 | 0.43 | 0.55 | 0.16 | 0.02 | 619 | 569 | 450 | 627 | 541 | 444 |
| 80 | 0.36 | 0.36 | 589 | 3347 | 1.36 | 84.4 | 80 | 88.1 | 94.4 | ORed 619 | P1 NYAG7 | XR 447 | 0.18 | 0.80 | 0.02 | 0.70 | 0.30 | 0.43 | 0.55 | 0.16 | 0.02 | 619 | 569 | 447 | 627 | 541 | 440 |
| 81 | 0.40 | 0.36 | 589 | 3347 | 1.71 | 84.4 | 84 | 91.0 | 92.4 | Strd SPD1 | P1 LUAG2 | XPH 450 | 0.27 | 0.71 | 0.02 | 0.67 | 0.33 | 0.35 | 0.57 | 0.15 | 0.03 | 613 | 558 | 450 | 620 | 532 | 444 |
| 82 | 0.40 | 0.34 | 605 | 2381 | 1.77 | 84.8 | 34 | 75.4 | 95.6 | Strd SPD1 | P1 LUAG2 | XPH 450 | 0.31 | 0.67 | 0.02 | 0.67 | 0.33 | 0.35 | 0.57 | 0.16 | 0.03 | 613 | 558 | 450 | 620 | 532 | 444 |
| 83 | 0.44 | 0.36 | 596 | 2289 | 1.24 | 84.5 | 90 | 77.2 | 86.0 | ORed 619 | P1 NYAG7 | XR 447 | 0.29 | 0.69 | 0.02 | 0.70 | 0.30 | 0.43 | 0.55 | 0.15 | 0.03 | 619 | 569 | 447 | 627 | 541 | 440 |
| 84 | 0.46 | 0.36 | 596 | 2289 | 1.16 | 84.4 | 89 | 78.3 | 85.7 | ORed 619 | P1 NYAG7 | XR 447 | 0.29 | 0.69 | 0.04 | 0.70 | 0.30 | 0.43 | 0.55 | 0.14 | 0.05 | 619 | 569 | 447 | 627 | 541 | 440 |
| 85 | 0.46 | 0.36 | 589 | 3347 | 1.18 | 83.6 | 86 | 91.6 | 91.4 | ORed 619 | P1 NYAG7 | XPH 450 | 0.27 | 0.71 | 0.02 | 0.70 | 0.30 | 0.43 | 0.55 | 0.16 | 0.02 | 619 | 569 | 450 | 627 | 541 | 444 |
| 86 | 0.40 | 0.36 | 589 | 3347 | 1.80 | 84.0 | 32 | 77.2 | 89.1 | Strd SPD1 | P1 LUAG2 | XP 457 | 0.17 | 0.82 | 0.02 | 0.70 | 0.30 | 0.43 | 0.55 | 0.16 | 0.03 | 613 | 558 | 457 | 620 | 532 | 452 |
| 87 | 0.40 | 0.36 | 589 | 3347 | 1.39 | 83.9 | 82 | 79.6 | 95.0 | Strd SPD1 | P1 NYAG7 | XR 447 | 0.14 | 0.84 | 0.02 | 0.70 | 0.30 | 0.43 | 0.55 | 0.16 | 0.02 | 613 | 569 | 447 | 620 | 541 | 440 |
| 88 | 0.38 | 0.34 | 605 | 2381 | 1.42 | 83.9 | 74 | 88.3 | 89.1 | Strd SPD1 | P1 NYAG7 | XTE 465 | 0.16 | 0.84 | 0.01 | 0.67 | 0.33 | 0.43 | 0.55 | 0.16 | 0.04 | 613 | 569 | 465 | 620 | 541 | 459 |
| 89 | 0.44 | 0.36 | 596 | 2289 | 1.75 | 93.8 | 84 | 81.3 | 82.1 | Red 623 | P1 NYAG7 | XR 447 | 0.19 | 0.80 | 0.01 | 0.69 | 0.31 | 0.43 | 0.55 | 0.16 | 0.03 | 623 | 569 | 447 | 632 | 541 | 440 |
| 90 | 0.42 | 0.36 | 585 | 3101 | 1.33 | 84.5 | 64 | 80.2 | 95.1 | Red 623 | P1 NYAG7 | XR 447 | 0.29 | 0.69 | 0.02 | 0.69 | 0.31 | 0.43 | 0.55 | 0.15 | 0.02 | 623 | 569 | 447 | 632 | 541 | 440 |
| 91 | 0.46 | 0.36 | 596 | 2289 | 1.22 | 83.9 | 87 | 78.6 | 84.6 | ORed 619 | P1 NYAG7 | XR 447 | 0.13 | 0.85 | 0.02 | 0.67 | 0.33 | 0.43 | 0.55 | 0.16 | 0.02 | 619 | 569 | 447 | 627 | 541 | 440 |
| 92 | 0.38 | 0.36 | 585 | 3879 | 1.56 | 83.6 | 29 | 78.6 | 87.0 | Strd SPD1 | P1 NYAG7 | XR 447 | 0.12 | 0.86 | 0.01 | 0.69 | 0.31 | 0.43 | 0.55 | 0.15 | 0.02 | 613 | 569 | 447 | 620 | 541 | 440 |
| 93 | 0.40 | 0.38 | 583 | 3530 | 1.42 | 83.5 | 66 | 80.1 | 80.5 | ORed 619 | P1 NYAG7 | XPH 450 | 0.12 | 0.86 | 0.02 | 0.70 | 0.30 | 0.43 | 0.55 | 0.16 | 0.02 | 619 | 569 | 450 | 627 | 541 | 444 |

FIG._7C

| # | x | y | dm | cct | S/P | CRI | R9 | CQS | GAI | Source 1a | Source 2a | Source 3a | 1a L% | 2a L% | 3a L% | 1a x | 1a y | 2a x | 2a y | 3a x | 3a y | 1a dm | 2a dm | 3a dm | 1a pk | 2a pk | 3a pk |
|---|---|---|---|---|---|---|---|---|---|---|---|---|---|---|---|---|---|---|---|---|---|---|---|---|---|---|---|
| 94 | 0.40 | 0.38 | 583 | 3530 | 1.42 | 83.3 | 92 | 80.7 | 82.1 | Red 623 | P1 NYAG7 | XPH 450 | 0.12 | 0.87 | 0.01 | 0.70 | 0.30 | 0.43 | 0.55 | 0.16 | 0.02 | 623 | 569 | 450 | 632 | 541 | 444 |
| 95 | 0.36 | 0.36 | 589 | 3347 | 1.78 | 83.8 | 33 | 91.8 | 88.5 | Red 623 | P1 NYAG7 | XTE 470 | 0.18 | 0.77 | 0.05 | 0.70 | 0.30 | 0.43 | 0.55 | 0.13 | 0.07 | 623 | 569 | 470 | 632 | 541 | 465 |
| 96 | 0.38 | 0.36 | 585 | 3879 | 1.75 | 94.9 | 94 | 87.7 | 88.7 | ORed 619 | P1 NYAG7 | XTE 465 | 0.13 | 0.83 | 0.04 | 0.69 | 0.31 | 0.43 | 0.55 | 0.14 | 0.05 | 619 | 569 | 465 | 627 | 541 | 459 |
| 97 | 0.38 | 0.36 | 585 | 3879 | 1.52 | 82.1 | 90 | 78.5 | 92.5 | Red 623 | P1 NYAG7 | XPH 450 | 0.10 | 0.88 | 0.02 | 0.70 | 0.30 | 0.43 | 0.55 | 0.16 | 0.02 | 623 | 569 | 450 | 632 | 541 | 444 |
| 98 | 0.38 | 0.36 | 585 | 3879 | 1.52 | 82.1 | 65 | 77.9 | 80.9 | Red 623 | P1 NYAG7 | XPH 450 | 0.11 | 0.88 | 0.02 | 0.69 | 0.31 | 0.43 | 0.55 | 0.16 | 0.02 | 619 | 569 | 450 | 632 | 541 | 444 |
| 99 | 0.40 | 0.38 | 583 | 3530 | 1.40 | 82.1 | 63 | 79.4 | 80.7 | ORed 619 | P1 NYAG7 | XPH 450 | 0.12 | 0.87 | 0.01 | 0.70 | 0.30 | 0.43 | 0.55 | 0.16 | 0.02 | 619 | 569 | 450 | 627 | 541 | 440 |
| 100 | 0.40 | 0.38 | 583 | 3530 | 1.40 | 81.9 | 89 | 80.0 | 82.2 | Red 623 | P1 NYAG7 | XR 447 | 0.12 | 0.87 | 0.01 | 0.70 | 0.30 | 0.43 | 0.55 | 0.16 | 0.02 | 623 | 569 | 447 | 632 | 541 | 440 |
| 101 | 0.38 | 0.34 | 599 | 3691 | 1.50 | 93.6 | 39 | 75.4 | 99.8 | ORed 619 | P1 NYAG7 | XR 447 | 0.15 | 0.83 | 0.02 | 0.67 | 0.33 | 0.43 | 0.55 | 0.16 | 0.02 | 619 | 569 | 447 | 620 | 541 | 440 |
| 102 | 0.44 | 0.36 | 594 | 2565 | 1.44 | 83.5 | 75 | 90.4 | 85.4 | ORed 619 | P1 NYAG7 | XTE 465 | 0.26 | 0.71 | 0.03 | 0.69 | 0.31 | 0.43 | 0.55 | 0.14 | 0.05 | 619 | 569 | 465 | 627 | 541 | 452 |
| 103 | 0.46 | 0.36 | 596 | 2289 | 1.24 | 89.5 | 85 | 82.8 | 83.9 | ORed 619 | P1 NYAG7 | XP 457 | 0.30 | 0.69 | 0.02 | 0.69 | 0.31 | 0.43 | 0.55 | 0.15 | 0.03 | 619 | 569 | 457 | 627 | 541 | 444 |
| 104 | 0.36 | 0.36 | 585 | 3879 | 1.94 | 80.1 | 34 | 91.3 | 97.6 | ORed 619 | P1 LUAG2 | XPH 450 | 0.21 | 0.77 | 0.02 | 0.69 | 0.31 | 0.35 | 0.57 | 0.16 | 0.02 | 619 | 558 | 450 | 627 | 532 | 440 |
| 105 | 0.38 | 0.36 | 585 | 3879 | 1.87 | 80.5 | 42 | 89.6 | 99.9 | ORed 619 | P1 LUAG2 | XPH 450 | 0.20 | 0.78 | 0.02 | 0.69 | 0.31 | 0.35 | 0.57 | 0.16 | 0.02 | 619 | 558 | 450 | 627 | 532 | 440 |
| 106 | 0.44 | 0.34 | 605 | 2381 | 1.29 | 83.3 | 38 | 94.3 | 94.3 | Strd SPD1 | P1 LUAG2 | XPH 450 | 0.32 | 0.66 | 0.02 | 0.67 | 0.33 | 0.35 | 0.57 | 0.15 | 0.02 | 623 | 558 | 450 | 620 | 532 | 440 |
| 107 | 0.36 | 0.36 | 585 | 3879 | 1.89 | 88.9 | 53 | 89.7 | 87.4 | Strd SPD1 | P1 LUAG2 | XTE 470 | 0.14 | 0.81 | 0.06 | 0.70 | 0.30 | 0.35 | 0.57 | 0.13 | 0.07 | 623 | 558 | 470 | 620 | 532 | 465 |
| 108 | 0.38 | 0.36 | 585 | 3879 | 1.83 | 88.4 | 81 | 91.1 | 94.8 | Red 623 | P1 LUAG2 | XPH 450 | 0.22 | 0.76 | 0.01 | 0.67 | 0.33 | 0.35 | 0.57 | 0.16 | 0.02 | 623 | 558 | 450 | 627 | 532 | 440 |
| 109 | 0.38 | 0.36 | 585 | 3879 | 1.91 | 88.3 | 86 | 93.5 | 92.4 | Strd SPD1 | P1 LUAG2 | XP 457 | 0.23 | 0.75 | 0.02 | 0.69 | 0.31 | 0.35 | 0.57 | 0.15 | 0.03 | 619 | 558 | 457 | 620 | 532 | 444 |
| 110 | 0.38 | 0.36 | 585 | 3879 | 1.91 | 80.5 | 37 | 90.9 | 98.5 | Strd SPD1 | P1 LUAG2 | XPH 455 | 0.21 | 0.77 | 0.02 | 0.67 | 0.33 | 0.35 | 0.57 | 0.15 | 0.03 | 619 | 558 | 455 | 620 | 532 | 449 |
| 111 | 0.36 | 0.36 | 592 | 2912 | 1.55 | 83.0 | 38 | 91.7 | 90.6 | ORed 619 | P1 LUAG2 | XTE 465 | 0.21 | 0.76 | 0.03 | 0.70 | 0.30 | 0.35 | 0.57 | 0.14 | 0.05 | 619 | 558 | 465 | 620 | 532 | 459 |
| 112 | 0.42 | 0.38 | 585 | 3879 | 2.02 | 82.9 | 90 | 90.2 | 89.1 | Red 623 | P1 LUAG2 | XTE 465 | 0.24 | 0.72 | 0.04 | 0.67 | 0.33 | 0.35 | 0.57 | 0.14 | 0.05 | 623 | 558 | 465 | 632 | 532 | 459 |
| 113 | 0.38 | 0.36 | 585 | 3879 | 1.97 | 88.6 | 62 | 87.2 | 81.9 | Strd SPD1 | P1 LUAG2 | XTE 470 | 0.16 | 0.78 | 0.06 | 0.67 | 0.33 | 0.35 | 0.57 | 0.13 | 0.07 | 619 | 558 | 470 | 620 | 532 | 465 |
| 114 | 0.38 | 0.36 | 585 | 3879 | 1.81 | 88.1 | 79 | 90.1 | 95.3 | Strd SPD1 | P1 LUAG2 | XR 447 | 0.22 | 0.77 | 0.01 | 0.67 | 0.33 | 0.35 | 0.57 | 0.16 | 0.02 | 619 | 558 | 447 | 620 | 532 | 440 |
| 115 | 0.40 | 0.38 | 583 | 3530 | 1.76 | 80.8 | 48 | 88.6 | 86.6 | ORed 619 | P1 LUAG2 | XPH 450 | 0.22 | 0.77 | 0.01 | 0.67 | 0.33 | 0.35 | 0.57 | 0.16 | 0.02 | 619 | 558 | 450 | 627 | 532 | 440 |
| 116 | 0.44 | 0.36 | 583 | 3530 | 1.74 | 80.8 | 49 | 87.7 | 87.0 | ORed 619 | P1 LUAG2 | XR 447 | 0.22 | 0.77 | 0.01 | 0.67 | 0.33 | 0.35 | 0.57 | 0.16 | 0.02 | 619 | 558 | 447 | 627 | 532 | 440 |
| 117 | 0.36 | 0.36 | 583 | 3530 | 1.50 | 80.5 | 86 | 77.8 | 92.6 | Red 623 | P1 LUAG2 | XTE 459 | 0.10 | 0.89 | 0.01 | 0.70 | 0.30 | 0.35 | 0.57 | 0.16 | 0.03 | 623 | 558 | 459 | 632 | 532 | 454 |
| 118 | 0.38 | 0.36 | 585 | 3879 | 1.94 | 87.4 | 88 | 93.3 | 91.6 | ORed 619 | P1 LUAG2 | XPH 450 | 0.23 | 0.74 | 0.03 | 0.67 | 0.33 | 0.35 | 0.57 | 0.16 | 0.02 | 619 | 558 | 450 | 627 | 532 | 449 |
| 119 | 0.40 | 0.39 | 585 | 3530 | 1.80 | 80.5 | 44 | 89.7 | 85.4 | Strd SPD1 | P1 LUAG2 | XPH 455 | 0.22 | 0.77 | 0.01 | 0.67 | 0.33 | 0.35 | 0.57 | 0.15 | 0.03 | 619 | 558 | 455 | 620 | 532 | 449 |
| 120 | 0.40 | 0.36 | 585 | 3879 | 1.49 | 80.4 | 62 | 77.2 | 91.1 | ORed 619 | P1 LUAG2 | XR 447 | 0.11 | 0.88 | 0.01 | 0.70 | 0.30 | 0.35 | 0.57 | 0.16 | 0.02 | 619 | 558 | 447 | 627 | 532 | 440 |
| 121 | 0.40 | 0.38 | 583 | 3530 | 1.82 | 80.4 | 41 | 89.9 | 84.6 | ORed 619 | P1 LUAG2 | XP 457 | 0.22 | 0.76 | 0.02 | 0.67 | 0.33 | 0.35 | 0.57 | 0.15 | 0.03 | 619 | 558 | 457 | 627 | 532 | 444 |
| 122 | 0.38 | 0.36 | 585 | 3879 | 1.88 | 88.9 | 84 | 93.0 | 93.4 | Strd SPD1 | P1 LUAG2 | XPH 450 | 0.23 | 0.75 | 0.02 | 0.67 | 0.33 | 0.35 | 0.57 | 0.16 | 0.02 | 619 | 558 | 450 | 620 | 532 | 449 |
| 123 | 0.40 | 0.36 | 585 | 3879 | 1.51 | 80.0 | 23 | 76.1 | 87.9 | ORed 619 | P1 NYAG7 | XPH 450 | 0.12 | 0.86 | 0.02 | 0.67 | 0.33 | 0.43 | 0.55 | 0.15 | 0.03 | 619 | 569 | 450 | 627 | 541 | 444 |
| 124 | 0.38 | 0.36 | 585 | 3879 | 1.73 | 91.4 | 47 | 85.4 | 84.3 | Strd SPD1 | P1 NYAG7 | XTE 465 | 0.14 | 0.81 | 0.04 | 0.67 | 0.33 | 0.43 | 0.55 | 0.14 | 0.05 | 613 | 569 | 465 | 620 | 541 | 459 |

FIG._7D

| # | x | y | dm | cct | S/P | CRI | R9 | CQS | GAI | Source 1a | Source 2a | Source 3a | 1a L% | 2a L% | 3a L% | 1a x | 1a y | 2a x | 2a y | 3a x | 3a y | 1a dm | 2a dm | 3a dm | 1a pk | 2a pk | 3a pk |
|---|---|---|---|---|---|---|---|---|---|---|---|---|---|---|---|---|---|---|---|---|---|---|---|---|---|---|---|
| 125 | 0.46 | 0.36 | 596 | 2289 | 1.26 | 82.8 | 84 | 84.2 | 83.2 | ORed 619 | P1 NYAG7 | XTE 459 | 0.30 | 0.68 | 0.02 | 0.69 | 0.31 | 0.43 | 0.55 | 0.15 | 0.03 | 619 | 569 | 459 | 627 | 541 | 454 |
| 126 | 0.40 | 0.36 | 589 | 3347 | 1.82 | 82.4 | 87 | 91.6 | 90.6 | Strd SPD1 | P1 LUAG2 | XTE 459 | 0.28 | 0.70 | 0.02 | 0.67 | 0.33 | 0.35 | 0.57 | 0.15 | 0.03 | 613 | 558 | 459 | 620 | 532 | 454 |
| 127 | 0.42 | 0.36 | 592 | 2912 | 1.65 | 82.6 | 64 | 92.7 | 85.2 | ORed 619 | P1 NYAG7 | XTE 470 | 0.23 | 0.72 | 0.05 | 0.69 | 0.31 | 0.43 | 0.55 | 0.13 | 0.07 | 619 | 569 | 470 | 627 | 541 | 465 |
| 128 | 0.38 | 0.34 | 593 | 3691 | 1.96 | 82.3 | 51 | 90.1 | 97.1 | ORed 619 | P1 NYAG7 | XTE 470 | 0.18 | 0.75 | 0.07 | 0.69 | 0.31 | 0.43 | 0.55 | 0.13 | 0.07 | 619 | 569 | 470 | 627 | 541 | 465 |
| 129 | 0.38 | 0.34 | 593 | 3691 | 1.94 | 82.6 | 81 | 88.5 | 92.2 | Strd SPD1 | P1 NYAG7 | XTE 470 | 0.20 | 0.73 | 0.07 | 0.67 | 0.33 | 0.43 | 0.55 | 0.13 | 0.07 | 613 | 569 | 470 | 620 | 541 | 465 |
| 130 | 0.42 | 0.36 | 592 | 2912 | 1.63 | 82.4 | 62 | 90.3 | 80.1 | Strd SPD1 | P1 NYAG7 | XTE 470 | 0.25 | 0.70 | 0.05 | 0.67 | 0.33 | 0.43 | 0.55 | 0.13 | 0.07 | 613 | 569 | 470 | 620 | 541 | 465 |
| 131 | 0.46 | 0.38 | 605 | 2125 | 1.12 | 82.3 | 23 | 70.9 | 90.8 | Strd SPD1 | P1 NYAG7 | XR 447 | 0.37 | 0.62 | 0.01 | 0.67 | 0.33 | 0.43 | 0.55 | 0.16 | 0.03 | 613 | 569 | 447 | 620 | 541 | 440 |
| 132 | 0.40 | 0.38 | 583 | 3530 | 1.52 | 90.3 | 93 | 86.2 | 80.3 | Strd SPD1 | P1 NYAG7 | XTE 459 | 0.13 | 0.85 | 0.03 | 0.70 | 0.30 | 0.43 | 0.55 | 0.15 | 0.03 | 623 | 569 | 459 | 632 | 541 | 454 |
| 133 | 0.44 | 0.36 | 594 | 2565 | 1.27 | 82.1 | 52 | 80.7 | 92.7 | Red 623 | P1 NYAG7 | XPH 450 | 0.23 | 0.76 | 0.01 | 0.70 | 0.30 | 0.43 | 0.55 | 0.16 | 0.02 | 623 | 569 | 450 | 632 | 541 | 444 |
| 134 | 0.44 | 0.36 | 594 | 2565 | 1.26 | 82.0 | 54 | 79.5 | 93.0 | Red 623 | P1 NYAG7 | XR 447 | 0.23 | 0.76 | 0.02 | 0.70 | 0.30 | 0.43 | 0.55 | 0.16 | 0.02 | 623 | 569 | 447 | 632 | 541 | 440 |
| 135 | 0.44 | 0.34 | 605 | 2381 | 1.32 | 82.0 | 40 | 79.9 | 93.4 | Strd SPD1 | P1 NYAG7 | XP 457 | 0.32 | 0.66 | 0.02 | 0.67 | 0.33 | 0.43 | 0.55 | 0.15 | 0.03 | 613 | 569 | 457 | 620 | 541 | 452 |
| 136 | 0.38 | 0.36 | 585 | 3879 | 1.65 | 90.9 | 90 | 84.4 | 90.5 | Strd SPD1 | P1 LUAG2 | XTE 459 | 0.11 | 0.86 | 0.03 | 0.70 | 0.30 | 0.35 | 0.57 | 0.15 | 0.03 | 623 | 558 | 459 | 632 | 532 | 454 |
| 137 | 0.38 | 0.36 | 585 | 3879 | 1.64 | 91.0 | 83 | 83.8 | 89.2 | Strd SPD1 | P1 NYAG7 | XTE 459 | 0.12 | 0.85 | 0.03 | 0.70 | 0.30 | 0.43 | 0.55 | 0.15 | 0.03 | 623 | 569 | 459 | 632 | 541 | 454 |
| 138 | 0.44 | 0.36 | 594 | 2565 | 1.32 | 81.6 | 47 | 83.7 | 91.7 | Red 623 | P1 NYAG7 | XPH 455 | 0.23 | 0.75 | 0.02 | 0.70 | 0.30 | 0.43 | 0.55 | 0.15 | 0.03 | 623 | 569 | 455 | 632 | 541 | 449 |
| 139 | 0.46 | 0.36 | 605 | 2125 | 1.14 | 81.6 | 24 | 71.9 | 90.5 | Strd SPD1 | P1 NYAG7 | XPH 450 | 0.37 | 0.62 | 0.01 | 0.67 | 0.33 | 0.43 | 0.55 | 0.16 | 0.02 | 613 | 569 | 450 | 620 | 541 | 444 |
| 140 | 0.42 | 0.36 | 592 | 2912 | 1.57 | 82.0 | 76 | 86.8 | 91.2 | Strd SPD1 | P1 NYAG7 | XPH 450 | 0.31 | 0.68 | 0.01 | 0.67 | 0.33 | 0.43 | 0.55 | 0.16 | 0.02 | 613 | 569 | 450 | 620 | 541 | 444 |
| 141 | 0.42 | 0.36 | 592 | 2912 | 1.60 | 81.1 | 75 | 85.7 | 91.6 | Strd SPD1 | P1 NYAG7 | XR 447 | 0.31 | 0.68 | 0.01 | 0.67 | 0.33 | 0.43 | 0.55 | 0.16 | 0.02 | 613 | 569 | 447 | 620 | 541 | 440 |
| 142 | 0.44 | 0.36 | 594 | 2565 | 1.35 | 81.3 | 45 | 85.5 | 90.9 | Red 623 | P1 NYAG7 | XTE 459 | 0.24 | 0.74 | 0.02 | 0.70 | 0.30 | 0.43 | 0.55 | 0.15 | 0.03 | 623 | 569 | 459 | 632 | 541 | 454 |
| 143 | 0.46 | 0.36 | 605 | 2125 | 1.16 | 81.3 | 87 | 73.1 | 98.2 | ORed 619 | P1 NYAG7 | XTE 459 | 0.33 | 0.66 | 0.01 | 0.69 | 0.31 | 0.43 | 0.55 | 0.16 | 0.02 | 619 | 569 | 459 | 627 | 541 | 454 |
| 144 | 0.46 | 0.34 | 605 | 2125 | 1.18 | 80.9 | 86 | 74.3 | 97.9 | ORed 619 | P1 NYAG7 | XTE 459 | 0.33 | 0.66 | 0.01 | 0.69 | 0.31 | 0.43 | 0.55 | 0.16 | 0.02 | 619 | 569 | 459 | 627 | 541 | 454 |
| 145 | 0.44 | 0.34 | 594 | 2565 | 1.37 | 80.8 | 42 | 87.0 | 90.3 | Strd SPD1 | P1 NYAG7 | XPH 450 | 0.24 | 0.74 | 0.02 | 0.69 | 0.31 | 0.43 | 0.55 | 0.16 | 0.02 | 619 | 569 | 450 | 627 | 541 | 444 |
| 146 | 0.44 | 0.34 | 605 | 2381 | 1.38 | 80.3 | 74 | 83.9 | 99.5 | Strd SPD1 | P1 NYAG7 | XTE 459 | 0.29 | 0.68 | 0.03 | 0.69 | 0.31 | 0.43 | 0.55 | 0.15 | 0.03 | 619 | 569 | 459 | 627 | 541 | 454 |
| 147 | 0.38 | 0.34 | 599 | 3691 | 1.97 | 80.3 | 16 | 90.4 | 99.6 | Strd SPD1 | P1 NYAG7 | XTE 470 | 0.17 | 0.76 | 0.07 | 0.69 | 0.31 | 0.43 | 0.55 | 0.13 | 0.07 | 619 | 569 | 470 | 627 | 541 | 465 |
| 148 | 0.42 | 0.34 | 604 | 2710 | 1.56 | 80.6 | 58 | 87.7 | 99.6 | Red 623 | P1 NYAG7 | XTE 465 | 0.29 | 0.67 | 0.04 | 0.70 | 0.30 | 0.43 | 0.55 | 0.14 | 0.05 | 623 | 569 | 465 | 632 | 541 | 459 |
| 149 | 0.44 | 0.36 | 605 | 2381 | 1.35 | 80.6 | 42 | 81.4 | 92.6 | Red 623 | P1 NYAG7 | XTE 459 | 0.33 | 0.65 | 0.03 | 0.69 | 0.31 | 0.43 | 0.55 | 0.14 | 0.03 | 619 | 569 | 459 | 627 | 541 | 454 |
| 150 | 0.46 | 0.36 | 596 | 2289 | 1.39 | 80.5 | 78 | 87.7 | 81.1 | ORed 619 | P1 NYAG7 | XTE 465 | 0.30 | 0.67 | 0.03 | 0.69 | 0.31 | 0.43 | 0.55 | 0.14 | 0.05 | 619 | 569 | 465 | 627 | 541 | 459 |
| 151 | 0.42 | 0.34 | 604 | 2710 | 1.58 | 80.4 | 62 | 90.3 | 99.9 | ORed 619 | P1 NYAG7 | XTE 465 | 0.26 | 0.70 | 0.04 | 0.69 | 0.31 | 0.43 | 0.55 | 0.14 | 0.05 | 619 | 569 | 465 | 627 | 541 | 459 |

FIG._7E

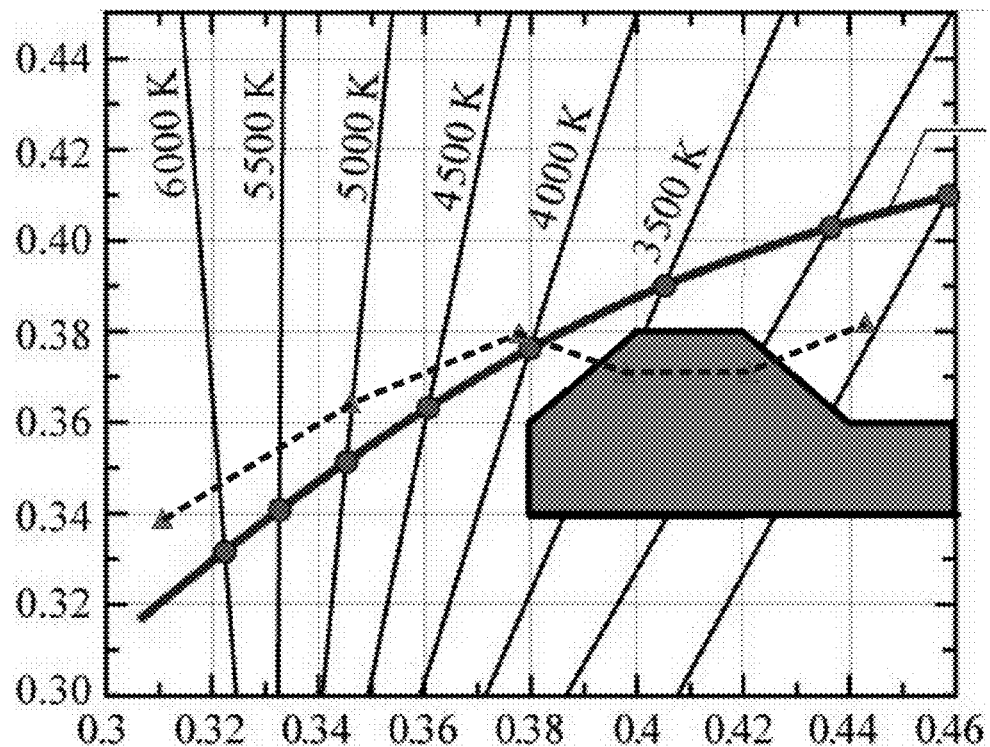
FIG._8A
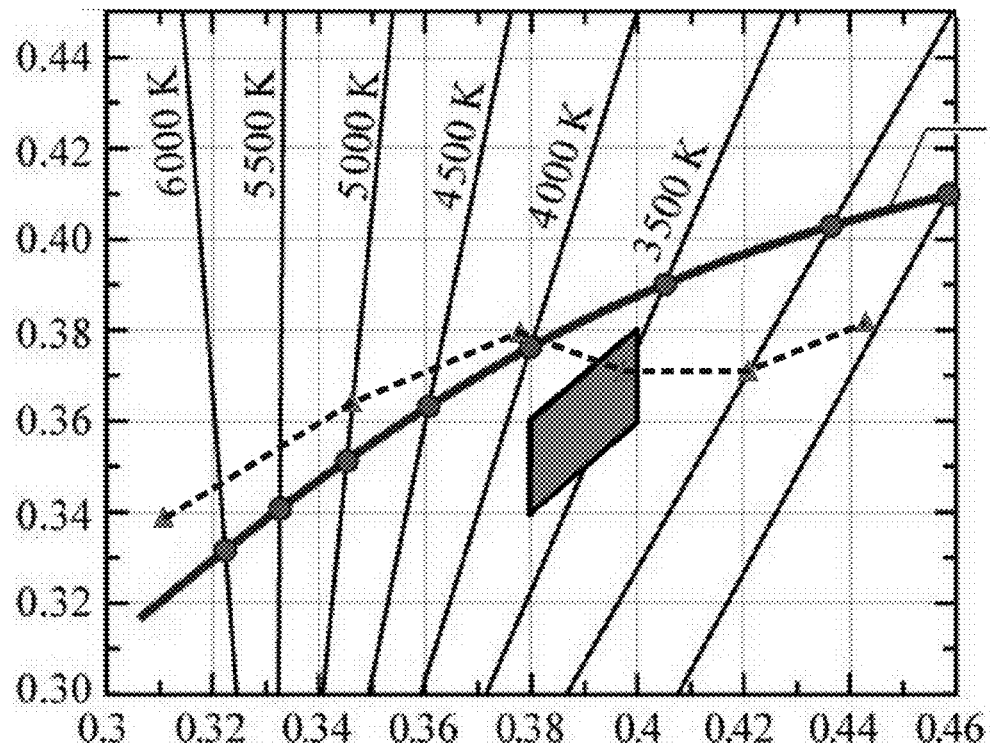
FIG._8B

FIG._9A

|  | x | y | u' | v' | nm (dom) | Arb. Units | CCT | CRI Ra | R9 | GAI | CQS | S/P ratio | LPW | du'v' BBL/DLL | duv |
|---|---|---|---|---|---|---|---|---|---|---|---|---|---|---|---|
| LED1 Orange 606 dm | 0.6668 | 0.3329 | 0.4712 | 0.5292 | 610.4 | 3.48 | | | | | | | | | |
| Phosphor PfLuGaAG 4 | 0.3213 | 0.5561 | 0.1423 | 0.5544 | 551.8 | 1.54 | | | | | | | | | |
| LED2 XPH 450 dm | 0.9000 | 0.1554 | 0.0215 | 0.2109 | 452.1 | 0.9 | | | | | | | | | |
| Combined | 0.3881 | 0.3457 | | | | | 3511 | 80 | 65 | 100 | 90 | 1.88 | 97.8 | 0.024 | -0.017 |

FIG._10

|  | x | y | u' | v' | nm (dom) | Arb. Units | CCT | CRI Ra | R9 | GAI | CQS | S/P ratio | LPW | du'v' BBL/DLL | duv |
|---|---|---|---|---|---|---|---|---|---|---|---|---|---|---|---|
| LED1 Amber 599 dm | 0.6310 | 0.3681 | 0.4101 | 0.5383 | 601.0 | 5.85 | | | | | | | | | |
| LED2 Green 532 dm | 0.2385 | 0.7098 | 0.0864 | 0.5786 | 539.6 | 4.21 | | | | | | | | | |
| LED3 XR 447 dm | 0.1560 | 0.0203 | 0.2128 | 0.0624 | 451.0 | 1.13 | | | | | | | | | |
| Combined | 0.3881 | 0.3457 | | | | | 3511 | 80 | 61 | 94 | 76 | 2.01 | 99.1 | 0.024 | -0.017 |

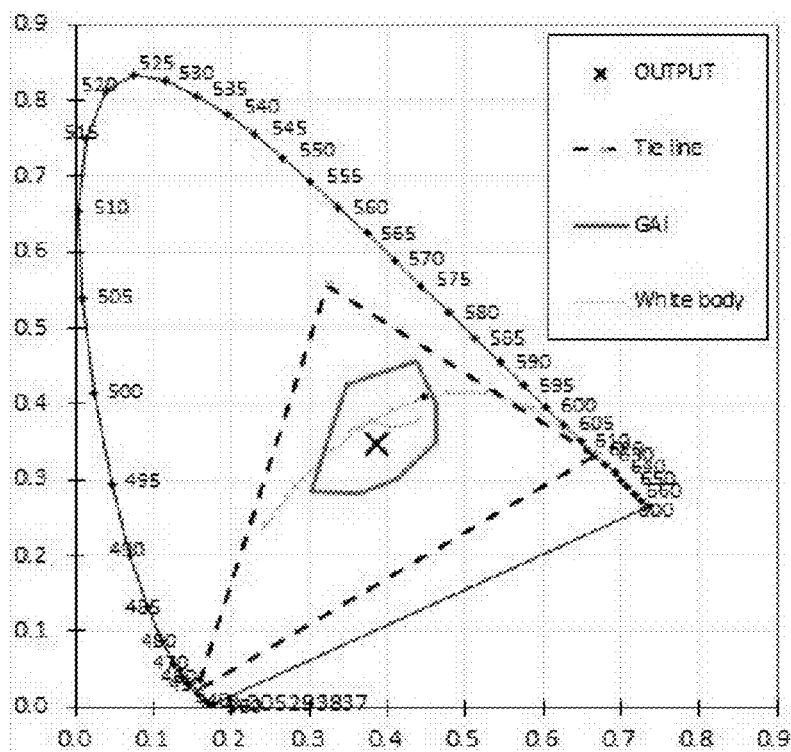
FIG._9B

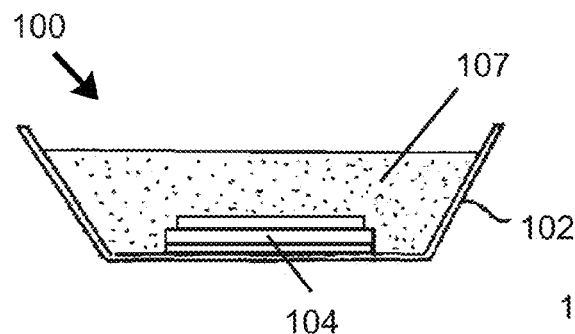
FIG._11A
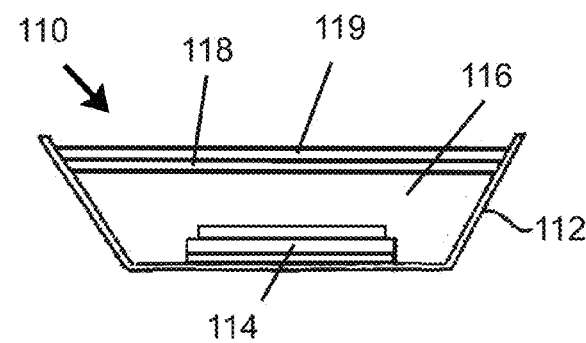
FIG._11B
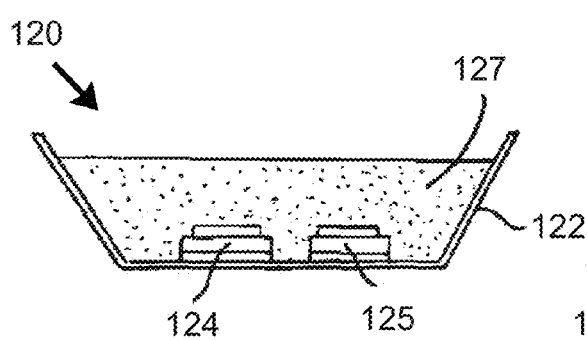
FIG._11C
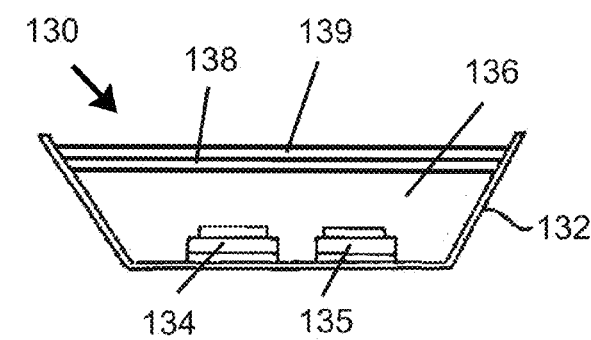
FIG._11D
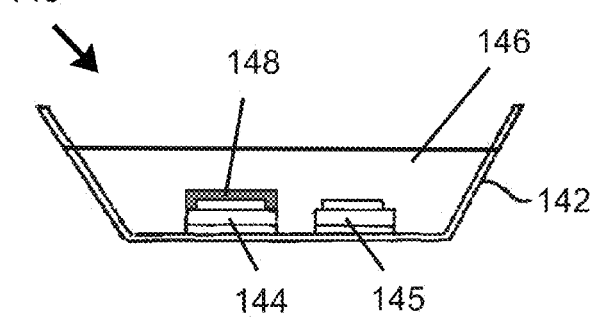
FIG._11E
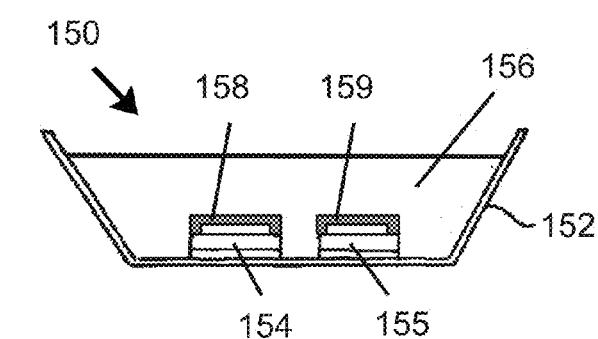
FIG._11F

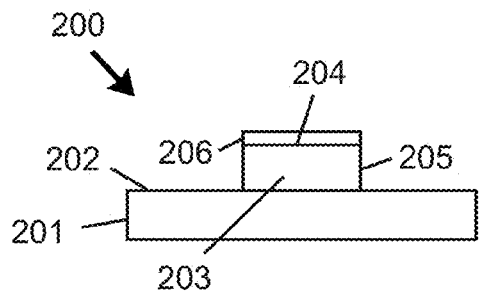
FIG. _12A
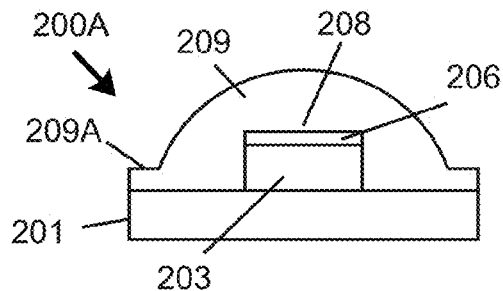
FIG. _12B
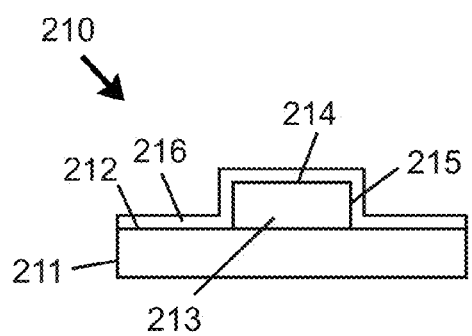
FIG. _12C
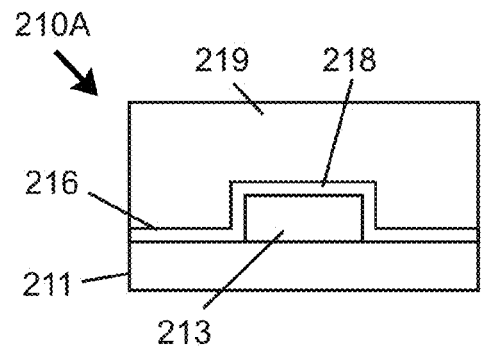
FIG. _12D
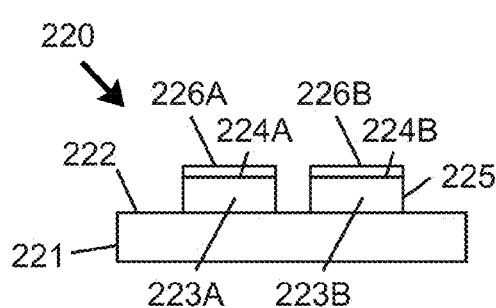
FIG. _12E
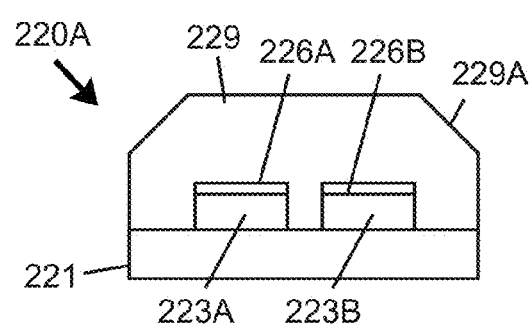
FIG. _12F
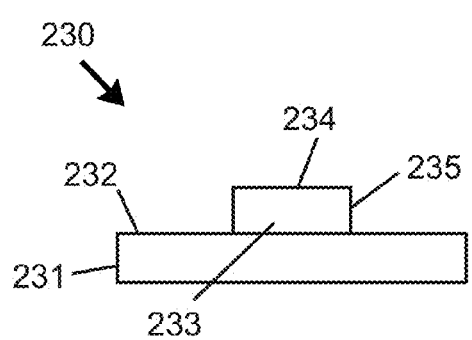
FIG. _12G
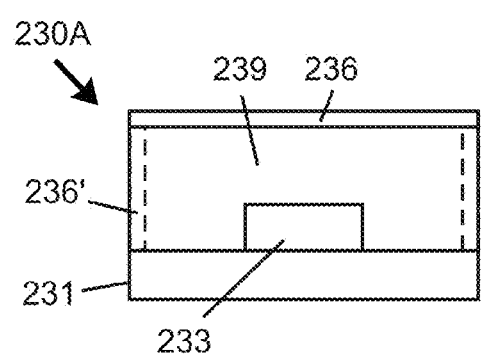
FIG. _12H

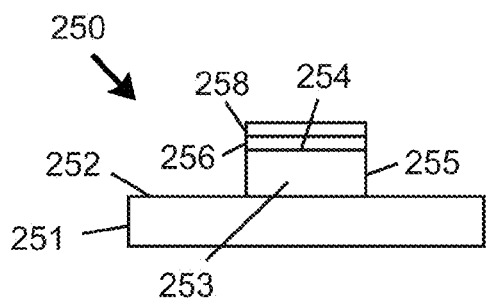
FIG._13A
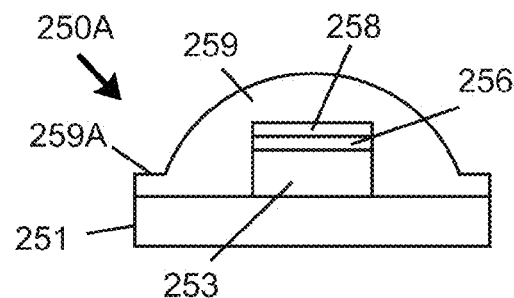
FIG._13B
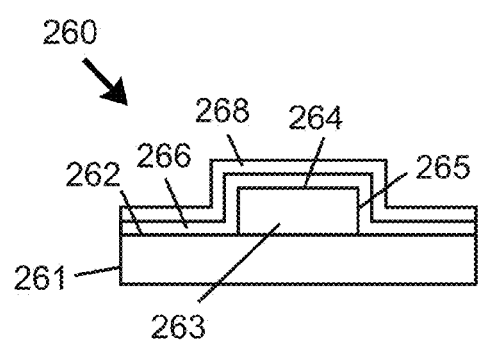
FIG._13C
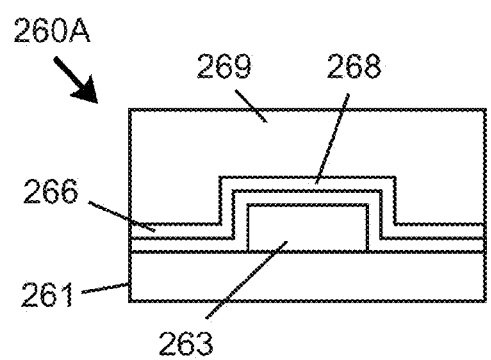
FIG._13D
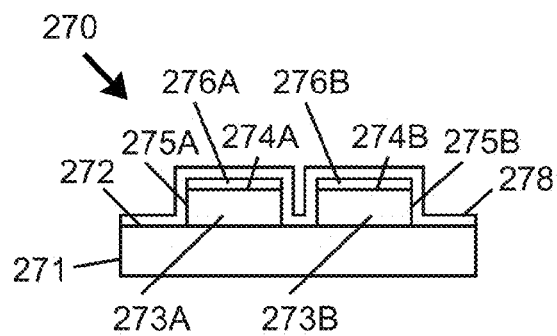
FIG._13E
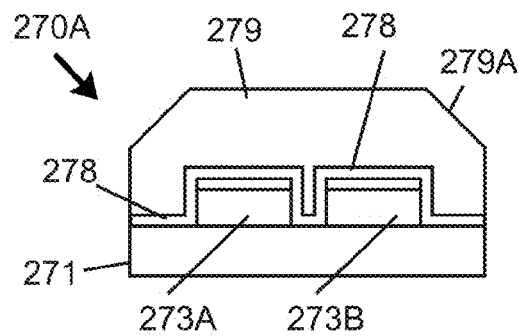
FIG._13F

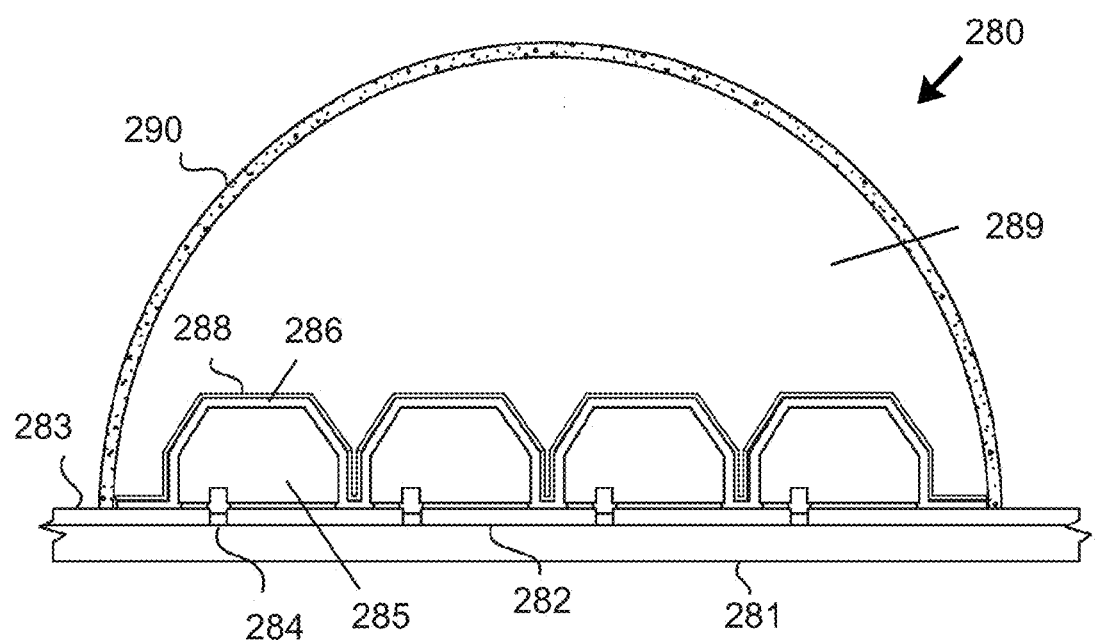
FIG._14
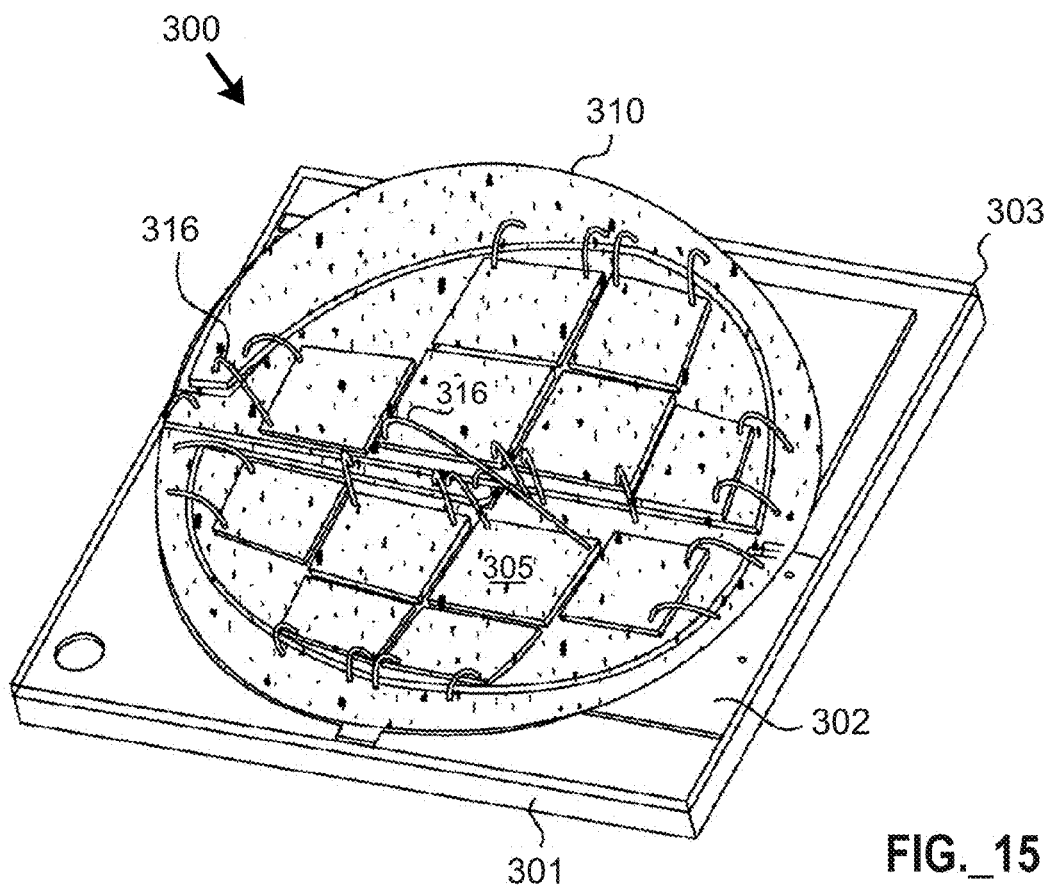
FIG._15

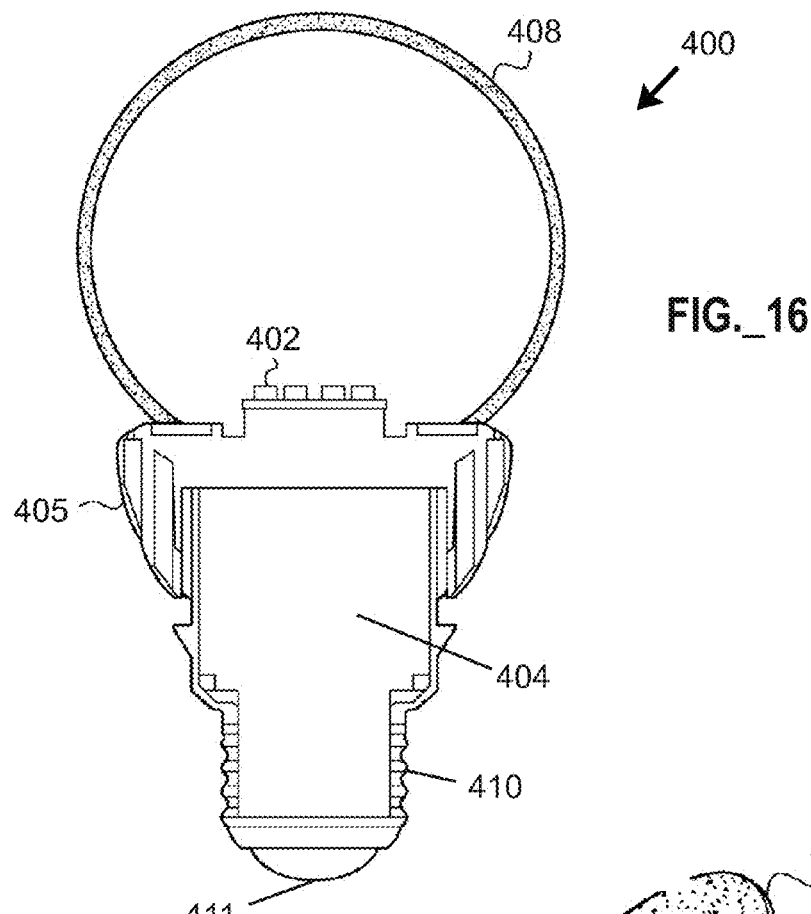
FIG._16
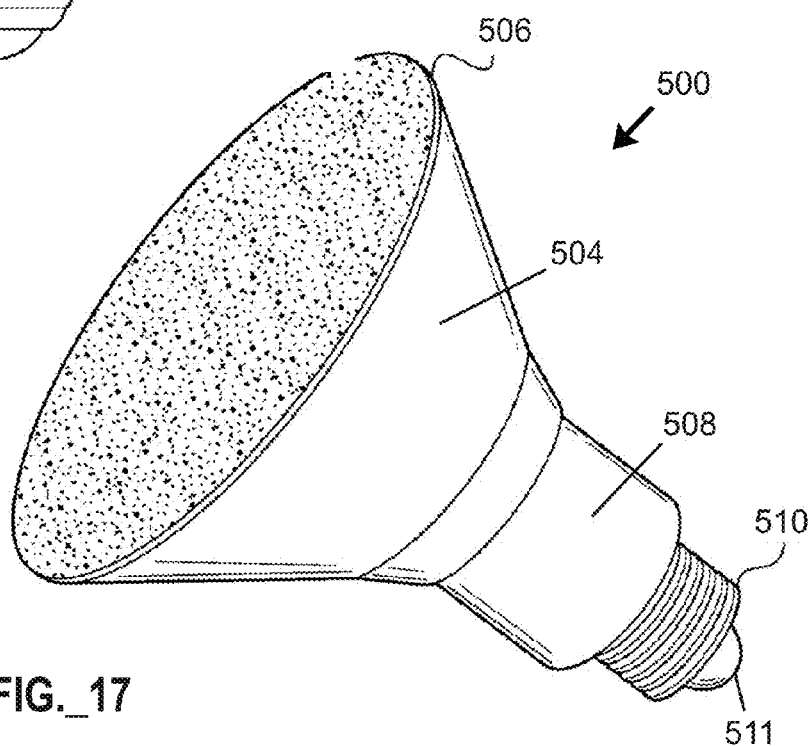
FIG._17

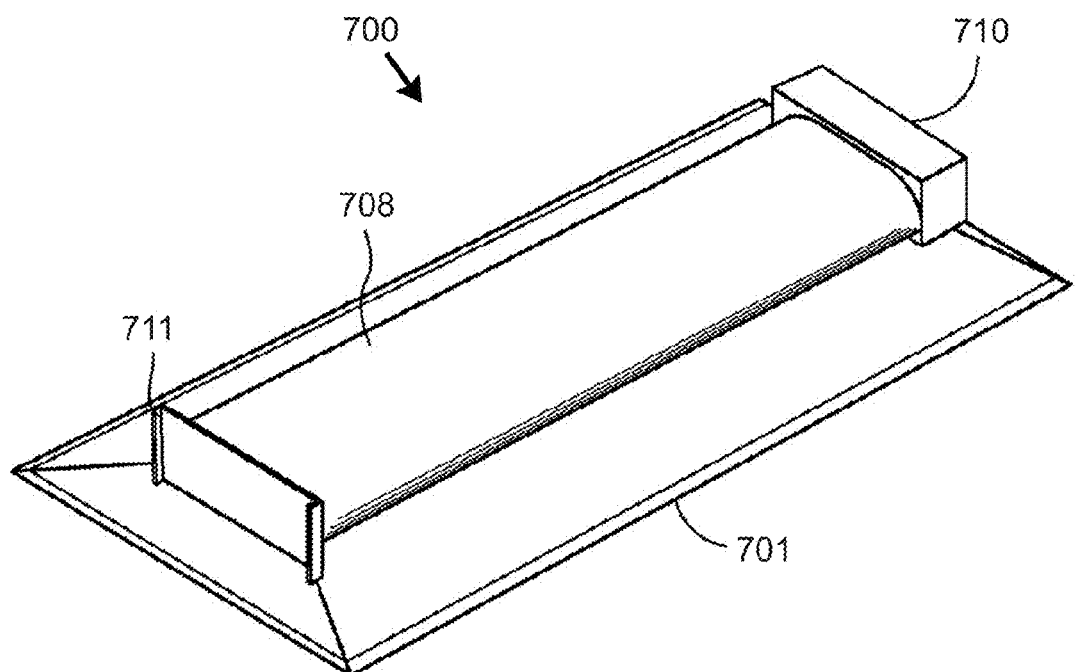
FIG._19A
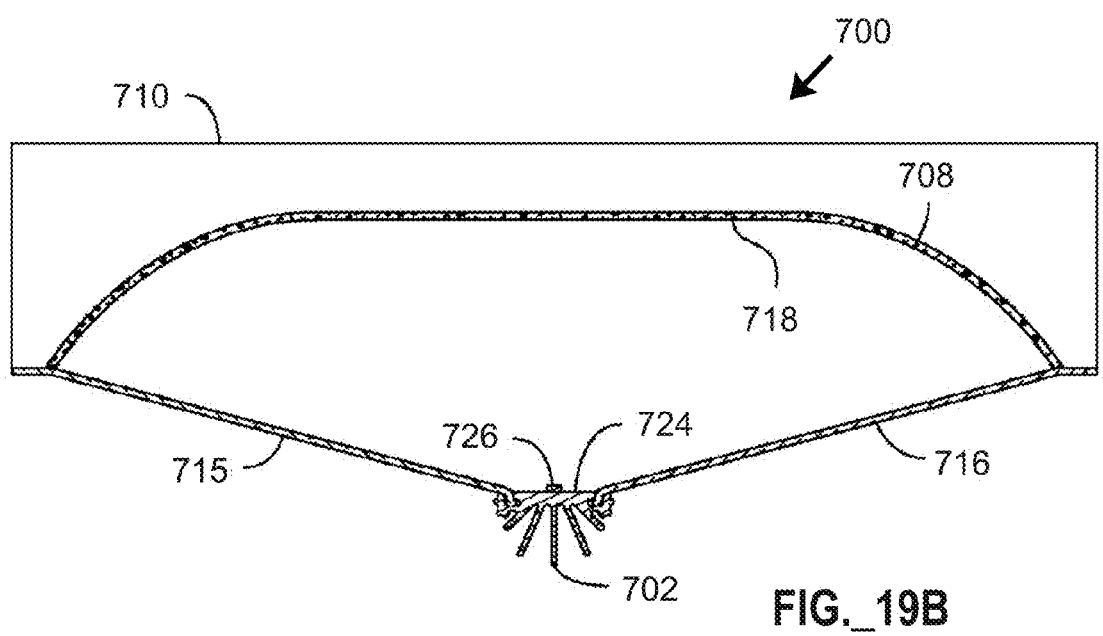
FIG._19B

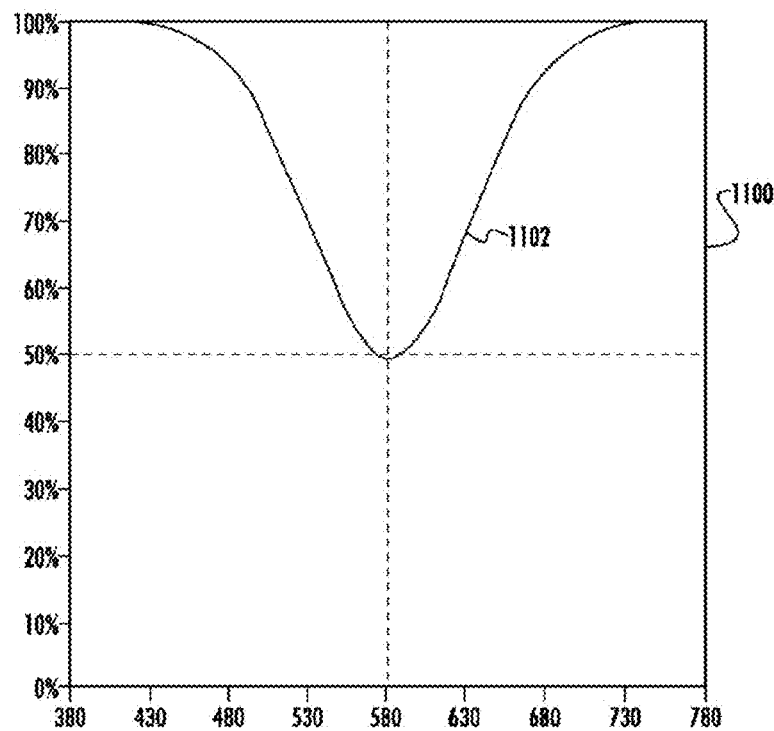
FIG. _22
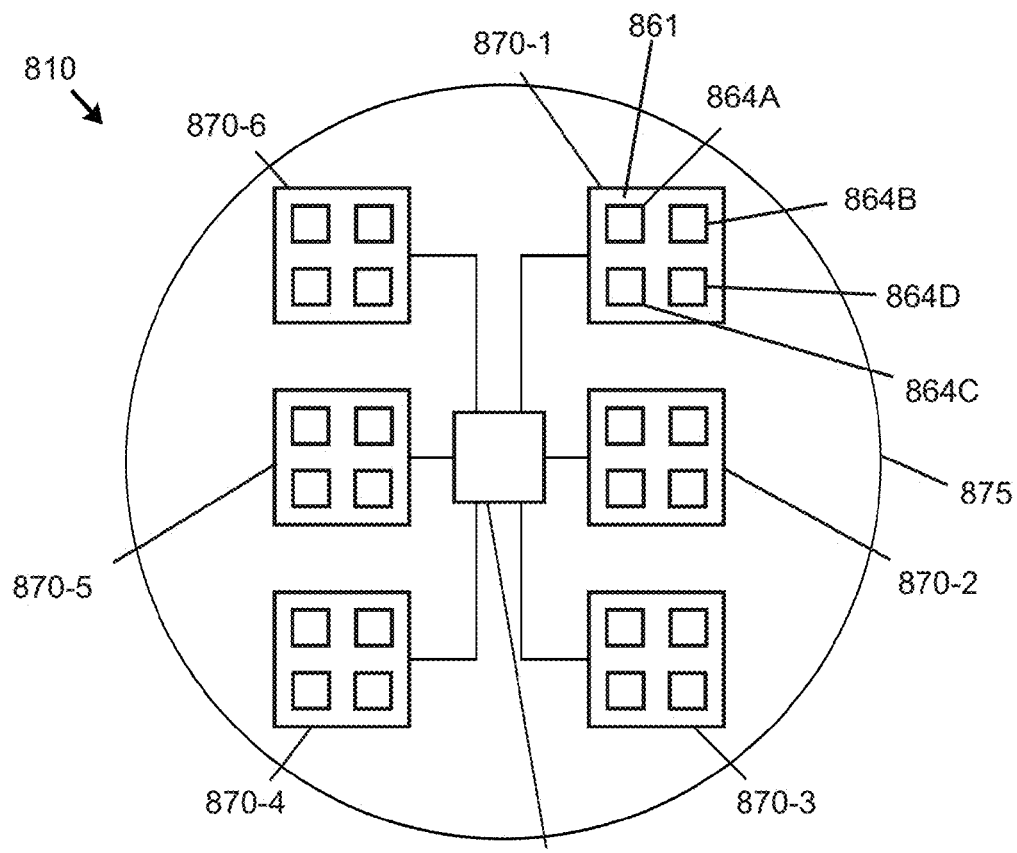
FIG. _20

HIGH CRI SOLID STATE LIGHTING DEVICES WITH ENHANCED VIVIDNESS

TECHNICAL FIELD

Subject matter herein relates to solid state lighting devices, including devices with lumiphors arranged to be stimulated by electrically activated solid light emitters, and relates to associated methods of making and using such devices.

BACKGROUND

Solid state emitters such as LEDs or lasers may be used to provide white light (e.g., perceived as being white or near-white), and have been investigated as potential replacements for white incandescent lamps. Solid state emitters may include lumiphoric materials (also known as lumiphors) that absorb a portion of emissions having a first peak wavelength emitted by the emitter and re-emit light having a second peak wavelength that differs from the first peak wavelength. Phosphors, scintillators, and lumiphoric inks are common lumiphoric materials. Light perceived as white or near-white may be generated by a combination of red, green, and blue ("RGB") emitters, or, alternatively, by combined emissions of a blue light emitting diode ("LED") and a lumiphor such as a yellow phosphor (e.g., YAG:Ce or Ce:YAG). In the latter case, a portion of the blue LED emissions pass through the phosphor, while another portion of the blue emissions is downconverted to yellow, and the blue and yellow light in combination are perceived as white. White light may also be produced by stimulating phosphors or dyes of multiple colors with a violet or UV LED source.

It is known to enclose an LED chip in a package to provide environmental and/or mechanical protection, color selection, light focusing and other functions. A LED package also includes electrical leads, contacts, and/or traces for electrically connecting the LED package to an external circuit. A conventional LED package 20 is illustrated in FIG. 1, including one or more LED chips 22 mounted over a carrier such as a printed circuit board (PCB) carrier, substrate or submount 23, which may include ceramic material. The package 20 may include one or more LED chips 22 of any suitable spectral output (e.g., ultraviolet, blue, green, red, white (e.g., blue LED chip arranged to stimulate emissions of phosphor material) and/or other colors). A reflector 24 may be mounted on the submount 23 (e.g., with solder or epoxy) to surround the LED chip(s) 22, reflect light emitted by the LED chips 22 away from the package 20, and also provide mechanical protection to the LED chips 22. One or more wirebond connections 21 may be made between ohmic contacts on the LED chips 22 and electrical traces 25A, 25B on the submount 23. The LED chips 22 are covered with a transparent encapsulant 26, which may provide environmental and mechanical protection to the chips while also acting as a lens.

Emissions of a blue LED in combination with a yellow or green lumiphoric material may be near-white in character and referred to as "blue-shifted yellow" ("BSY") light or "blue-shifted green" ("BSG") light. Addition of red spectral output from a red-emitting LED (to yield a "BSY+R" device) or from a red lumiphoric material (to yield a "BS(Y+R)" device) may be used to increase the warmth of the aggregated light output and better approximate light produced by incandescent lamps.

Quality artificial lighting generally attempts to emulate the characteristics of natural light. Natural light sources include daylight with a relatively high color temperature (e.g., ~5000K) and incandescent lamps with a lower color temperature (e.g., ~2800K).

Color reproduction is commonly measured using Color Rendering Index (CRI) or average Color Rendering Index (CRI Ra). To calculate CRI, the color appearance of 14 reflective samples is simulated when illuminated by a reference radiator (illuminant) and the test source. The general or average color rendering index CRI Ra is a modified average utilizing the first eight indices, all of which have low to moderate chromatic saturation. (R9 is one of six saturated test colors not used in calculating CRI, with R9 embodying a large red content.) CRI and CRI Ra are used to determine how closely an artificial light source matches the color rendering of a natural light source at the same correlated color temperature. Daylight has a high CRI Ra (approximately 100), with incandescent bulbs also being relatively close (CRI Ra greater than 95), and fluorescent lighting being less accurate (with typical CRI Ra values of approximately 70-80).

CRI Ra (or CRI) alone is not a satisfactory measure of the benefit of a light source, since it confers little ability to predict color discrimination (i.e., to perceive subtle difference in hue) or color preference. There appears to be a natural human attraction to brighter color. Daylight provides a spectrum of light that allows the human eye to perceive bright and vivid colors, which allows objects to be distinguished even with subtle color shade differences. Accordingly, it is generally recognized that daylight is the "best" light for emphasizing and distinguishing color. The ability of human vision to differentiate color is different under correlated color temperature conditions providing the same CRI Ra. Such differentiation is proportional to the gamut of the illuminating light.

Gamut area of a light source can be calculated as the area enclosed within a polygon defined by the chromaticities in CIE 1976 u'v' color space of the eight color chips used to calculate CRI Ra when illuminated by a test light source. Gamut area index (GAI) is a convenient way of characterizing in chromaticity space how saturated the illumination makes objects appear—with a larger GAI making object colors appear more saturated. GAI is a relative number whereby an imaginary equal-energy spectrum (wherein radiant power is equal at all wavelengths) is scored as 100. GAI for a test source is determined by comparing color space area of the light being tested to the color space area produced by the imaginary or theoretical equal-energy spectrum (EES) source. Unlike CRI Ra (or CRI), which has a maximum value of 100, GAI can exceed 100, meaning that some sources saturate colors more than an equal-energy source serves to saturate color.

It is found that typical blackbody-like light sources and typical daylight-like light sources have different gamut areas. Low correlated color temperature (CCT) sources (e.g., incandescent emitters) have a gamut area index of approximately 50% (i.e., about half the gamut area of the EES source). Sources with higher CCT values have a larger GAI. For example, a very bluish light with a CCT of 10000K may have a GAI of 140%.

The reference spectra used in color rendering index calculations were chosen as ideal illumination sources defined in terms of their color temperature. As a heated object becomes incandescent, it first glows reddish, then yellowish, then white, and finally bluish. Thus, apparent colors of incandescing materials are directly related to their actual temperature (in Kelvin (K)). Practical materials that incandesce are said to have correlated color temperature (CCT) values that are directly related to color temperatures of blackbody sources. CCT is intended to characterize the apparent "tint" of the illumination (e.g., warm or cool) produced by an electric light source. Certain implicit assumptions are embedded in this CCT designation—such as the assumption that chromaticities along the line of blackbody radiation are perceived as 'white', and that a CCT designation for a manufactured light source implies consistency in chromaticities of all sources having that designation. Recent research suggests, however, that most sources with chromaticities along the line of blackbody radiation do not appear "white"; rather, such sources provide illumination with discernible tint. An empirically established line of minimum tint in CIE 1931 (x,y) chromaticity space for CCTs between 2700K and 6500K is shown in FIG. 2. Researchers have determined that a majority of people prefer sources of illumination on this "white body line" (i.e., line of minimum tint) more than those of the same CCT line of blackbody radiation. (See, e.g., Rea, M. S. and Freyssinier, J. P.: White lighting for residential applications, Light Res. Tech., 45(3), pp. 331-344 (2013).) As shown in FIG. 2, at CCT values below about 4000K, the "white body line" (WBL) is below the blackbody curve, whereas at higher CCT values, the WBL is above the blackbody curve.

Rea and Freyssinier have proposed that lighting could be generally improved by ensuring that its CRI Ra value is at least 80 while its GAI is in a range of from 80 to 100 (i.e., 80% and 100% of an equal energy spectrum). FIG. 3 provides a plot of GAI values along the y-axis and CRI Ra values along the x-axis, with the shaded region at upper right representing a preferred combination of CRI Ra≥80 and 80≤GAI≤100. Rea and Freyssinier have proposed to designate a light source embodying CRI Ra and GAI values in the foregoing ranges as a "Class A" light source.

Characteristics including CCT, CRI Ra, GAI, CIE 1931 (x,y) coordinates, luminous efficacy (lm/W), and scotopic/photopic (S/P) ratios for eighteen different light sources are tabulated in FIG. 4A, and chromaticities for selected sources of the foregoing eighteen light sources are plotted in FIG. 4B together with the blackbody curve and the WBL (line of minimum tint). (Source: "Value Metrics for Better Lighting," Rea, Mark S., et al., 2013, pp. 54 & 63, SPIE Press (Bellingham, Wash., US), ISBN 978-0-8194-9322-4.) Only three sources (i.e., Xenon lamp (#1.5), fluorescent F40T12 daylight lamp (#2.7), and ceramic metal halide (#2.8)) meet the Class A color designation. Although numerous solid state light sources are characterized in FIG. 4A (i.e., white LED 6500K (#1.6 and #2.10), white LED 2700K (#2.9), and blue LED 470 nm peak (#3.1)), none of these solid state light sources meet the Class A color designation. It is noted that a neodymium doped 60 W (incandescent) A-lamp (#2.2) having a CRI Ra of 78 and GAI of 65 also failed to meet the Class A color designation.

As indicated in FIG. 4A, the ability of artificial lights to accurately illuminate color objects varies enormously by type. Solid state emitters such as LEDs in combination with lumiphors create white light by mixing relatively narrow wavelength bands together with spectral gaps between peaks of LEDs and/or lumiphors. The resulting light may be under-saturated with certain colors of the spectrum or over-saturated with certain colors. One way to alleviate oversaturation with respect to certain portions of the visible spectrum and thereby improve CRI includes notch filtering of LED lighting systems with an optical element (e.g., incorporating a rare earth compound such as neodymium oxide, or a color pigment) that filters light emissions so that light passing through or reflected by the optical element exhibits a spectral notch, as disclosed in U.S. Patent Application Publication No. 2013/0170199 A2 entitled "LED lighting using spectral notching" (which is hereby incorporated by reference herein). Such publication discloses that CRI and GAI values of LED light sources can be improved through use of notch filtering, such as to increase CRI from 84 to 90, and to increase GAI from 50 to 58. Alternatively, careful selection of materials used in LED lighting devices may permit attainment of CRI Ra values of 90 to 95 or more—see, e.g., U.S. Pat. No. 7,213,940, which is hereby incorporated by reference.

The art continues to seek improved solid state lighting devices providing desirable illumination characteristics, as well as improved methods for making solid state devices.

SUMMARY

The present disclosure relates in various aspects to solid state (e.g., LED) lighting devices including multiple solid state light emitters arranged to produce a mixture of light having a color rendering index (CRI Ra) value of at least 80, having a gamut area index (GAI) value in a range of from 80 to 100, and x, y coordinates within a predefined region of a 1931 CIE Chromaticity diagram, e.g. including x, y coordinates defining point on or within a first polygon bounded by the following x, y coordinates: (0.38, 0.34), (0.38, 0.36), (0.40, 0.38), (0.42, 0.38), (0.44, 0.36), (0.46, 0.36), and (0.46, 0.34). In certain aspects, such a device may be arranged to produce a mixture of light having a CRI Ra value of at least 90, having a GAI value in a range of from 80 to 100, and x, y coordinates within a predefined region of a 1931 CIE Chromaticity diagram, e.g. including x, y coordinates defining point on or within a second polygon bounded by the following x, y coordinates: (0.38, 0.34), (0.38, 0.36), (0.40, 0.38), and (0.40, 0.36). In certain aspects, at least one lumiphoric material may be associated with one or more solid state light emitters. The simultaneous attainment of enhanced vividness and high CRI Ra utilizing solid state emitters (and being devoid of incandescent or other emitter types) represents a significant advance relative to the prior art as exemplified by various light-emitting sources (including solid state light sources) characterized by Rea et al. as reproduced in FIGS. 4A-4B.

In one aspect, the present disclosure relates to a lighting device comprising multiple electrically activated solid state light emitters, wherein: a combination of light exiting the lighting device that was emitted by the multiple electrically activated solid state light emitters would, in the absence of any additional light, produce a mixture of light having a color point on a 1931 CIE Chromaticity Diagram including x, y coordinates that define a point on or within a first polygon bounded by the following x, y coordinates: (0.38, 0.34), (0.38, 0.36), (0.40, 0.38), (0.42, 0.38), (0.44, 0.36), (0.46, 0.36), and (0.46, 0.34); the mixture of light has a color rendering index (CRI Ra) value of at least 80; and the mixture of light has a gamut area index (GAI) value in a range of from 80 to 100.

In another aspect, the present disclosure relates to a lighting device comprising: at least one primary solid state light emitter arranged to emit primary solid state light emitter emissions comprising a dominant wavelength in a range of from 430 nm to 480 nm; at least one lumiphor arranged to receive and be excited by at least a portion of emissions of the at least one primary solid state light emitter, and emit lumiphor emissions comprising a dominant wavelength in a range of from about 535 nm to about 585 nm; and at least one supplemental solid state light emitter arranged to generate supplemental solid state light emitter emissions comprising a dominant wavelength in a range of from 590 nm to 650 nm; wherein a combination of (A) light exiting the lighting device that was emitted by the at least one primary solid state light emitter, (B) light exiting the lighting device that was emitted by the at least one lumiphor, and (C) light exiting the lighting device that was emitted by the at least one supplemental solid state light emitter would, in the absence of any additional light, produce a mixture of light having a color point on a 1931 CIE Chromaticity Diagram including x, y coordinates that define a point on or within a first polygon bounded by the following x, y coordinates: (0.38, 0.34), (0.38, 0.36), (0.40, 0.38), (0.42, 0.38), (0.44, 0.36), (0.46, 0.36), and (0.46, 0.34); wherein the mixture of light has a color rendering index (CRI Ra) value of at least 80; and wherein the mixture of light has a gamut area index (GAI) value in a range of from 80 to 100.

In another aspect, the present disclosure relates to a method comprising illuminating an object, a space, or an environment, utilizing a solid state lighting device as described herein.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features and embodiments of the present disclosure will be more fully apparent from the ensuing disclosure and appended claims.

BRIEF DESCRIPTION OF THE DRAWINGS

FIG. 1 is a side cross-sectional view of a first conventional light emitting diode package.

FIG. 2 is an excerpt of a CIE 1931 chromaticity diagram showing the blackbody locus and including a line of minimum tint (or "white body line") extending between CCT values of from 2700K to 6500K.

FIG. 3 is a two dimensional plot of gamut area index (GAI) and color rendering index (CRI Ra) including a shaded region at upper right representing a preferred combination of CRI Ra≥80 and 80≤GAI≤100.

FIG. 4A is a chart including CCT, CRI Ra, GAI, CIE 1931 (x,y) coordinates, luminous efficacy (lm/W), and scotopic/photopic (S/P) ratios for eighteen different light sources.

FIG. 4B is an excerpt of a CIE 1931 chromaticity diagram showing the blackbody locus, the line of minimum tint (or "white body line") extending between CCT values from 2700K to 6500K, and (x,y) coordinate plots for selected sources of the eighteen light sources listed in FIG. 4A.

FIG. 5B is an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of ten zones with different ranges of color rendering index (CRI Ra) obtained by modeling the same lighting device according to FIG. 5A.

FIG. 6A is an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of nine zones with different ranges of gamut area index (GAI) obtained by modeling a second exemplary lighting device including a blue LED (452 nm peak wavelength) arranged to stimulate emissions of a yellow/green (LuAg) phosphor, in combination with an orange-red (619 nm dominant wavelength) LED.

FIG. 6C is an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of eight zones with different ranges of scotopic/photopic (S/P) ratio obtained by modeling the same lighting device according to FIGS. 6A-6B.

FIGS. 7A-7E in combination embody a table providing numerical results for modeling of 151 solid state lighting devices each including an orange or red LED (source 1a), a yellow or yellow/green phosphor (source a), and a blue LED (source 3a), including device number, CIE 1931 x,y coordinates of combined emissions, dominant LED wavelength (dm), correlated color temperature (cct), S/P ratio, CRI Ra, R9 color rendering, color quality scale (CQS), gamut area index (GAI), source identifiers, lumen percentage for each individual source, CIE 1931 x,y coordinates for each individual source, dominant wavelength (dm) for each individual source, and peak wavelength (pk) for each individual source.

FIG. 8A is an excerpt of a CIE 1931 chromaticity diagram showing the blackbody locus, a segmented representation (including six points) of the line of minimum tint (or "white body line") extending between CCT values of from 2700K to 6500K, and including a shaded first polygon bounded by the following x, y coordinates: (0.38, 0.34), (0.38, 0.36), (0.40, 0.38), (0.42, 0.38), (0.44, 0.36), (0.46, 0.36), and (0.46, 0.34) including color points of the modeled solid state lighting devices represented in FIGS. 7A-7E.

FIG. 8B is an excerpt of a CIE 1931 chromaticity diagram showing the blackbody locus, a segmented representation (including six points) of the line of minimum tint (or "white body line") extending between CCT values of from 2700K to 6500K, and including a shaded second polygon bounded by the following x, y coordinates: (0.38, 0.34), (0.38, 0.36), (0.40, 0.38), and (0.40, 0.36) including color points of selected modeled solid state lighting devices represented in FIGS. 7A-7E.

FIG. 9A is a table including numerical results for modeling of a solid state lighting device including an orange (606 nm dominant wavelength) LED, a blue (450 nm dominant wavelength) LED, and a green phosphor (P1LuGaAg 4), yielding composite emissions with a CCT of 3511K, a CRI Ra value of 80, and a GAI value of 100.

FIG. 9B is an excerpt of a CIE 1931 chromaticity diagram showing the blackbody locus, a portion of the line of minimum tint (or white body line), and the following items for the LEDs and phosphor of FIG. 9A: tie lines, gamut area, and composite color point.

FIG. 10 is a table including numerical results for modeling of a solid state lighting device including an amber (599 nm dominant wavelength) LED, a green (532 nm dominant wavelength) LED, and a blue (447 nm dominant wavelength) LED, yielding composite emissions with a CCT of 3511K, a CRI Ra value of 80, and a GAI value of 94.

FIG. 11A is a side cross-sectional schematic view of a portion of a solid state lighting device including an electrically activated solid state light emitter (e.g., LED) and at least one lumiphor dispersed in an encapsulant material disposed over the solid state light emitter.

FIG. 11B is a side cross-sectional schematic view of a portion of a solid state lighting device including an electrically activated solid state light emitter (e.g., LED) and at least one lumiphor arranged in one or more layers spatially separated from the solid state light emitter.

FIG. 11C is a side cross-sectional schematic view of a portion of a solid state lighting device including multiple electrically activated solid state light emitters (e.g., LEDs) and at least one lumiphor dispersed in an encapsulant material disposed over the multiple solid state light emitters.

FIG. 11D is a side cross-sectional schematic view of a portion of a solid state lighting device including multiple solid state light emitters (e.g., LEDs) and at least one lumiphor arranged in one or more layers spatially separated from the multiple solid state light emitters.

FIG. 11E is a side cross-sectional schematic view of a portion of a solid state lighting device including multiple solid state light emitters (e.g., LEDs), with at least one solid state light emitter having a lumiphor material individually applied or coated over at least one surface of the solid state light emitter.

FIG. 11F is a side cross-sectional schematic view of a portion of a solid state lighting device including multiple solid state light emitters (e.g., LEDs), with multiple solid state light emitters each having a lumiphor material individually applied or coated over at least one surface of the respective emitter.

FIG. 12A is a side cross-sectional schematic view of at least a portion of a solid state light emitting device including a solid state emitter chip arranged over a package mount, with a top surface of the emitter chip being covered with a wavelength conversion material.

FIG. 12B is a side cross-sectional schematic view of at least a portion of a solid state light emitting device including the device of FIG. 12A with addition of a curved (e.g., hemispherical) lens.

FIG. 12C is a side cross-sectional schematic view of at least a portion of a solid state light emitting device including a solid state emitter chip arranged over a package mount, with top and side surfaces of the emitter chip and an upper surface of the package mount being covered with a wavelength conversion material.

FIG. 12D is a side cross-sectional schematic view of at least a portion of a solid state light emitting device including the device of FIG. 12C with addition of a lens having a substantially rectangular cross-sectional shape.

FIG. 12E is a side cross-sectional schematic view of at least a portion of a solid state light emitting device including multiple solid state emitter chips arranged over a package mount, with a top surface of each emitter chip being covered with at least one wavelength conversion material.

FIG. 12F is a side cross-sectional schematic view of at least a portion of a solid state light emitting device including the device of FIG. 12E with addition of a lens having a beveled upper edge with a non-rectangular (polygonal) cross-sectional shape.

FIG. 12G is a side cross-sectional schematic view of at least a portion of a solid state light emitting device including a solid state emitter chip arranged over a package mount.

FIG. 12H is a side cross-sectional schematic view of at least a portion of a solid state light emitting device including the device of FIG. 12G with addition of a lens having a substantially rectangular cross-sectional shape, and with addition of a functional material (e.g., wavelength conversion material) arranged on a surface of the lens and spatially separated from the solid state emitter chip.

FIG. 13A is a side cross-sectional schematic view of at least a portion of a solid state light emitting device including a solid state emitter chip arranged over a package mount, with a top surface of the emitter chip being covered with a wavelength conversion material and a filtering (e.g., notch filtering) material.

FIG. 13B is a side cross-sectional schematic view of at least a portion of a solid state light emitting device including the device of FIG. 13A with addition of a curved (e.g., hemispherical) lens.

FIG. 13C is a side cross-sectional schematic view of at least a portion of a solid state light emitting device including a solid state emitter chip arranged over a package mount, with top and side surfaces of the emitter chip and an upper surface of the package mount being covered with a wavelength conversion material and a filtering material.

FIG. 13D is a side cross-sectional schematic view of at least a portion of a solid state light emitting device including the device of FIG. 13C with addition of a lens having a substantially rectangular cross-sectional shape.

FIG. 13E is a side cross-sectional schematic view of at least a portion of a solid state light emitting device including a solid state emitter chip arranged over a package mount, with a top surface of the emitter chip being covered with a wavelength conversion material and a filtering material, and with side surfaces of the emitter chip and an upper surface of the package mount being covered with a filtering material.

FIG. 13F is a side cross-sectional schematic view of at least a portion of a solid state light emitting device including the device of FIG. 13E with addition of a lens having a beveled upper edge with a non-rectangular (polygonal) cross-sectional shape.

FIG. 14 is a side cross-sectional view of at least a portion of a solid state lighting emitting device including multiple solid state emitter chips coated with multiple functional materials and arranged under a hemispherical optical element.

FIG. 15 is a perspective view of at least a portion of a solid state emitter package including multiple solid state emitter chips coated with one or more functional materials, with the chips coupled to electrical traces via wirebonds and arranged under a hemispherical optical element.

FIG. 16 is a side cross-sectional view of a first light bulb arranged to incorporate multiple solid state emitter chips as disclosed herein.

FIG. 17 is a side cross-sectional view of a second, reflector-type light bulb arranged to incorporate at least one emitter chip as disclosed herein.

FIG. 19A is an upper perspective view of a troffer-type light fixture arranged to incorporate multiple solid state emitter chips as disclosed herein.

FIG. 19B is a side cross-sectional view of a portion of the light fixture of FIG. 19A.

FIG. 20 is a simplified plan view of a light emitting apparatus including multiple LED components and at least one control circuit.

FIG. 22 depicts spectral transmittance versus wavelength for an illustrative color pigment material.

DETAILED DESCRIPTION

Figure 5A:
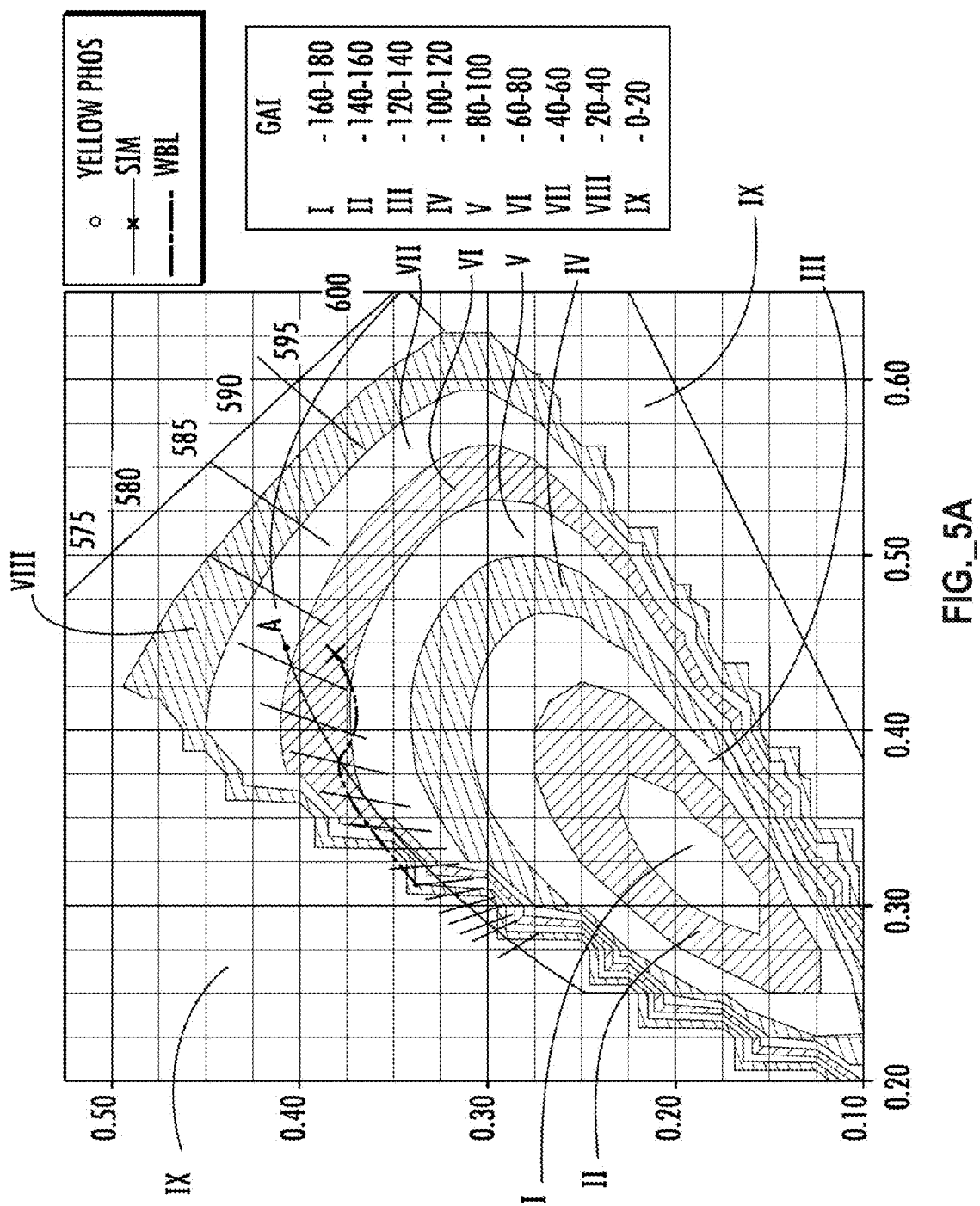
FIG. 5A is an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of nine zones with different ranges of gamut area index (GAI) obtained by modeling a first exemplary lighting device including a blue LED (452 nm peak wavelength) arranged to stimulate emissions of a yellow (YAG 108) phosphor, in combination with an orange-red LED (619 nm dominant wavelength).

As noted previously, the art continues to seek solid state lighting devices providing desirable illumination characteristics. Various embodiments disclosed herein include solid state (e.g., LED) lighting devices including multiple solid state light emitters arranged to produce a mixture of light having a color rendering index (CRI Ra) value of at least 80, having a gamut area index (GAI) value in a range of from 80 to 100, and x, y coordinates within a predefined region of a 1931 CIE Chromaticity diagram, e.g. including x, y coordinates defining point on or within a first polygon bounded by the following x, y coordinates: (0.38, 0.34), (0.38, 0.36), (0.40, 0.38), (0.42, 0.38), (0.44, 0.36), (0.46, 0.36), and (0.46, 0.34), or within a second polygon bounded by the following x, y coordinates: (0.38, 0.34), (0.38, 0.36), (0.40, 0.38), and (0.40, 0.36), wherein in the case of the second polygon the CRI Ra value may be in a range of at least 90. Each of the foregoing polygons is below the blackbody locus and includes CCT values below 4000K. The foregoing devices simultaneously provide enhanced vividness and sufficiently high CRI Ra to be used for general illumination. In certain embodiments, the plurality of solid state light emitters may include a primary solid state light emitter arranged to generate emissions comprising a dominant wavelength in a range of from 430 nm to 480 nm, and at least one supplemental solid state light emitter arranged to generate supplemental solid state light emitter emissions comprising a dominant wavelength in a range of from 590 nm to 650 nm; wherein at least one lumiphor is arranged to receive and be excited by at least a portion of emissions of the at least one primary solid state light emitter and responsively emit lumiphor emissions comprising a dominant wavelength in a range of from about 535 nm to about 585 nm (or in a range of from 545 nm to 585 nm in certain embodiments).

Unless otherwise defined, terms used herein should be construed to have the same meaning as commonly understood by one of ordinary skill in the art to which the present disclosure belongs. It will be further understood that terms used herein should be interpreted as having a meaning that is consistent with their meaning in the context of this specification and the relevant art, and should not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Embodiments of the present disclosure are described herein with reference to cross-sectional, perspective, elevation, and/or plan view illustrations that are schematic illustrations of idealized embodiments of the present disclosure. Variations from the shapes of the illustrations as a result, for example, of manufacturing techniques and/or tolerances, are to be expected, such that embodiments of the present disclosure should not be construed as limited to particular shapes illustrated herein. The present disclosure may be embodied in different forms and should not be construed as limited to the specific embodiments set forth herein. In the drawings, the size and relative sizes of layers and regions may be exaggerated for clarity. In certain drawings, conventional features inherent to LED devices known in the art but not essential to the understanding of the present disclosure have been omitted to facilitate ease of explanation of the inventive subject matter.

Unless the absence of one or more elements is specifically recited, the terms "comprising," "including," and "having" as used herein should be interpreted as open-ended terms that do not preclude the presence of one or more elements.

It will be understood that when an element such as a layer, region, or substrate is referred to as being "on" another element, it can be directly on the other element or intervening elements may be present. Moreover, relative terms such as "on", "above", "upper", "top", "lower", or "bottom" may be used herein to describe a relationship between one structure or portion to another structure or portion as illustrated in the figures, but it should be understood that such relative terms are intended to encompass different orientations of the device in addition to the orientation depicted in the figures. For example, if the device in the figures is turned over, structure or portion described as "above" other structures or portions would now be oriented "below" the other structures or portions.

The terms "solid state light emitter" or "solid state emitter" (which may be qualified as being "electrically activated") may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the present disclosure may include, but are not limited to, III-V nitride based LED chips or laser chips fabricated on a silicon, silicon carbide, sapphire, or III-V nitride growth substrate, including (for example) devices manufactured and sold by Cree, Inc. of Durham, N.C. Such LEDs and/or lasers may optionally be configured to operate such that light emission occurs through the substrate in a so-called "flip chip" orientation. Such LED and/or laser chips may also be devoid of growth substrates (e.g., following growth substrate removal).

LED chips useable with lighting devices as disclosed herein may include horizontal devices (with both electrical contacts on a same side of the LED) and/or vertical devices (with electrical contacts on opposite sides of the LED). A horizontal device (with or without the growth substrate), for example, may be flip chip bonded (e.g., using solder) to a carrier substrate or printed circuit board (PCB), or wire bonded. A vertical device (without or without the growth substrate) may have a first terminal solder bonded to a carrier substrate, mounting pad, or printed circuit board (PCB), and have a second terminal wire bonded to the carrier substrate, electrical element, or PCB. Although certain embodiments shown in the figures may be appropriate for use with vertical LEDs, it is to be appreciated that the present disclosure is not so limited, such that any combination of one or more of the following LED configurations may be used in a single solid state light emitting device: horizontal LED chips, horizontal flip LED chips, vertical LED chips, vertical flip LED chips, and/or combinations thereof, with conventional or reverse polarity. Examples of vertical and horizontal LED chip structures are discussed by way of example in U.S. Publication No. 2008/0258130 to Bergmann et al. and in U.S. Pat. No. 7,791,061 to Edmond et al. which are hereby incorporated by reference herein.

Solid state light emitters may be used individually or in groups to emit one or more beams to stimulate emissions of one or more lumiphoric materials (e.g., phosphors, scintillators, lumiphoric inks, quantum dots, day glow tapes, etc.) to generate light at one or more peak wavelength, or of at least one desired perceived color (including combinations of colors that may be perceived as white). Lumiphoric materials may be provided in the form of particles, films, or sheets.

Inclusion of lumiphoric (also called 'luminescent') materials in lighting devices as described herein may be accomplished by any suitable means, including: direct coating on solid state emitters, dispersal in encapsulant materials arranged to cover solid state emitters; coating on lumiphor support elements (e.g., by powder coating, inkjet printing, or the like); incorporation into diffusers or lenses; and the like. Examples of lumiphoric materials are disclosed, for example, in U.S. Pat. No. 6,600,175, U.S. Patent Application Publication No. 2009/0184616, and U.S. Patent Application Publication No. 2012/0306355, and methods for coating light emitting elements with phosphors are disclosed in U.S. Patent Application Publication No. 2008/0179611, with the foregoing publications being incorporated by reference. Other materials, such as light scattering elements (e.g., particles) and/or index matching materials, may be associated with a lumiphoric material-containing element or surface. One or more lumiphoric materials useable in devices as described herein may be down-converting or up-converting, or can include a combination of both types.

In certain embodiments, at least one lumiphoric material may be spatially segregated ("remote") from and arranged to receive emissions from at least one electrically activated solid state emitter, with such spatial separation reducing thermal coupling between a solid state emitter and lumiphoric material. In certain embodiments, a spatially segregated lumiphor may be arranged to fully cover one or more electrically activated emitters of a lighting device. In certain embodiments, a spatially segregated lumiphor may be arranged to cover only a portion or subset of one or more emitters electrically activated emitters.

In certain embodiments, at least one lumiphoric material may be arranged with a substantially constant thickness and/or concentration relative to different electrically activated emitters. In certain embodiments, one or more lumiphoric materials may be arranged with presence, thickness, and/or concentration that vary relative to different emitters. Multiple lumiphors (e.g., lumiphors of different compositions) may be applied with different concentrations or thicknesses relative to different electrically activated emitters. In one embodiment, lumiphor presence, composition, thickness and/or concentration may vary relative to multiple electrically activated emitters. In certain embodiment, at least one lumiphoric material may be applied to a solid state emitter or a lumiphoric material support surface by patterning, such may be aided by one or more masks.

Various substrates may be used as mounting elements on which, in which, or over which multiple solid state light emitters (e.g., emitter chips) may be arranged or supported (e.g., mounted). Exemplary substrates include printed circuit boards (including but not limited to metal core printed circuit boards, flexible circuit boards, dielectric laminates, and the like) having electrical traces arranged on one or multiple surfaces thereof. A substrate, mounting plate, or other support element may include a printed circuit board (PCB), a metal core printed circuit board (MCPCB), a flexible printed circuit board, a dielectric laminate (e.g., FR-4 boards as known in the art) or any suitable substrate for mounting LED chips and/or LED packages. In certain embodiments, at least a portion of a substrate may include a dielectric material to provide desired electrical isolation between electrical traces or components of multiple LED sets. In certain embodiments, a substrate can comprise ceramic such as alumina, aluminum nitride, silicon carbide, or a polymeric material such as polyimide, polyester, etc. In certain embodiments, a substrate can comprise a flexible circuit board or a circuit board with plastically deformable portions to allow the substrate to take a non-planar (e.g., bent) or curved shape allowing for directional light emission with LED chips of one or more LED components also being arranged in a non-planar manner.

In certain embodiments, one or more LED components can include one or more "chip-on-board" (COB) LED chips and/or packaged LED chips that can be electrically coupled or connected in series or parallel with one another and mounted on a portion of a substrate. In certain embodiments, COB LED chips can be mounted directly on portions of substrate without the need for additional packaging.

Certain embodiments may involve use of solid state emitter packages. A solid state emitter package may include at least one solid state emitter chip (more preferably multiple solid state emitter chips) that is enclosed with packaging elements to provide environmental protection, mechanical protection, color selection, and/or light focusing utility, as well as electrical leads, contacts, and/or traces enabling electrical connection to an external circuit. One or more emitter chips may be arranged to stimulate one or more lumiphoric materials, which may be coated on, arranged over, or otherwise disposed in light receiving relationship to one or more solid state emitters. At least one lumiphoric material may be arranged to receive emissions of at least some emitters of a plurality of solid state light emitters and responsively emit lumiphor emissions. A lens and/or encapsulant material, optionally including lumiphoric material, may be disposed over solid state emitters, lumiphoric materials, and/or lumiphor-containing layers in a solid state emitter package.

In certain embodiments, a light emitting apparatus as disclosed herein (whether or not including one or more LED packages) may include at least one of the following items arranged to receive light from multiple LEDs: a single leadframe arranged to conduct electrical power to the plurality of electrically activated solid state light emitters; a single reflector arranged to reflect at least a portion of light emanating from the plurality of electrically activated solid state light emitters; a single submount or mounting element supporting the plurality of electrically activated solid state light emitters; a single lens arranged to transmit at least a portion of light emanating from the plurality of electrically activated solid state light emitters; and a single diffuser arranged to diffuse at least a portion of light emanating from the plurality of electrically activated solid state light emitters. In certain embodiments, a light emitting apparatus including multiple LEDs may include at least one of the following items arranged to receive light from multiple LEDs: multiple lenses; multiple optical elements; and multiple reflectors. Examples of optical elements include, but are not limited to elements arranged to affect light mixing, focusing, collimation, dispersion, and/or beam shaping.

In certain embodiments, a package including multiple solid state emitters may include multiple die attach pads, with a single die attach pad supporting each separately controllable solid state emitter or each separately controllable group of solid state emitters. A package including multiple solid state emitters may include a single lens (e.g., a molded lens) arranged to transmit at least a portion of light emanating from each solid state emitter. In certain embodiments, a molded lens may be arranged in direct contact with LED chips, die attach pads, other electrical elements, and/or exposed insulating material along a top surface of a substrate comprising insulating material. In certain embodiments, a lens may be textured or faceted to improve light extraction, and/or a lens may contain or have coated thereon various materials such as lumiphors and/or scattering particles.

In certain embodiments, a package may include a molded lens arranged to transmit light emitted by multiple LEDs. As known in the art, a mold including one or more cavities can be arranged over a substrate (or a panel of substrate material, from which multiple substrates may be singulated by sawing or other means) and LED chips arranged thereon, with the mold comprising a lens material and/or encapsulant in liquid form. In certain embodiments, a lens may be formed of liquid curable silicone, and LED chips may be embedded in liquid silicone, which is subsequently cured to form one or more lenses. Alternatively, a lens may be pre-molded and then affixed (e.g., with adhesives, thermal bonding, or any other suitable joining method) to a subassembly including a substrate to which or over which with multiple LED chips are mounted.

In certain embodiments, a solid state lighting device (e.g., package) may include a reflector cup defining a cavity, at least one solid state emitter arranged within the cavity, and encapsulant material arranged within the cavity. In certain embodiments, at least one solid state emitter may be arranged over a substrate and at least partially surrounded by a boundary wall (optionally embodying at least one dispensed dam material laterally spaced from the emitter(s), with an encapsulant material arranged over the emitter(s) and in contact with the at least one boundary wall).

Various devices disclosed herein may include multiple solid state emitters (e.g., LEDs) of the same or different dominant colors, or of the same or different peak wavelengths. In certain embodiments, a solid state light emitting device may include at least three colors such as red, green, and blue emitters, which may include solid state light emitters devoid of phosphors, or may include phosphors (e.g., in combination with UV and/or blue emitters) to generate one or more of the red, green, and blue colors. Other combinations of output colors may be provided. In certain embodiments, a solid state light emitting device may include at least two colors.

The expressions "lighting device," "light emitting device," and "light emitting apparatus" as used herein are not limited, except that such elements are capable of emitting light. That is, a lighting device or light emitting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, street lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting-work lights, etc., mirrors/vanity lighting, or any other light emitting devices. In certain embodiments, lighting devices or light emitting apparatuses as disclosed herein may be self-ballasted. In certain embodiments, a light emitting apparatus may be embodied in a light fixture.

In preferred embodiments, a solid state lighting device is devoid of any incandescent light emitting element. In certain embodiments, a solid state lighting device lacks any "unconverted" blue-emitting solid state emitter not arranged to stimulate emissions of a lumiphoric material.

The inventive subject matter further relates in certain embodiments to an illuminated enclosure (the volume of which can be illuminated uniformly or non-uniformly), comprising an enclosed space and at least one lighting device or light emitting apparatus as disclosed herein, wherein at least one lighting device or light emitting apparatus illuminates at least a portion of the enclosure (uniformly or non-uniformly). The inventive subject matter further relates to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, a LCD display, a cave, a tunnel, a yard, a lamppost, etc., having mounted therein or thereon at least one lighting device or light emitting apparatus as described herein. Methods include illuminating an object, a space, or an environment, utilizing one or more lighting devices or light emitting apparatuses as disclosed herein. In certain embodiments, a lighting apparatus as disclosed herein includes multiple LED components arranged in an array (e.g., a two-dimensional array).

In certain embodiments, a color rendering index (CRI Ra) value of at least 75, or preferably at least 80, or in one of the following ranges: from 75 to 95, from 75 to 90, from 80 to 95, from 85 to 95, or from 80 to 90 may be attained in combination with GAI in a range of from 80 to 100 utilizing lighting devices as disclosed herein.

In certain embodiments, lighting devices as disclosed herein may provide emissions exhibiting enhanced vividness in combination with relatively high CRI Ra (e.g., according to one or more threshold ranges for GAI and CRI Ra recited herein) without use of any notch filtering material arranged to at least partially inhibit transmission of light. A notch filtering material when arranged on or in a light transmissive surface of a lighting device will inherently entail at least some attenuation of light and concomitant reduction of luminous efficacy. Presence of notch filtering material in a lighting device may also increase need for heat dissipating structures (e.g., heatsinks) since notch filtering material is subjected to being heated by absorbed light energy. As a result, providing a lighting device that is devoid of notch filtering material may avoid reduction of luminous efficacy, and may reduce need for heat dissipating structures, relative to a lighting device incorporating a notch filtering material.

In other embodiments, lighting devices as disclosed herein may include or have associated therewith one or more notch filtering materials, such as to enhance GAI and/or CRI Ra.

The term "notch filtering material" refers to a material that affects passage of light to cause light exiting the material to exhibit a spectral notch. A spectral notch is a portion of the color spectrum where the light is attenuated, thus forming a "notch" when light intensity is plotted against wavelength. Examples of notch filtering materials include rare earth and lanthanide materials, such as lanthanum, cerium, praseodymium, neodymium, promethium, samarium, europium, gadolinium, terbium, dysprosium, holmium, erbium, thulium, ytterbium, lutetium, scandium, and yttrium, as well as oxides thereof (e.g., neodymium oxide). Different rare earth compounds may exhibit notch filtering characteristics of different wavelength ranges. For example, neodymium (or oxide thereof) when used as a filtering material may produce a spectral notch in the yellow range, whereas erbium (or oxide thereof) when used as a filtering material may produce a spectral notch in the cyan range. Additional notch filtering materials include color pigments. As with the use of rare earth compounds, the use of color pigments can impart notch filtering properties in either transmissive or reflective applications. In many instances, color pigments may provide softer spectral notch (with more gradually sloping wavelength attenuation) characteristics relative to other notch filtering materials. One example of a color pigment includes an ultramarine pigment based on $CoAl_2O_4$, providing peak attenuation at a wavelength of about 580 nm. A cobalt blue pigment of similar composition could also be used. Other color pigments based on $CuSO_4$ or $NiCl_2$ can also be used. A variety of natural and synthetic pigments are available and could be used as notch filtering materials according to certain embodiments disclosed herein. Notch filters may also be fabricated by depositing one or more dielectric layers (e.g., to form dielectric stacks) on substrates, such as filters commercially available from Thorlabs, Inc. (Newton, N.J., US) having the following center wavelengths (CWL) and full width at half maximum (FWHM) characteristics: CWL=488 nm, FWHM=15 nm; CWL=514 nm, FWHM=17 nm; CWL=533 nm, FWHM=17 nm; CWL=561 nm, FWHM=18 nm; CWL=594 nm, FWHM=23 nm; 633 nm, FWHM=25 nm; and CWL=658 nm, FWHM=26 nm.

In certain embodiments utilizing one or more notch filtering materials, a spectral notch provided by at least one filtering material may have a full width in a range of less than or equal to 40 nm, or less than or equal to 35 nm, or less than or equal to 30 nm, or less than or equal to 25 nm, or less than or equal to 20 nm, in each case corresponding to a half maximum relative reduction in light transmission. In certain embodiments utilizing one or more notch filtering materials, at least one filtering material may be arranged to filter light within (or overlapping) the yellow-green range or yellow range, such as to provide peak attenuation in a range of from 550 nm to 590 nm, or from 570 nm to 590 nm.

In embodiments utilizing notch filtering materials, a resulting notch filtered solid state lighting device may include emissions having a gamut area index (GAI) value in a range of from 80 to 100, preferably in combination with a color rendering index (CRI Ra) value of at least 75, more preferably at least 80, or more preferably at least 90. A notch filtering material according to certain embodiments may be arranged to provide a spectral notch having a full width of less than 40 nm corresponding to a half maximum relative reduction in light transmission. In certain embodiments, the notch filtering material may serve to attenuate intensity of emissions output by the solid state lighting device by at least 10%, or at least 20%, or at least 30%, or at least 40%, or at least 50%.

In embodiments utilizing notch filtering materials, such materials may be provided as microparticles or nanoparticles of any desired size, size distribution, and geometric shape. In certain embodiments, multiple notch filtering materials may be mixed and incorporated in a carrier material or binder, or multiple notch filtering materials may otherwise be used in combination (e.g., in sequential layers, with or without a binding medium) to provide multiple spectral notches. In certain embodiments, notch filtering materials may be arranged in or on an at least partially light-transmissive optical element or enclosure, which may serve as a lens and/or diffuser. Examples of desirable materials for carriers, binding media, enclosures, and/or optical elements include (but are not limited to) silicone, resin, epoxy, thermoplastic polycondensate, polymeric materials, and glass. In certain embodiments, such materials may be molded and/or cured together with at least one notch filtering material. In certain embodiments, a lighting device may include one or more transmissive optical elements and/or reflective optical elements incorporating at least one notch filtering material. For example, a so-called "troffer" style ceiling fixture may include a reflector that serves as an optical element, and may additionally include optical elements such as glass plates or lenses.

In certain embodiments utilizing notch filtering materials, at least one filtering material (e.g., notch filtering material) may be arranged with a substantially constant thickness and/or concentration relative to different electrically activated emitters (e.g., solid state emitters such as LEDs). In certain embodiments, one or more filtering materials may be arranged on or over at least one solid state emitter (optionally with an intervening lumiphoric material) with presence, composition, thickness, and/or concentration that vary relative to different emitters. Multiple filtering materials (e.g., filtering materials of different compositions and arranged to provide spectral notches at different wavelengths) may be applied to one or more electrically activated emitters. In certain embodiments, at least one filtering material may be applied over one or more solid state light emitters, or over a support surface (e.g., lens, diffuser, reflector, etc.) utilizing a patterning technique, such may be aided by one or more masks. In certain embodiments, one or more notch filtering materials may be integrated with or arranged in contact with one or more portions of a solid state emitter package.

In certain embodiments utilizing notch filtering materials, one or more notch filtering materials may be mixed with one or more other functional materials (e.g., lumiphoric materials, scattering materials, and the like) and preferably incorporated into a binder or other carrier medium. In certain embodiments, at least one filtering material may be arranged in or on a carrier arranged on or over a plurality of solid state light emitters.

In certain embodiments utilizing notch filtering materials, notch filtering materials may be arranged in or on a reflector, which may be either specularly reflective or diffusively reflective. Any suitable reflective material in the art may be used, including (but not limited to) MCPET (foamed white polyethylene terephthalate), and surfaces metalized with one or more metals such as (but not limited to) silver (e.g., a silvered surface). MCPET manufactured by Otsuka Chemical Co. Ltd. (Osaka, Japan) is a diffuse white reflector that has a total reflectivity of 99% or more, a diffuse reflectivity of 96% or more, and a shape holding temperature of at least about 160° C. A preferred light-reflective material would be at least about 90% reflective, more preferably at least about 95% reflective, and still more preferably at least about 98-99% reflective of light of a desired wavelength range, such as one or more of visible light, ultraviolet light, and/or infrared light, or subsets thereof. In certain embodiments, at least one notch filtering material may be deposited on a surface of a reflector by spray coating, spin coating, sputtering, dipping, or rolling. Additionally deposition methods that may be used include electrostatic deposition and electrophoretic deposition. In certain embodiments, at least one notch filtering may be incorporated into a surface of a reflector via methods such as molding or sintering.

In certain embodiments utilizing notch filtering materials, one or more notch filtering materials may be coated or otherwise arranged on, over, or against at least one surface of one or more one solid state emitter chips. In certain embodiments, one or more notch filtering materials may be coated or otherwise arranged on, over, or against at least one surface of at least one lumiphoric material, wherein the at least one lumiphoric material may be arranged in direct contact with at least one surface of a solid state emitter chip, or may be arranged remotely from (i.e., spatially segregated from) at least one surface of a solid state emitter chip. In certain embodiments, one or more notch filtering materials may be conformally coated on the surface of at least one solid state emitter chip and/or lumiphoric material, wherein conformal coating in this regard refers to a coating that follows the shape and contour of at least one surface (or preferably multiple surfaces) of a chip with a substantially uniform thickness.

As will be recognized by one skilled in the art, parameters such as the type or composition of carrier or binding medium; the thickness, concentration, particle size, and particle size distribution of notch filtering material(s); and the presence, amount, and type of other trace substances accompanying one or notch filtering elements, may be adjusted to provide one or more spectral notches of desired width and/or depth.

In certain embodiments, a lighting device may include multiple electrically activated solid state light emitters, wherein: a combination of light exiting the lighting device that was emitted by the multiple electrically activated solid state light emitters would, in the absence of any additional light, produce a mixture of light having a color point on a 1931 CIE Chromaticity Diagram including x, y coordinates that define a point on or within a first polygon bounded by the following x, y coordinates: (0.38, 0.34), (0.38, 0.36), (0.40, 0.38), (0.42, 0.38), (0.44, 0.36), (0.46, 0.36), and (0.46, 0.34); the mixture of light has a color rendering index (CRI Ra) value of at least 80; and the mixture of light has a gamut area index (GAI) value in a range of from 80 to 100. In certain embodiments, the combination (in the absence of any additional light) would produce a mixture of light having a color point on a 1931 CIE Chromaticity Diagram including x, y coordinates that define a point on or within a second polygon bounded by the following x, y coordinates: (0.38, 0.34), (0.38, 0.36), (0.40, 0.38), and (0.40, 0.36), with the mixture of light having a color rendering index (CRI Ra) value of at least 90. The foregoing mixture(s) of light may preferably embody luminous efficacy of preferably at least 60 lumens per watt, more preferably at least 80 lumens per watt, and more preferably still at least 100 lumens per watt. In certain embodiments, each electrically activated solid state light emitter of the multiple electrically activated solid state light emitters is electrically connected to a first power line. In certain embodiments, at least one emitter (or group of emitters) of the multiple electrically activated solid state light emitters is independently controlled relative to at least one other emitter (or other group of emitters) of the multiple electrically activated solid state light emitters. In certain embodiments, at least one electrically activated solid state emitter of the multiple electrically activated solid state light emitters includes at least one light emitting diode (LED) chip and a lumiphoric material arranged to receive at least a portion of emissions of the at least one LED chip (wherein the lumiphoric material optionally may be spatially segregated (i.e., remotely located) from the solid state light emitters) and responsively emit lumiphor emissions. In other embodiments, the lumiphoric material may be arranged in a coating on at least one solid state emitter. In certain embodiments, the lighting device may be devoid of any non-lumiphor-converted blue solid state emitter (i.e., the lighting device may be devoid of any electrically activated solid state light emitter arranged to generate emissions that have dominant wavelength in a range of from 430 nm to 480 nm and that exit the lighting device without passage through a layer or region comprising a lumiphoric material). In certain embodiments, the lighting device may be devoid of any incandescent light emitter. In certain embodiments, the lighting device may comprise or be embodied in a solid state emitter package as disclosed herein. In certain embodiments, the lighting device may be devoid of any notch filtering material arranged to receive emissions of any one or more solid state light emitters of the multiple electrically activated solid state light emitters. In alternative embodiments, the lighting device may including notch filtering material arranged in a light path between (i) at least one electrically activated solid state emitter of the multiple electrically activated solid state emitters and (ii) at least one light output surface of the lighting device, wherein the notch filtering material is arranged to receive at least a portion emissions of the at least one electrically activated solid state emitter and filter the received emissions to exhibit a spectral notch. In certain embodiments, a light bulb or lighting fixture may include the foregoing lighting device(s). In certain embodiments, a method comprises illuminating an object, a space, or an environment, utilizing the foregoing lighting device(s).

In certain embodiments, a lighting device may include at least one primary solid state light emitter arranged to generate emissions comprising a dominant wavelength in a range of from 430 nm to 480 nm (or in a range of from 440 nm to 460 nm), at least one supplemental solid state light emitter arranged to generate supplemental solid state light emitter emissions comprising a dominant wavelength in a range of from 590 nm to 650 nm (or in a range of from 600 nm to 630 nm), and at least one lumiphor arranged to receive and be excited by at least a portion of emissions of the at least one primary solid state light emitter and responsively emit lumiphor emissions comprising a dominant wavelength in a range of from about 535 nm to about 585 nm, wherein a combination of (A) light exiting the lighting device that was emitted by the at least one primary solid state light emitter, (B) light exiting the lighting device that was emitted by the at least one lumiphor, and (C) light exiting the lighting device that was emitted by the at least one supplemental solid state light emitter would, in the absence of any additional light, produce a mixture of light having a color point on a 1931 CIE Chromaticity Diagram including x, y coordinates that define a point on or within a first polygon bounded by the following x, y coordinates: (0.38, 0.34), (0.38, 0.36), (0.40, 0.38), (0.42, 0.38), (0.44, 0.36), (0.46, 0.36), and (0.46, 0.34); the mixture of light has a color rendering index (CRI Ra) value of preferably at least 80; and the mixture of light has a gamut area index (GAI) value in a range of from 80 to 100. In certain embodiments, the combination (in the absence of any additional light) would produce a mixture of light having a color point on a 1931 CIE Chromaticity Diagram including x, y coordinates that define a point on or within a second polygon bounded by the following x, y coordinates: (0.38, 0.34), (0.38, 0.36), (0.40, 0.38), and (0.40, 0.36), with the mixture of light having a color rendering index (CRI Ra) value of at least 90. The foregoing mixture(s) of light may preferably embody luminous efficacy of preferably at least 60 lumens per watt, more preferably at least 80 lumens per watt, and more preferably still at least 100 lumens per watt. In certain embodiments, the at least one primary solid state light emitter includes a plurality of primary solid state light emitters, and the at least one secondary solid state light emitter comprises a plurality of secondary solid state light emitters; such a device may optionally include multiple clusters of solid state light emitters, wherein each cluster includes at least one primary solid state light emitter and at least one supplemental solid state light emitter. In certain embodiments, a light bulb or lighting fixture may include the foregoing lighting device(s). In certain embodiments, a method comprises illuminating an object, a space, or an environment, utilizing the foregoing lighting device(s).

In certain embodiments, each of the at least one primary and the at least one secondary electrically activated solid state light emitter may be electrically connected to a first power line. In certain embodiments, the at least one primary emitter is independently controlled relative to the at least one secondary emitter. In certain embodiments, the at least one lumiphoric material may be spatially segregated (i.e., remotely located) from the at least one primary solid state light emitter. In other embodiments, the lumiphoric material may be arranged in a coating on at least one primary solid state emitter. In certain embodiments, the lighting device may be devoid of any non-lumiphor-converted blue solid state emitter (i.e., the lighting device may be devoid of any electrically activated solid state light emitter arranged to generate emissions that have dominant wavelength in a range of from 430 nm to 480 nm and that exit the lighting device without passage through a layer or region comprising a lumiphoric material). In certain embodiments, the lighting device may comprise or be embodied in a solid state emitter package as disclosed herein. In certain embodiments, the lighting device may be devoid of any incandescent light emitter. In certain embodiments, the lighting device may be devoid of any notch filtering material arranged to receive emissions of any of the primary and supplemental solid state emitters. In alternative embodiments, the lighting device may including notch filtering material arranged in a light path between (i) any of the primary and supplemental solid state emitters, and (ii) at least one light output surface of the lighting device, wherein the notch filtering material is arranged to receive at least a portion emissions of the solid state emitters and/or lumiphor emissions and filter the received emissions to exhibit a spectral notch.

Various features and embodiments of the present disclosure are described with reference to the accompanying figures. As noted above, certain embodiments are devoid of notch filtering material. In other embodiments, one or more notch filtering materials may be provided.

FIGS. 5A-5B graphically illustrate GAI and CRI Ra values, respectively, obtained by modeling a first exemplary lighting device including a blue LED (452 nm peak wavelength) arranged to stimulate emissions of a yellow (YAG 108) phosphor, in combination with an orange-red LED (619 nm dominant wavelength), with the lighting device being devoid of any notch filtering material. In particular, FIG. 5A is an excerpt of a CIE 1931 chromaticity diagram showing the blackbody locus, the line of minimum tint (also termed "white body line" or "WBL" herein) extending between CCT values from 2700K to 6500K, periodic color temperature lines intersecting the blackbody locus, and plots of nine zones (i.e., zones I to IX) with different ranges of gamut area index (GAI) obtained such modeling. In FIG. 5A, zone V is of particular interest since it corresponds to a preferred range of GAI values from 80 to 100, and further encompasses a portion of the white body line (WBL) in a range of certain desirable CCT values below 4000K (with such region of the WBL being below the blackbody locus). FIG. 5B is an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of ten zones (i.e., zones I to X) with different ranges of color rendering index (CRI Ra) obtained by modeling the same lighting device according to FIG. 5A. In FIG. 5B, zone I (corresponding to CRI Ra values of 90 to 100) and zone II (corresponding to CRI Ra values of from 80 to 90) are of particular interest since the recited ranges are suitable for general illumination and encompass the white body line (WBL) in a range of desirable CCT values below 4000K (with such region of the WBL being below the blackbody locus). FIGS. 5A-5B in combination show that a first solid state lighting device including a phosphor-converted blue primary LED and a supplemental orange/red LED can simultaneously achieve the preferred combination of CRI Ra 80 (or CRI Ra≥90) and 80≤GAI≤100. Such condition is achieved in combination with high luminous efficacy (e.g., at least 60 LPW, at least 80 LPW, at least 100 LPW (or up to 120 LPW or more) without use of notch filtering material.

Figure 6B:
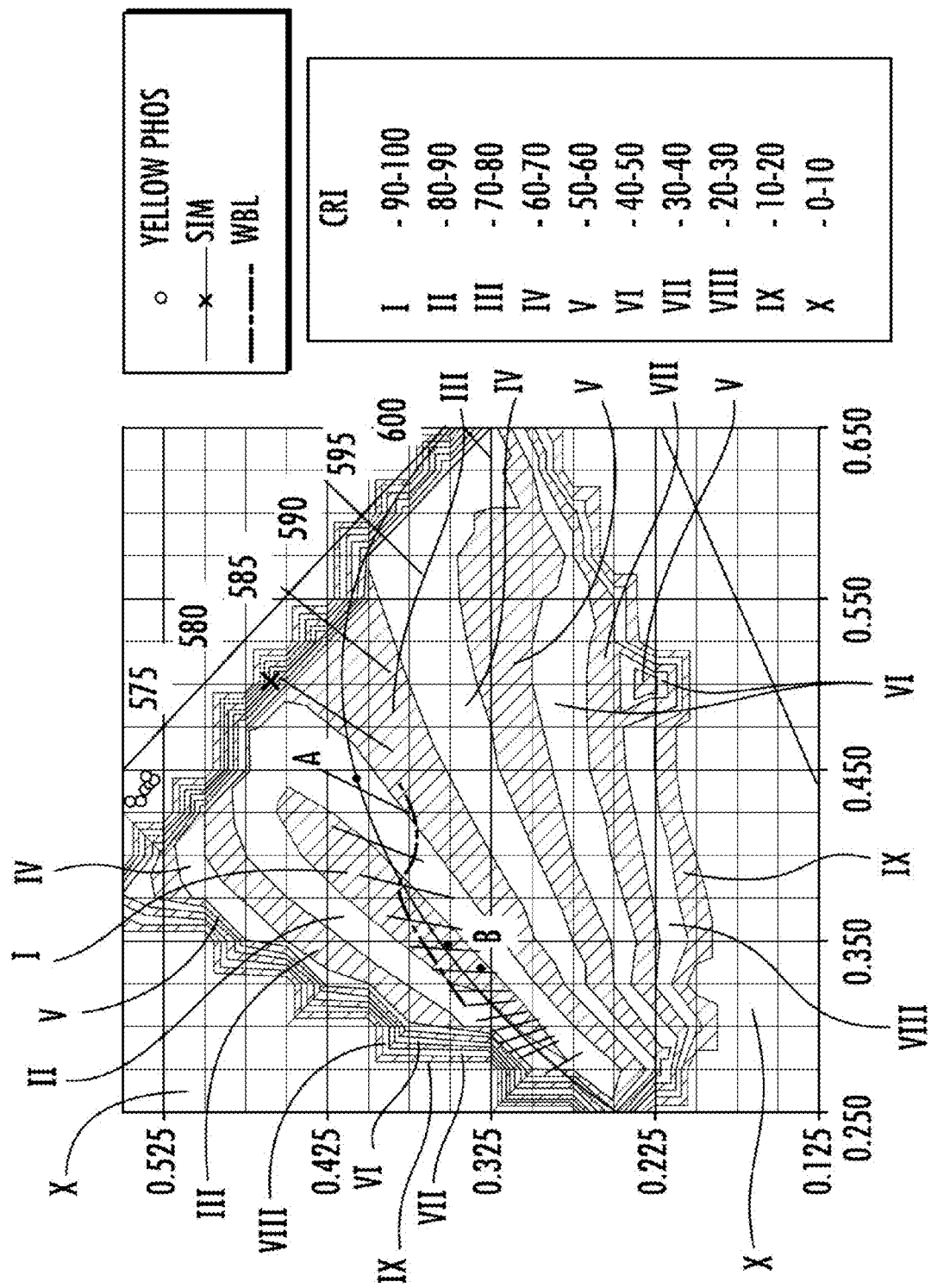
FIG. 6B is an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of ten zones with different ranges of color rendering index (CRI Ra) obtained by modeling the same lighting device according to FIG. 6A.

FIGS. 6A-6C graphically illustrate GAI, CRI Ra, and S/P ratio values, respectively, obtained by modeling a second exemplary device including a blue LED (452 nm peak wavelength) arranged to stimulate emissions of a yellow/green (LuAg) phosphor, in combination with an orange-red (619 nm dominant wavelength) LED. In particular, FIG. 6A is a an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of nine zones with different ranges of gamut area index (GAI) obtained by such modeling. In FIG. 6A, zone V is of particular interest since it corresponds to a preferred range of GAI values from 80 to 100, and further encompasses the majority of the white body line (WBL) (including numerous values in a range of certain desirable CCT values below 4000K below the blackbody locus. FIG. 6B is an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of ten zones with different ranges of color rendering index (CRI Ra) obtained by modeling the same lighting device according to FIG. 6A.

In FIG. 6B, zone I (corresponding to CRI Ra values of 90 to 100) and zone II (corresponding to CRI Ra values of from 80 to 90) are of particular interest since the recited ranges are suitable for general illumination and encompass the white body line (WBL) in a range of desirable CCT values below 4000K (with such region of the WBL being below the blackbody locus). FIG. 6C is an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of eight zones with different ranges of scotopic/photopic (S/P) ratio obtained by modeling the same lighting device. In FIG. 6C, zone V (corresponding to S/P ratio values in a range of from 1.5 to 2) is of particular interest since it encompasses the WBL for all CCT values of less than about 4000K. FIGS. 6A-6B in combination show that a second solid state lighting device including a phosphor-converted blue primary LED and a supplemental orange/red LED can simultaneously achieve the preferred combination of CRI Ra≥80 (or CRI Ra≥90) and 80≤GAI≤100. Such condition is achieved in combination with elevated S/P ratio and high luminous efficacy (e.g., at least 60 LPW, at least 80 LPW, at least 100 LPW (or up to 120 LPW or more) without use of notch filtering material.

FIGS. 7A-7E in combination embody a table providing numerical results for modeling of 151 solid state lighting devices each including an orange or red LED (source 1a), a yellow or yellow/green phosphor (source 2a), and a blue LED (source 3a), including device number, CIE 1931 x,y coordinates of combined emissions, dominant LED wavelength (dm), correlated color temperature (cct), S/P ratio, CRI Ra, R9 color rendering, color quality scale (CQS), gamut area index (GAI), source identifiers, lumen percentage for each individual source, CIE 1931 x,y coordinates for each individual source, dominant wavelength (dm) for each individual source, and peak wavelength (pk) for each individual source. As shown in the last six columns of FIGS. 7A-7E, source 1a includes sources with dominant wavelengths in a range of from 613 nm to 623 nm and peak wavelengths in a range of from 620 nm to 632 nm; source 2a includes sources with dominant wavelengths in a range of from 558 nm to 569 nm and peak wavelengths in a range of from 532 nm to 541 nm; and source 3a includes sources with dominant wavelengths in a range of from 447 nm to 470 nm and peak wavelengths in a range of from 440 nm to 465 nm. The fourth through tenth columns of FIGS. 7A-7E show that for each device, aggregated emissions (embodying the combination of source 1a, 2a, and 3a) include a dominant wavelength in a range of from 583 nm to 605 nm, CCT in a range of from 3879K to 2125K, S/P ratio in a range of from 1.12 to 2.02, CRI Ra in a range of from 80 to 95, R9 (R9 color rendering value) in a range of from 16 to 98, color quality scale in a range of from 71 to 93, and GAI in a range of from 80 to 100. Lamps with a high R9 color rendering value are desirable to reproduce reddish colors vividly. In certain embodiments, a lighting device as disclosed herein may include a R9 color rendering value in a range of preferably at least 80, more preferably at least 85, more preferably at least 90, and more preferably at least 95, in conjunction with CRI Ra in a range of preferably at least 80, more preferably at least 90, in combination with a GAI value in a range of from 80 to 100.

FIG. 8A is an excerpt of a CIE 1931 chromaticity diagram showing the blackbody locus, a segmented representation (including six points) of the line of minimum tint (or "white body line") extending between CCT values of from 2700K to 6500K, and including a shaded first polygon bounded by the following x, y coordinates: (0.38, 0.34), (0.38, 0.36), (0.40, 0.38), (0.42, 0.38), (0.44, 0.36), (0.46, 0.36), and (0.46, 0.34) including color points of the modeled solid state lighting devices represented in FIGS. 7A-7E. As shown in FIG. 8A, the entire first polygon is below the blackbody locus, and the first polygon encompasses a portion of the WBL including certain correlated color temperatures in a desirable range below 4000K.

FIG. 8B is an excerpt of a CIE 1931 chromaticity diagram showing the blackbody locus, a segmented representation (including six points) of the line of minimum tint (or "white body line") extending between CCT values of from 2700K to 6500K, and including a shaded second polygon bounded by the following x, y coordinates: (0.38, 0.34), (0.38, 0.36), (0.40, 0.38), and (0.40, 0.36) including color points of selected modeled solid state lighting devices represented in FIGS. 7A-7E. As shown in FIG. 8B, the entire second polygon is below the blackbody locus, and the second polygon encompasses a portion of the WBL including certain correlated color temperatures of from about 3450K to about 3700K.

In certain embodiments, solid state lighting devices may be arranged to output a preferred combination of CRI Ra≥80 and 80≤GAI≤100 with (i) at least one lumiphoric material combined with at least one solid state emitter (e.g., two LEDs and a lumiphoric material), such as described in connection with FIG. 9A, or (ii) with multiple LEDs devoid of any lumiphoric material, such as described in connection with FIG. 10. In certain embodiments, a solid state lighting device including multiple LEDs devoid of a lumiphor and including the foregoing preferred combination of CRI Ra≥80 and 80≤GAI≤100 may include at least one LED comprising a dominant wavelength in a range of from 440 nm to 460 nm, at least one LED comprising a dominant wavelength in a range of from 535 nm to 560 nm, and at least one LED comprising a dominant wavelength in a range of from 590 nm to 620 nm.

FIG. 9A is a table including numerical results for modeling of a solid state lighting device including an orange (606 nm dominant wavelength) LED, a blue (450 nm dominant wavelength) LED, and a green phosphor (P1LuGaAg 4), yielding composite emissions with a CCT of 3511K, a CRI Ra value of 80, and a GAI value of 100. For the individual LEDs and the phosphor, FIG. 9A provides CIE 1931 x and y coordinates, CIE 1976 u' and v' coordinates, dominant wavelength, and relative intensity (arbitrary units). For the combined emissions, FIG. 9A further provides CIE 1931 x and y coordinates, CCT, CRI Ra, R9 color rendering, GAI, color quality scale (CQS), S/P ratio, luminous efficacy, du'v' (BBUDLL), and duv values. FIG. 9B is an excerpt of a CIE 1931 chromaticity diagram showing the blackbody locus, a portion of the line of minimum tint (or white body line), and the following items for the LEDs and phosphor of FIG. 9A: tie lines, gamut area, and composite color point. As demonstrated in FIG. 9A, a preferred combination of CRI Ra≥80 and 80≤GAI≤100 may be obtained with a lighting device utilizing two LEDs in combination with one lumiphoric material. The resulting color point (as shown by the X symbol in FIG. 9B) is below the blackbody locus and slightly below the white body line.

FIG. 10 is a table including numerical results for modeling of a solid state lighting device including an amber (599 nm dominant wavelength) LED, a green (532 nm dominant wavelength) LED, and a blue (447 nm dominant wavelength) LED, yielding composite emissions with a CCT of 3511K, a CRI Ra value of 80, and a GAI value of 94. For the individual LEDs and the phosphor, FIG. 10 provides CIE 1931 x and y coordinates, CIE 1976 u' and v' coordinates, dominant wavelength, and relative intensity (arbitrary units). For the combined emissions, FIG. 10 further provides CIE 1931 x and y coordinates, CCT, CRI Ra, R9 color rendering, GAI, color quality scale (CQS), S/P ratio, luminous efficacy, du'v' (BBUDLL), and duv values. As demonstrated in FIG. 10, a preferred combination of CRI Ra≥80 and 80≤GAI≤100 may be obtained with a lighting device utilizing three LEDs devoid of a lumiphoric material. The resulting color point is below the blackbody locus and slightly below the white body line.

FIGS. 11A-11F illustrate exemplary portions of solid state lighting devices incorporating electrically activated solid state light emitters and lumiphoric materials, which may be used alone or in groups according to certain embodiments described herein. It is to be appreciated that various structures employed within complete lighting devices (e.g., package leads, leadframes, contacts, wirebonds, bond structures, heat transfer elements, light extracting optics, diffusers, additional reflecting surfaces, power supplies, and the like) have been omitted for clarity of illustration, but one skilled in the art would appreciate that known structures could be incorporated in operative lighting devices including the illustrative portions provided in FIGS. 11A-11F.

FIG. 11A is a side cross-sectional schematic view of a portion of a solid state lighting device 100 including at least one electrically activated solid state light emitter (e.g., LED) 104, a reflector cup 102 or other support structure on or over which the LED 104 is mounted, and (optionally) at least one lumiphor (e.g., phosphor) 107 dispersed in an encapsulant material disposed over the LED 104 and within the reflector cup 102. Although FIG. 11A illustrates the at least one lumiphor 207 as being dispersed in an encapsulant material, in various embodiments one or more lumiphors (e.g., phosphors) may be disposed in any suitable conformation to receive emissions from a solid state (e.g., LED) emitter and responsively re-emit light. In certain embodiments, at least one lumiphor may be coated directly on or over a solid state emitter. In certain embodiments, one or more lumiphors may be arranged in separate layers that may be spatially separated from each solid state emitter and/or one another. In certain embodiments, the device 100 including a lumiphor may be utilized in conjunction with a comparable device including a LED but lacking a lumiphor.

FIG. 11B is a side cross-sectional schematic view of a portion of a solid state lighting device 110 including at least one electrically activated solid state emitter (e.g., LED) 114, a reflector cup 112 or other support structure on or over which the solid state emitter 114 is mounted, and multiple lumiphors (e.g., phosphors) 118, 119 arranged in layers that are spatially segregated from the solid state emitter 114. An encapsulant 116 may be disposed between the solid state emitter 114 and the lumiphors 118, 119; alternatively, at least one void may be arranged between the solid state emitter 114 and the lumiphors 118, 119 to reduce conductive thermal coupling therebetween. In certain embodiments, the device 110 including at least one lumiphor may be utilized in conjunction with a comparable device including a LED but lacking a lumiphor.

FIG. 11C is a side cross-sectional schematic view of a portion of a solid state lighting device 120 including first and second solid state emitters (e.g., LEDs) 124, 125, a reflector cup 122 or other support structure on or over which the solid state emitters 124, 125 are mounted, and at least one lumiphor (e.g., phosphor) 127 dispersed in an encapsulant material disposed over the solid state emitters 124, 125 and within the reflector cup 122. In certain embodiments, multiple lumiphors 127 may be provided. In one embodiment, one or more lumiphors may be arranged to interact with only a single solid state emitter 124, 125. At least one lumiphor may be disposed in an amount (e.g., thickness, width, etc.) or concentration that varies with respect to position within a solid state lighting device, such embodied in variations of presence, amount or concentration with respect to one or more solid state emitters. For example, at least one lumiphor may be coated over or arranged over one solid state emitter, and not arranged over (or arranged in a different thickness or concentration over) another solid state emitter. In certain embodiments, the excitation (or stimulation) wavelength range of the lumiphor 127 may correspond with output wavelength range (e.g., at least overlapping with a full width half maximum output) of one LED 124, but not correspond with output wavelength range of another LED 125.

In certain embodiments, a solid state lighting device may include multiple electrically activated solid state emitters (e.g., LEDs) and one or more lumiphors (e.g., phosphors) arranged in one or more layers spatially separated from the solid state emitters. FIG. 11D is a side cross-sectional schematic view of a portion of a solid state lighting device 130 including first and second solid state emitters (e.g., LEDs) 134, 135, a reflector cup 132 or similar support structure on or over which the solid state emitters 134, 135 are mounted, and one or more lumiphors (e.g., phosphors) 138, 139 arranged in layers that are spatially segregated from the solid state emitters 134, 135. An encapsulant 136 or other material may be disposed between the solid state emitters 134, 135 and the lumiphors 138, 139; alternatively, the solid state emitters 134, 135 and lumiphors 138, 139 may be separated by a gap. In one embodiment, the lumiphors 138, 139 may be arranged in alternating layers including at least two non-adjacent layers including lumiphors of substantially same material composition. One advantage of confining different lumiphors to different layers is to avoid undue absorption of emission spectrum of one lumiphor that may overlap with excitation spectrum of another lumiphor (e.g., excitation spectrum of a red phosphor may overlap with emission spectrum of a yellow phosphor) which would result in loss of efficiency). In certain embodiments, presence of a lumiphoric material may be non-uniform (e.g., patterned) within an individual lumiphor layer. In certain embodiments, a lumiphoric material layer may have a thickness that is non-uniform with respect to position.

FIG. 11E is a side cross-sectional schematic view of a portion of a solid state lighting device 140 including first and second electrically activated solid state emitters (LEDs) 144, 145, a reflector cup 142 or other support structure on or over which the LEDs 144, 145 are mounted, and at least one lumiphor 148 arranged to interact only (or primarily only) with a single LED 144. In certain embodiments, the at least one lumiphor 148 may be coated or deposited on or over a first solid state emitter 144 but omitted from the second solid state emitter 145. In certain embodiments, the at least one lumiphor 1438 may include a mixture of multiple lumiphors, and/or multiple layers of lumiphors having different material compositions. In certain embodiments, a first LED 144 may comprise a dominant wavelength in a range of 430 nm to 480 nm (or a subrange of from 440 nm to 460 nm), a second LED 145 may comprise a dominant wavelength in a range of from 590 nm to 650 nm (or a subrange of from 600 nm to 630 nm), and the lumiphoric material may comprise a dominant wavelength in a range of from 535 nm to 585 nm.

FIG. 11F is a side cross-sectional schematic view of a portion of a solid state lighting device 150 including first and second electrically activated solid state emitters (LEDs) 155, 155, a reflector cup 152 or other support structure on or over which the LEDs 154, 155 are mounted, a first lumiphor 158 arranged to interact only (or primarily only) with a first LED 154, and a second lumiphor 159 arranged to interact only (or primarily only) with a second LED 155. In certain embodiments, the lumiphors 158, 159 may be separately coated or deposited over the respective first and second LEDs 154, 155.

Any of the embodiments illustrated or described in connection with FIGS. 11C-11E may be arranged to output aggregated emissions including two, three, or four or more color peaks, depending on the number of solid state emitters and/or lumiphors.

FIGS. 12A-12H illustrate exemplary portions of solid state lighting devices in different configurations incorporating electrically activated solid state light emitters arranged over package mounts (or other substrates) and optionally overlaid with lenses, wherein such devices may be used alone or in groups according to certain embodiments described herein. It is to be appreciated that various structures employed within complete lighting devices (e.g., package leads, leadframes, contacts, wirebonds, bond structures, heat transfer elements, diffusers, additional reflecting surfaces, power supplies, and the like) have been omitted for clarity of illustration, but one skilled in the art would appreciate that known structures could be incorporated in operative lighting devices including the illustrative portions provided in FIGS. 12A-12H.

FIG. 12A illustrates a solid state light emitting device 200 including at least one solid state emitter (e.g., LED) chip 203 (which may include LED epitaxial layers and a support) arranged over a top surface 202 of a package mount (or other substrate) 201, with a top surface 204 of the emitter chip 203 being covered with a lumiphoric material 206. Although not shown, one or more surfaces of the emitter chip 203 and/or lumiphor 206 may optionally be coated or overlaid with notch filtering material. The package mount 201 may include metalized regions and/or vias (not shown) for conduction of electrical signals to the emitter chip 203. Side surfaces 205 of the emitter chip 203 may be exposed, or in certain embodiments may be coated with one or more materials or encapsulant.

FIG. 12B illustrates a solid state light emitting device 200A including the device 200 of FIG. 12A following addition of a lens 209 having a curved (e.g., substantially hemispherical) shape. Such lens 209 may be formed by any suitable method, including but not limited to molding using silicone material. In certain embodiments, the lens 209 may have a width or lateral extent that is substantially equal to a width or lateral extent of the package mount 201, and a peripheral portion 209A of the lens 209 may have a substantially uniform thickness.

FIG. 12C illustrates a solid state light emitting device 210 including a solid state emitter (e.g., LED) chip 215 (which may include LED epitaxial layers and a support) arranged over an upper surface 212 of a package mount (or other substrate) 211, with a top surface 214 and side surfaces 215 of the emitter chip 213, as well the upper surface 212 of the package mount 211, being covered with a wavelength conversion (e.g., lumiphoric) material 216. In certain embodiments, the LED chip 205 may be mounted to the package mount 211, and thereafter the LED chip 215 and upper surface 212 of the package mount 211 may be coated with a lumiphoric material 216. Coating may be performed according to any suitable process disclosed herein, such as spray coating. Such materials 216, 218 may be arranged in conformal layers that follow the shape and outline of multiple surfaces of the emitter chip 215. Electrical connections to the LED chip 215 may be made either before or after coating steps.

FIG. 12D illustrates a solid state light emitting device 210A including the device 210 of FIG. 12A following addition of a lens 219 having a substantially rectangular cross-sectional curved (e.g., substantially hemispherical) shape. Such lens 219 may be formed by any suitable method, including but not limited to molding using silicone material. In certain embodiments, the lens 219 may have a width or lateral extent that is substantially equal to a width or lateral extent of the package mount 211.

FIG. 12E illustrates a solid state light emitting device 220 including first and second solid state emitter chips 223A, 223B arranged over a package mount 221, with top surfaces 224A, 224B of the emitter chips 223A, 223B being covered with wavelength conversion materials 226A, 226B.

FIG. 12F illustrates a solid state light emitting device 220A including the device 220 of FIG. 12E with addition of a lens 229 having a beveled upper edge 229A with a non-rectangular (polygonal) cross-sectional shape. Such lens 229 may be formed by any suitable method, including but not limited to molding using silicone material. In certain embodiments, the lens 229 may have a width or lateral extent that is substantially equal to a width or lateral extent of the package mount 221.

FIG. 12G illustrates a solid state light emitting device 230 including a solid state emitter chip 233 arranged over a top surface 232 of a package mount 231. FIG. 12H illustrates a solid state light emitting device 230A including the device 230 of FIG. 12G with addition of a lens 239 having a non-rectangular (polygonal) cross-sectional shape, and having a lumiphoric material 236 coated or otherwise arranged over a top surface thereof. In certain embodiments, lateral surfaces of the lens 239 may be additionally coated or otherwise covered with lumiphoric material 236'.

Although different lens shapes are illustrated in combination with different structures in FIGS. 12B, 12D, 12F, and 12H, it is to be appreciated that lenses according to the shapes shown in any of FIGS. 12B, 12D, 12F, and 12H may be applied to any of the devices 200, 210, 220, and 230 according to FIGS. 12A, 12C, 12E, and 12G.

FIGS. 13A-13F illustrate exemplary portions of solid state lighting devices in different configurations incorporating electrically activated solid state light emitters arranged over package mounts (or other substrates), with solid state light emitters overlaid with lumiphoric materials and notch filtering materials and optionally overlaid with lenses, wherein such devices may be used alone or in groups according to certain embodiments described herein.

FIG. 13A illustrates a solid state light emitting device 250 including a solid state emitter (e.g., LED) chip 253 (which may include LED epitaxial layers and a support) arranged over a top surface 252 of a package mount (or other substrate) 251, with a top surface 254 of the emitter chip 253 being covered with a lumiphoric material 256 (e.g., in a first layer) and a filtering material 258 (e.g., in a second layer). The package mount 251 may include metalized regions and/or vias (not shown) for conduction of electrical signals to the emitter chip 253. Side surfaces 255 of the emitter chip 253 may be exposed or otherwise coated with one or more of lumiphoric material and notch filtering material. In certain embodiments, the LED chip 253 may be coated with a lumiphoric material 256 and a notch filtering material 258, and thereafter the pre-coated LED chip 253 may be mounted to the package mount 251 followed by establishment of suitable electrically conductive connection(s) to the LED chip 253. Coating may be performed according to any suitable process disclosed herein, such as spray coating.

FIG. 13B illustrates a solid state light emitting device 250A including the device 250 of FIG. 13A following addition of a lens 259 having a curved (e.g., substantially hemispherical) shape. Such lens 259 may be formed by any suitable method, including but not limited to molding using silicone material. In certain embodiments, the lens 259 may have a width or lateral extent that is substantially equal to a width or lateral extent of the package mount 251, and a peripheral portion 259A of the lens 259 may have a substantially uniform thickness.

FIG. 13C illustrates a solid state light emitting device 260 including a solid state emitter (e.g., LED) chip 263 (which may include LED epitaxial layers and a support) arranged over an upper surface 262 of a package mount (or other substrate) 261, with a top surface 264 and side surfaces 265 of the emitter chip 263, as well as an upper surface 262 of the package mount 261, being covered with a wavelength conversion material 266 (e.g., in a first layer) and a filtering material 268 (e.g., in a second layer). In certain embodiments, the LED chip 263 may be mounted to the package mount 261, and thereafter the LED chip 263 and upper surface 262 of the package mount 261 may be coated with a lumiphoric material 266 and a notch filtering material 268. Coating may be performed according to any suitable process disclosed herein, such as spray coating. Such materials 266, 268 may be arranged in conformal layers that follow the shape and outline of multiple surfaces of the emitter chip 265. Electrical connections to the LED chip 265 may be made either before or after coating steps.

FIG. 13D illustrates a solid state light emitting device 260A including the device 260 of FIG. 13A following addition of a lens 269 having a substantially rectangular cross-sectional curved (e.g., substantially hemispherical) shape. Such lens 269 may be formed by any suitable method, including but not limited to molding using silicone material. In certain embodiments, the lens 269 may have a width or lateral extent that is substantially equal to a width or lateral extent of the package mount 261.

FIG. 13E illustrates a solid state light emitting device 270 including first and second solid state emitter chips 273A, 273B arranged over a package mount 271, with top surfaces 274A, 274B of the emitter chips 273A, 273B being covered with a wavelength conversion materials 276A, 276B and a filtering (e.g., notch filtering) material 278, and with side surfaces 275A, 275B of the emitter chips 273A, 273B and an upper surface 272 of the package mount 271 being covered with a filtering material 278. In certain embodiments, the LED chips 273A, 273B may be pre-coated with the wavelength conversion materials 276A, 276B, then mounted to the package mount 271, and thereafter the pre-coated LED chips 273A, 273B and upper surface 272 of the package mount 271 may be coated with a notch filtering material 278. Coating may be performed according to any suitable process disclosed herein, such as spray coating. The notch filtering material 278 may be arranged in a conformal layer that follows the shape and outline of multiple surfaces of the emitter chips 273A, 273B. Electrical connections to the LED chips 273A, 273b may be made either before or after a notch filtering material coating step.

FIG. 13F illustrates a solid state light emitting device 270A including the device 270 of FIG. 13E with addition of a lens 279 having a beveled upper edge 279A with a non-rectangular (polygonal) cross-sectional shape. Such lens 279 may be formed by any suitable method, including but not limited to molding using silicone material. In certain embodiments, the lens 279 may have a width or lateral extent that is substantially equal to a width or lateral extent of the package mount 271.

It is to be appreciated that lenses according to the shapes shown in any of FIGS. 13B, 13D, and 13F may be applied to any of the devices 250, 260, and 270 according to FIGS. 13A, 13C, and 13E.

While not illustrated in FIGS. 12A-13F, one or more boundary walls, dams, or dam portions may be deposited (e.g., dispensed) or otherwise provided on the package mount(s) 201, 211, 221, 231, 251, 261, 271 and laterally spaced relative to the emitter chips to contain one or more layers of material subject to being deposited over the emitter chips. In certain embodiments, one or more emitter chips may be mounted to a package mount, and then one or more layers of functional material (e.g., lumiphoric material and/or notch filtering material) may be deposited to fill portions or an entirety of a volume contained between the boundary wall/dam and the package mount to cover the emitter chips. In certain embodiments, following mounting of an emitter chip to a package mount and formation of at least one dam or boundary wall, substantially an entire volume contained by the dam or boundary wall may be filled with a lumiphor-containing material (e.g., arranged to contact the dam or boundary wall), and optionally planarized and cured, followed by coating or deposition of one or more layers of notch filtering material over the previously-filled volume.

FIG. 14 is a side cross-sectional view of at least a portion of a solid state light emitting device 280 including multiple solid state emitter (e.g., LED) chips 285 arranged over a submount 281 in flip-chip configuration, with both anode and cathode connections on the bottom of the chips 285. The emitter chips 285 may (optionally) include angled or beveled upper edges with a non-rectangular (e.g., polygonal) cross-section, with such shape serving to enhance light extraction. One or more emitter chips 285 may optionally be coated with one or more functional materials (e.g., lumiphoric material, notch filtering material, etc.) in conformal layers 286, 288 and arranged under a hemispherical optical element (e.g., lens) 290, with the conformal layers 286, 288 following the shape and contour of multiple surfaces of the emitter chips 285 (preferably with substantially constant thickness). Such coating may be performed using any coating technique disclosed herein or otherwise known in the art. As shown in FIG. 14, each conformal layer 286, 288 may extend over, between and laterally beyond the chips 285 (such as over a reflective material disposed between or adjacent to the emitter chips 285). The optical element 290 may be separated from the emitter chips 285 via a gap or an intervening material 289, which may include encapsulant or a fluid medium such as liquid or gel (e.g., mineral oil, perfluorinated polyether (PFPE) liquid, or other fluorinated or halogenated liquid or gel). Such material 289 may also include an index matching medium characterized by a refractive index that provides for reduced or minimal reflection or internal refraction of light emissions. In certain embodiments, elements 289, 290 may embody a single element, such as molded silicone. In certain embodiments, a thickness of each conformal layer may be less than half the spacing between adjacent emitter chips 285. In certain embodiments, spacing between emitter chips 285 may be on the order of 10 to 75 micrometers, although larger spacing (up to 150 or even 500 micrometers) may also be used. In certain embodiments, the optical element 290 may include one or more functional materials, such as lumiphoric material, notch filtering material, and/or scattering material, which may be doped, coated, or otherwise provided in or on the optical element 290. Still referring to FIG. 14, the submount 281 (e.g., alumina, aluminum nitride, high temperature polymers, etc.) is covered with a pattern of metal (e.g., traces) 283 that may be used to interconnect the emitter chips 285 and provide connection to a power supply. The metal pattern 283 includes connection pads 282 with insulating material 284 therebetween. In operation of the device 280, upon passage of light through one or more notch filtering materials (e.g., associated with layers 286, 288 and/or the optical element 290), the light will exhibit a spectral notch, and the notch filtering may be specifically tailored to increase GAI (optionally in combination with enhanced CRI Ra).

FIG. 15 illustrates a solid state emitter package 300 including multiple solid state emitter (e.g., LED) chips 305 coupled to electrical traces or metal patterns 302 via wirebonds 316 and arranged under a hemispherical optical element (e.g., lens) 310. In certain embodiments, one or more chips may be coated with one or more functional materials (e.g., lumiphoric material and notch filtering material). As shown, twelve emitter chips 305 are provided in contact with the metal traces 302 arranged over submount 301, and cathodes of the LED chips are connected by wirebonds 316 to traces 302. In certain embodiments, the optical element 310 may include one or more functional materials, such as lumiphoric material, notch filtering material, and/or scattering material, which may be doped, coated, or otherwise provided in or on the optical element 310. The emitter chips 305 may be selected from various light color bins to provide a combined light output with appropriate color characteristics for a desired application. The unfiltered efficiency of such a light emitting device 300 device with a warm white color may be on the order of 100 lm/W, prior to any filtering from the optical element; however, if the device 300 is binned for a cool white color, then an efficiency on the order of about 150 lm/W can be achieved (i.e., prior to any filtering).

FIG. 16 illustrates a first light bulb 400 arranged to incorporate multiple solid state emitters as disclosed herein. The light bulb 400 may optionally be arranged to output notch filtered light. The solid state light bulb 400 includes a conventional power supply 404, and includes a heatsink 405 including fins to promote cooling of the emitter chips 402 and power supply 404. A lateral contact 410 and foot contact 411 may be compatible with an Edison-style screw-type light socket for conducting power to the light bulb 400. An optical element 408 (which may be embodied in a light-transmissive globe) is provided to protect the emitter chips 402 and provide light shaping and/or diffusion utility for light emissions of the bulb 400. The optical element 408 may optionally contain an intervening material (as described in connection with element 289 in FIG. 15). One or more lumiphoric materials may be associated with the emitter chips 402 and/or the optical element 408 to provide wavelength conversion utility. Additionally, one or more optional filtering materials (e.g., notch filtering materials) may be associated with the emitter chips and/or the optical element 408 to filter light emissions in order to exhibit at least one spectral notch as described herein. If notch filtering material is provided, then upon passage of light through one or more notch filtering materials (e.g., associated with LEDs and/or the optical element 408), the light will exhibit a spectral notch, and the notch filtering may be specifically tailored to increase GAI (optionally in combination with enhanced CRI Ra).

FIG. 17 illustrates a second, reflector-type (i.e. PAR-style) light bulb 500 arranged to incorporate one or more solid state emitters as disclosed herein. The light bulb 500 may optionally be arranged to output notch filtered light. The light bulb 500 includes a reflector 504 and an optical element (e.g., lens) 506 covering a front or light emitting portion of the bulb 500, with the reflector 504 and lens 506 together forming a light-transmissive optical enclosure. An opposing end of the bulb includes contacts 510, 511 (e.g., an Edison-style threaded lateral contact 510 and a foot contact 511) for receiving power from a socket or other receptacle. The bulb 600 includes LED devices or dies (not visible) as previously discussed, and such components optionally may include one or more notch filtering material layers and/or one or more lumiphoric materials. Optionally, one or more filtering materials (e.g., notch filtering materials) may be associated with the optical element 506 to filter light emissions in order to exhibit at least one spectral notch as described herein. The optical element 506 may further include light scattering and/or lumiphoric materials in certain embodiments. If notch filtering material is provided, then upon passage of light through one or more notch filtering materials (e.g., associated with LEDs and/or the optical element 506), the light will exhibit a spectral notch, and the notch filtering may be specifically tailored to increase GAI (optionally in combination with enhanced CRI Ra).

Figure 18:
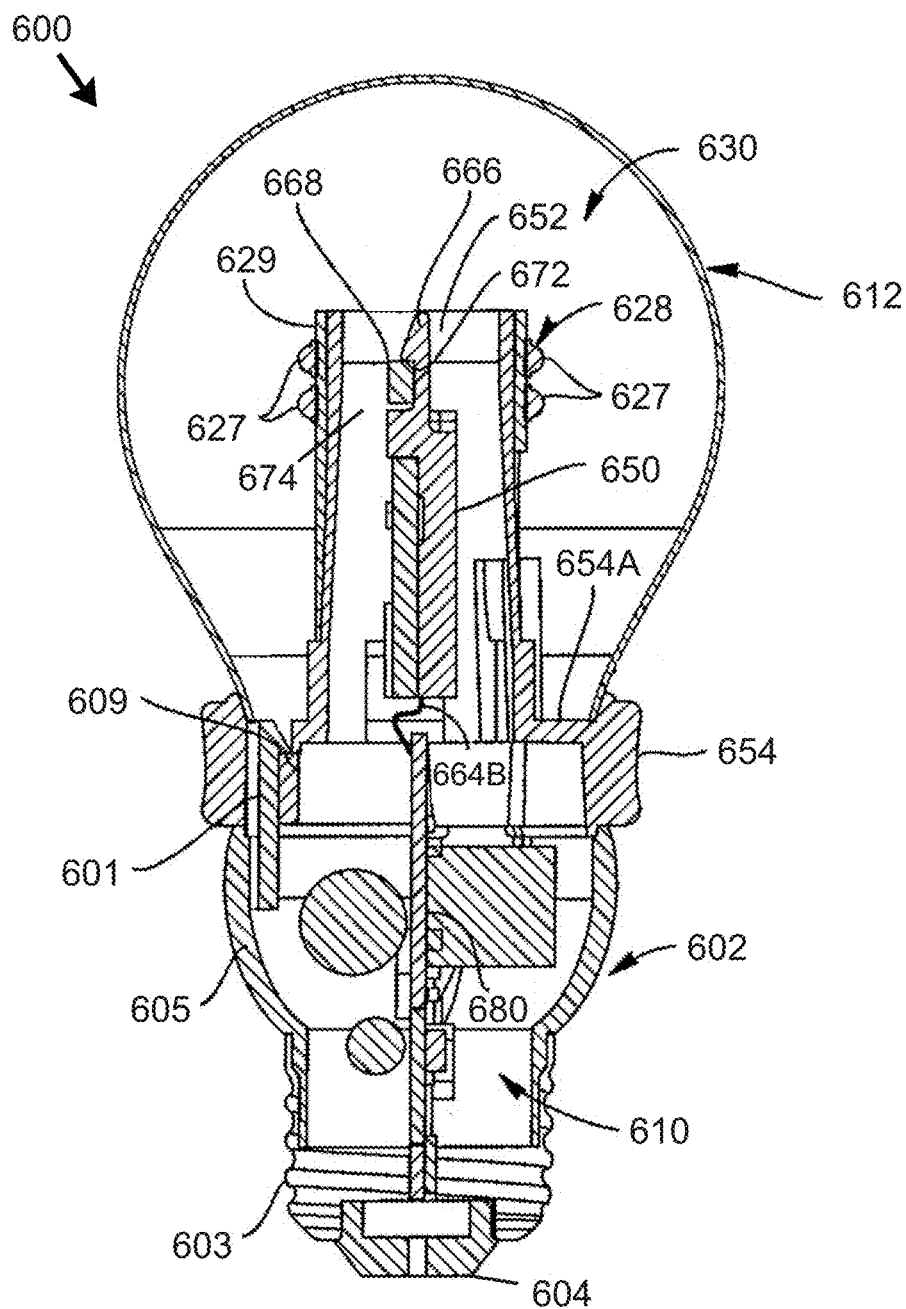
FIG. 18 is a side cross-sectional view of a third light bulb arranged to incorporate multiple solid state emitter chips as disclosed herein in a tower-type configuration.

FIG. 18 illustrates a third light bulb 600 arranged to incorporate multiple solid state emitters (e.g., LEDs) 627 as disclosed herein disposed in an array 628 in a tower-type configuration, such as disclosed in U.S. Patent Application Publication No. 2013/0271991 (incorporated by reference herein). The bulb 600 may embody an A-series bulb with an Edison base 602 including a lateral contact 603 and a foot contact 604. The base 602 may include a base printed circuit board 680 and electronics 610 within a housing 605, suitable for powering the bulb 600 and including a power supply and/or driver.

The bulb 600 includes multiple LEDs 627 (of which one or more may include lumiphoric material and/or a notch filtering material as disclosed herein) mounted on an upwardly-extending substantially tubular or tube-like submount (e.g., printed circuit board) 629 bounding an internal cavity 674. The LED chips 627 are operable to emit light when energized. The cavity 674 is capped by a heat conducting portion 652 that and engaging member 668 that fits with an engagement portion 666 associated with locking member 672 extending upward from an electrical interconnect 650 internal to the cavity 674. A globe-like enclosure (which may embody an optical element) 612 surrounds an interior volume containing a LED assembly 630 including the multiple emitter chips 627. A heatsink 654 is arranged between the enclosure 612 and the base 605, with a lock member 609 arranged to receive and retain deformable fingers 601 during assembly of the bulb 600. A bottom edge of the enclosure 612 abuts a top surface 654A of the heatsink 654. Internal conductors 664B are arranged to conduct electrical signals between the base PCB 680 and components of the LED assembly 630.

In certain embodiments, at least one notch filtering material may optionally be associated with one or more emitter chips 627 and/or additionally associated with the enclosure (or optical element) 612, such as to exhibit at least one spectral notch upon following passage of light emission through such filtering material. The optical element 612 may further include light scattering and/or lumiphoric materials in certain embodiments.

FIGS. 19A-19B illustrate a troffer-type (in-ceiling linear) light fixture 700 arranged to incorporate multiple solid state emitters (e.g., LEDs) 726 as disclosed herein. In certain embodiments, one or more lumiphoric materials may be associated with one or more LEDs 726. Optionally, the fixture 700 may include one or more notch filtering materials, such as may be associated with emitters 726, may be applied to or included in a linear reflector (e.g., e.g., by doping, impregnation, coating, etc.), or may be applied to or integrated with one or more light transmissive lens plates 715, 716 to cause the light emitted from the light fixture to exhibit a spectral notch. Light fixture 700 includes pan 701, heatsink 702, reflector 708, and end caps 710, 711. End cap 710 is larger than end cap 711 and is shaped to act as a circuit box to house electronics used to drive and control the light source (e.g., rectifiers, regulators, timing circuitry, etc.). Although a reflector may take various shapes, in the illustrated embodiment, the reflector 708 includes a flat region opposite the heatsink 702. In alternative embodiments, the reflector 708 could be parabolic in shape, or include two or more parabolic regions. Light fixture 700 also includes a diffuser lens assembly including lens plates 715, 716, disposed adjacent to sides of the heatsink 702. Reflector 708 can be made of many different materials, including metal, polymeric material, microcellular polyethyleneterephthalate (MCPET), or other suitable materials. If notch filtering material is provided, then emissions of the LEDs 726 may interact with one or more notch filtering materials (e.g., associated with the LEDs 726, associated with the reflector 708, and/or associated with the lens plates 715, 716) such that the light will exhibit a spectral notch, and the notch filtering may be specifically tailored to increase GAI (optionally in combination with enhanced CRI Ra).

FIG. 20 illustrates a lighting apparatus (e.g., light fixture) 810 according to at least one embodiment. The apparatus 800 includes a substrate or mounting plate 875 to which multiple solid state emitter (e.g., LED) lamps 870-1 to 870-6 (optionally embodied in multi-chip lamps such as multi-chip LED packages) are attached, wherein each lamp 870-1 to 870-6 may include multiple LEDs as described herein. Each lamp 870-1 to 870-6 may optionally include a cluster of solid state emitters, including at least one lumiphor converted solid state emitter and at least one supplemental solid state emitter as disclosed herein. The mounting plate 875 may include a circular shape or any suitable shape or configuration (including non-planar and curvilinear configurations). Different solid state emitter lamps or clusters may be configured to emit the same or different colors (e.g., wavelengths) of light. With specific reference to a first solid state lamp 870-1, each solid state lamp 870-1 to 870-6 may include multiple solid state emitters (e.g., LEDs) 874A-874C preferably arranged on a single submount 861. Although FIG. 20 illustrates four solid state emitter chips as being associated with each multi-chip solid state lamp 870-1 to 870-6, it is to be appreciated that any suitable number of solid state emitter chips may be associated with each multi-chip solid state lamp 870-1 to 870-6, and the number of solid state emitter chips associated with different (e.g., multi-chip) solid state lamps may be different. Each solid state lamp in a single fixture 810 may be substantially identical to one another, or solid state lamps with different output characteristics may be intentionally provided in a single fixture 810.

The solid state lamps 870-1 to 870-6 may be grouped on the mounting plate 875 in clusters or other arrangements so that the light fixture 810 outputs a desired pattern of light. In certain embodiments, at least one state emitter lamp associated with a single fixture 810 includes a lumiphor-converted light emitting component. One or more lamps 870-1 to 870-6 may optionally include at least one notch filtering material. With continued reference to FIG. 20, the light fixture 810 may include one or more control circuit components 880 arranged to operate the lamps 870-1 to 870-6 by independently applying currents and/or adjusting duty cycle of respective LED components or groups thereof. In certain embodiments, individual solid state chip 864A-864D in various lamps 870-1 to 870-6 may be configured to be individually addressed by the control circuit 880. In certain embodiments, the lighting fixture 810 may be self-ballasted. In certain embodiments, a control circuit 880 may include a current supply circuit configured to independently apply an on-state drive current to each individual solid state chip responsive to a control signal, and may include one or more control elements configured to selectively provide control signals to the current supply circuit. As solid state emitters (e.g., LEDs) are current-controlled devices, the intensity of the light emitted from an electrically activated solid state emitter (e.g., LED) is related to the amount of current with which the device is driven. A common method for controlling the current driven through an LED to achieve desired intensity and/or color mixing is a Pulse Width Modulation (PWM) scheme, which alternately pulses the LEDs to a full current "ON" state followed by a zero current "OFF" state. The control circuit 880 may be configured to control the current driven through the solid state emitter chips 864A-864D associated with the lamps 870-1 to 870-6 using one or more control schemes known in the art. The control circuit 880 may be attached to an opposite or back surface of the mounting plate 875, or may be provided in an enclosure or other structure (not shown) that is segregated from the apparatus 800.

While not illustrated in FIG. 20, the light fixture 810 a may further include one or more heat spreading components and/or heatsinks for spreading and/or removing heat emitted by solid state emitter chips 864A-864D associated with the lamps 870-1 to 870-6. For example, a heat spreading component may include a sheet of thermally conductive material configured to conduct heat generated by the solid state emitter chips 864A-864D of the light fixture 810 and spread the conducted heat over the area of the mounting plate 875 to reduce thermal stratification in the light fixture 810.

The foregoing lighting devices disclosed herein may include multiple solid state light emitters arranged to produce a mixture of light having a color rendering index (CRI Ra) value of at least 80, having a gamut area index (GAI) value in a range of from 80 to 100 (or more preferably within a range of from 90 to 100), and x, y coordinates within the first polygon or second polygon disclosed herein embodying predefined regions of the 1931 CIE chromaticity diagram.

Figure 21:
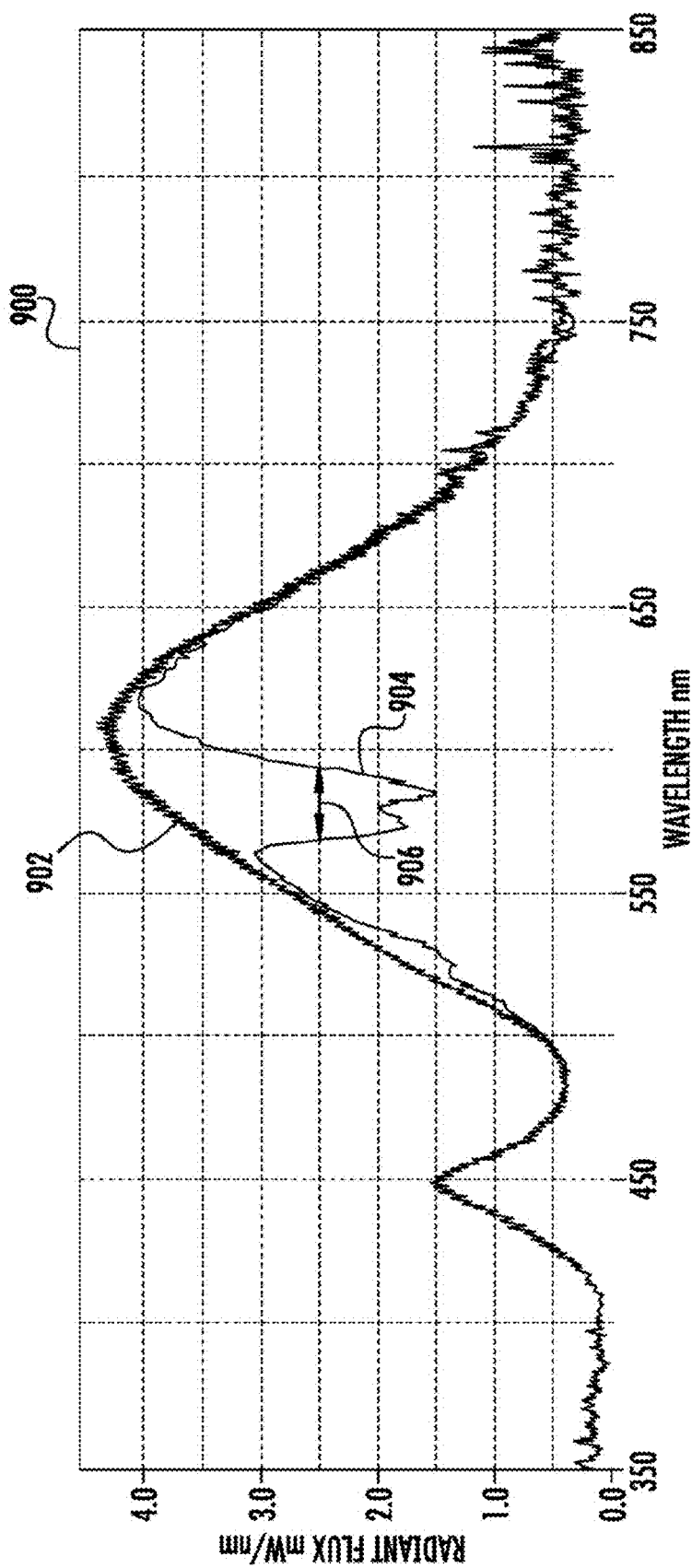
FIG. 21 is a plot of radiant flux versus wavelength for a spectral output of a solid state light emitting device with superimposed notch filtered spectral output.

FIG. 21 is a graph 900 plotting radiant flux versus wavelength for a spectral output of a solid state light emitting device with superimposed notch filtered spectral output, as relating to certain embodiments that may include one or more notch filtering materials. Curve 902 is a plot of measurements taken of the light output of an LED lamp constructed including a multi-chip LED component in a mineral-oil filled, plain glass enclosure. Curve 904 is a plot of measurements taken of the light output of an LED lamp that is the same in most respects, except that the enclosure for the lamp measured for curve 904 is neodymium oxide doped glass. A notch is clearly visible between 550 nm and 650 nm wherein radiant flux is reduced due to filtering by the neodymium oxide notch filtering material. Measurement 906 represents the width of the notch corresponding to the comparative reduction in light intensity at half the maximum reduction caused by the notch, otherwise known from the field of signal processing as the full width at half the maximum (FWHM). Relative to the peak radiant flux of approximately 4.3 mW/nm, the notch filtered region includes a radiant flux trough of between 1.5-2 mW/nm. The difference between the two curves 902, 904 represents attenuation or reduction of light intensity. The notch shown in FIG. 21 is characteristic of neodymium oxide filtering material by including a relatively sharply sloping ("hard") shape profile and is more of a true "notch," as opposed to a filtered shape with a more gently sloping or "soft" notch that may be more characteristic of filtering materials such as color pigments.

FIG. 22 provides a line chart 1100 illustrating spectral transmittance versus wavelength for an illustrative color pigment material arranged to provide a spectral notch 1102 centered at about 580 nm. Transmittance of the color pigment material is nearly 100% at or below wavelengths of about 430 nm, and at or above wavelengths of about 730 nm. Between 430 nm and 730 nm, transmittance is reduced (to a minimum of about 50% at a wavelength of about 580 nm). As shown in FIG. 22, a color pigment may provide a softer spectral notch (with more gradually sloping wavelength attenuation) characteristics relative to other notch filtering materials such as rare earth metals and their oxides (e.g., as shown in FIG. 21).

Embodiments as disclosed herein may provide one or more of the following beneficial technical effects: enhancing perceived quality of emissions of lighting devices; enhancing vividness of colors represented by lighting devices; and enhancing efficacy of vivid output lighting devices.

Those skilled in the art will recognize improvements and modifications to the preferred embodiments of the present disclosure. All such improvements and modifications are considered within the scope of the concepts disclosed herein and the claims that follow. Any of the various features and elements as disclosed herein may be combined with one or more other disclosed features and elements unless indicated to the contrary herein.

What is claimed is:

1. A lighting device comprising:
at least one primary solid state light emitter arranged to emit primary solid state light emitter emissions comprising a dominant wavelength in a range of from 430 nm to 480 nm;
at least one lumiphor arranged to receive and be excited by at least a portion of emissions of the at least one primary solid state light emitter, and emit lumiphor emissions comprising a dominant wavelength in a range of from about 535 nm to about 585 nm; and
at least one supplemental solid state light emitter arranged to generate supplemental solid state light emitter emissions comprising a dominant wavelength in a range of from 590 nm to 650 nm;
wherein:
a combination of (A) light exiting the lighting device that was emitted by the at least one primary solid state light emitter, (B) light exiting the lighting device that was emitted by the at least one lumiphor, and (C) light exiting the lighting device that was emitted by the at least one supplemental solid state light emitter would, in the absence of any additional light, produce a mixture of light having a color point on a 1931 CIE Chromaticity Diagram including x, y coordinates that define a point on or within a first polygon bounded by the following x, y coordinates: (0.38, 0.34), (0.38, 0.36), (0.40, 0.38), (0.42, 0.38), (0.44, 0.36), (0.46, 0.36), and (0.46, 0.34);
the mixture of light has a color rendering index (CRI Ra) value of at least 80; and
the mixture of light has a gamut area index (GAI) value in a range of from 80 to 100.

2. The lighting device of claim 1, wherein the supplemental solid state light emitter emissions comprise a dominant wavelength in a range of from 600 nm to 630 nm.

3. The lighting device of claim 1, wherein the primary solid state light emitter emissions comprise a dominant wavelength in a range of from 440 nm to 460 nm.

4. The lighting device of claim 1, further comprising a first power line, wherein each of the at least one primary solid state light emitter and the at least one supplemental solid state light emitter is electrically connected to the first power line.

5. The lighting device of claim 1, wherein:
a combination of (A) light exiting the lighting device that was emitted by the at least one primary solid state light emitter, (B) light exiting the lighting device that was emitted by the at least one lumiphor, and (C) light exiting the lighting device that was emitted by the at least one supplemental solid state light emitter would, in the absence of any additional light, produce a mixture of light having a color point on a 1931 CIE Chromaticity Diagram including x, y coordinates that define a point on or within a second polygon bounded by the following x, y coordinates: (0.38, 0.34), (0.38, 0.36), (0.40, 0.38), and (0.40, 0.36); and
the mixture of light has a color rendering index (CRI Ra) value of at least 90.

6. The lighting device of claim 1, wherein the mixture of light has a luminous efficacy of at least 60 lumens per watt.

7. The lighting device of claim 1, wherein the mixture of light has a R9 color rendering value of least 85.

8. The lighting device of claim 1, being devoid of any electrically activated solid state light emitter arranged to generate emissions (i) having dominant wavelength in a range of from 430 nm to 480 nm and (ii) exiting the lighting device without passage through a layer or region comprising a lumiphoric material.

9. The lighting device of claim 1, further comprising a notch filtering material arranged in a light path between (i) the at least one primary solid state light emitter, the at least one lumiphor, and the at least one supplemental solid state light emitter, and (ii) at least one light output surface of the lighting device, wherein the notch filtering material is arranged to receive at least a portion of the lumiphor emissions and filter the received lumiphor emissions to exhibit a spectral notch.

10. The lighting device of claim 1, comprising at least one of the following features:
a single leadframe arranged to conduct electrical power to the at least one primary solid state light emitter and the at least one supplemental solid state light emitter;
a single reflector arranged to reflect at least a portion of light emanating from each of the at least one primary solid state light emitter and the at least one supplemental solid state light emitter;
a single submount or mounting element supporting the at least one primary solid state light emitter and the at least one supplemental solid state light emitter;
a single lens arranged to transmit at least a portion of light emanating from each of the at least one primary solid state light emitter and the at least one supplemental solid state light emitter; and a single diffuser arranged to diffuse at least a portion of light emanating from each of the at least one primary solid state light emitter and the at least one supplemental solid state light emitter.

11. The lighting device of claim 1, wherein the at least one primary solid state light emitter comprises a plurality of primary solid state light emitters, and the at least one supplemental solid state light emitter comprises a plurality of supplemental solid state light emitters.

12. The lighting device of claim 11, comprising a plurality of clusters of solid state light emitters, wherein each cluster of the plurality of clusters includes at least one emitter of the plurality of primary solid state light emitters and at least one emitter of the plurality of supplemental solid state light emitters.

13. The lighting device of claim 1, wherein the at least one lumiphor is arranged in a coating disposed on or over the at least one primary solid state light emitter.

14. The lighting device of claim 1, wherein the at least one lumiphor is spatially segregated from the at least one primary solid state light emitter.

15. The lighting device of claim 1, wherein the at least one lumiphor is dispersed in a carrier material.

16. The lighting device of claim 15, wherein the carrier material comprises an encapsulant material arranged in contact with at least one surface of the at least one primary solid state light emitter.

17. The lighting device of claim 15, further comprising a reflector cup or a boundary wall defining a cavity, wherein the at least one primary solid state light emitter is arranged within the cavity, and at least a portion of the encapsulant material is within the cavity.

18. The lighting device of claim 1, being devoid of any incandescent light emitting element.

19. The lighting device of claim 1, being devoid of any notch filtering material arranged to receive emissions of any of the at least one primary solid state light emitter, the at least one lumiphor, and the at least one supplemental solid state light emitter.

20. A light bulb or light fixture comprising the lighting device of claim 1.

21. A lighting device comprising multiple electrically activated solid state light emitters, wherein:
a combination of light exiting the lighting device that was emitted by the multiple electrically activated solid state light emitters would, in the absence of any additional light, produce a mixture of light having a color point on a 1931 CIE Chromaticity Diagram including x, y coordinates that define a point on or within a first polygon bounded by the following x, y coordinates: (0.38, 0.34), (0.38, 0.36), (0.40, 0.38), (0.42, 0.38), (0.44, 0.36), (0.46, 0.36), and (0.46, 0.34);
the mixture of light has a color rendering index (CRI Ra) value of at least 80; and
the mixture of light has a gamut area index (GAI) value in a range of from 80 to 100.

22. The lighting device of claim 21, further comprising a first power line, wherein each electrically activated solid state light emitter of the multiple electrically activated solid state light emitters is electrically connected to the first power line.

23. The lighting device of claim 21, wherein the multiple electrically activated solid state light emitters includes at least one LED comprising a dominant wavelength in a range of from 440 nm to 460 nm, at least one LED comprising a dominant wavelength in a range of from 535 nm to 560 nm, and at least one LED comprising a dominant wavelength in a range of from 590 nm to 620 nm.

24. A lighting device of claim 21, wherein:
a combination of light exiting the lighting device that was emitted by the multiple electrically activated solid state light emitters would, in the absence of any additional light, produce a mixture of light having a color point on a 1931 CIE Chromaticity Diagram including x, y coordinates that define a point on or within a second polygon bounded by the following x, y coordinates: (0.38, 0.34), (0.38, 0.36), (0.40, 0.38), and (0.40, 0.36); and
the mixture of light has a color rendering index (CRI Ra) value of at least 90.

25. A lighting device of claim 21, wherein at least one electrically activated solid state emitter of the multiple electrically activated solid state light emitters comprises at least one light emitting diode (LED) chip and a lumiphoric material arranged to receive at least a portion of emissions of the at least one LED chip and responsively emit lumiphor emissions.

26. The lighting device of claim 25, wherein the lumiphoric material is spatially segregated from the multiple electrically activated solid state light emitters.

27. The lighting device of claim 21, wherein the mixture of light has a luminous efficacy of at least 60 lumens per watt.

28. The lighting device of claim 21, wherein the mixture of light has a R9 color rendering value of least 85.

29. The lighting device of claim 21, being devoid of any electrically activated solid state light emitter arranged to generate emissions (i) having dominant wavelength in a range of from 430 nm to 480 nm and (ii) exiting the lighting device without passage through a layer or region comprising a lumiphoric material.

30. The lighting device of claim 21, further comprising a notch filtering material arranged in a light path between (i) at least one electrically activated solid state emitter of the multiple electrically activated solid state emitters and (ii) at least one light output surface of the lighting device, wherein the notch filtering material is arranged to receive at least a portion emissions of the at least one electrically activated solid state emitter and filter the received emissions to exhibit a spectral notch.

31. The lighting device of claim 21, being devoid of any incandescent light emitting element.

32. The lighting device of claim 21, being devoid of any notch filtering material arranged to receive emissions of any one or more solid state light emitters of the multiple electrically activated solid state light emitters.

33. A light bulb or light fixture comprising the lighting device of claim 21.

* * * * *

UNITED STATES PATENT AND TRADEMARK OFFICE
CERTIFICATE OF CORRECTION

PATENT NO. : 9,593,812 B2  Page 1 of 1
APPLICATION NO. : 14/259993
DATED : March 14, 2017
INVENTOR(S) : van de Ven et al.

It is certified that error appears in the above-identified patent and that said Letters Patent is hereby corrected as shown below:

In the Specification

Column 2, Line 2, replace "(e.g., -5000K)" with -- (e.g., ~5000K) --.

Column 2, Line 3, replace "(e.g., -2800K)" with -- (e.g., ~2800K) --.

Column 6, Line 32, replace "(source a)" with -- (source 2a) --.

Column 20, Line 39, replace "CRI Ra 80" with -- CRI RA≥80 --.

Signed and Sealed this
Second Day of May, 2017

Michelle K. Lee
*Director of the United States Patent and Trademark Office*